United States Patent
Hayashi et al.

(10) Patent No.: US 9,929,274 B2
(45) Date of Patent: Mar. 27, 2018

(54) THIN-FILM TRANSISTOR, METHOD FOR FABRICATING THIN-FILM TRANSISTOR, AND DISPLAY DEVICE

(71) Applicants: JOLED INC., Tokyo (JP); PANASONIC LIQUID CRYSTAL DISPLAY CO., LTD, Hyogo (JP)

(72) Inventors: Hiroshi Hayashi, Tokyo (JP); Takahiro Kawashima, Osaka (JP); Genshirou Kawachi, Chiba (JP)

(73) Assignees: JOLED INC., Tokyo (JP); PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 0 days.

(21) Appl. No.: 15/384,622

(22) Filed: Dec. 20, 2016

(65) Prior Publication Data

US 2017/0104103 A1    Apr. 13, 2017

Related U.S. Application Data

(63) Continuation of application No. 13/772,723, filed on Feb. 21, 2013, now abandoned, which is a
(Continued)

(51) Int. Cl.
*H01L 29/786*    (2006.01)
*H01L 29/66*     (2006.01)
(Continued)

(52) U.S. Cl.
CPC .. *H01L 29/78609* (2013.01); *H01L 21/02532* (2013.01); *H01L 21/02592* (2013.01);
(Continued)

(58) Field of Classification Search
CPC ......... H01L 29/66765; H01L 29/78678; H01L 29/78669; H01L 29/78618; H01L 21/02667; H01L 21/02675
See application file for complete search history.

(56) References Cited

U.S. PATENT DOCUMENTS 5,256,887 A    10/1993  Yang
5,581,102 A *  12/1996  Kusumoto ........ H01L 29/78618
                                          257/347
(Continued)

FOREIGN PATENT DOCUMENTS

JP    2000-208772    7/2000
JP    2002-222957    8/2002
(Continued)

OTHER PUBLICATIONS

U.S. Appl. No. 13/632,607 to Yuji Kishida et al., filed Oct. 1, 2012.
(Continued)

*Primary Examiner* — Yu Chen
*Assistant Examiner* — Pauline Vu
(74) *Attorney, Agent, or Firm* — Greenblum & Bernstein, P.L.C.

(57) ABSTRACT

Methods of fabricating a thin-film transistor are provided. The methods include forming a gate electrode above a substrate, a gate insulating layer above the gate electrode, a non-crystalline silicon layer above the gate insulating layer, and a channel protective layer above the non-crystalline silicon layer. The non-crystalline silicon layer and the channel protective layer are processed to form a projecting part. The projecting part has an upper layer composed of the channel protective layer and a lower layer composed of the non-crystalline silicon layer. The projecting part and portions of the non-crystalline silicon layer on sides of the projecting part are irradiated with a laser beam to crystallize at least the non-crystalline silicon layer in the projecting part. An absorptance of the non-crystalline silicon layer for the laser beam is greater in the projecting part than in the portions on the sides of the projecting part.

19 Claims, 28 Drawing Sheets

Related U.S. Application Data continuation of application No. PCT/JP2011/003845, filed on Jul. 5, 2011.

(51) Int. Cl.
*H01L 21/02* (2006.01)
*H01L 29/51* (2006.01)
*H01L 29/423* (2006.01)
*H01L 27/12* (2006.01)
*H01L 27/32* (2006.01)

(52) U.S. Cl.
CPC .... *H01L 21/02675* (2013.01); *H01L 27/1222* (2013.01); *H01L 27/1274* (2013.01); *H01L 29/42384* (2013.01); *H01L 29/513* (2013.01); *H01L 29/518* (2013.01); *H01L 29/66765* (2013.01); *H01L 29/78606* (2013.01); *H01L 29/78678* (2013.01); *H01L 29/78696* (2013.01); *H01L 27/3262* (2013.01)

(56) References Cited

U.S. PATENT DOCUMENTS

| | | | |
|---|---|---|---|
| 5,763,904 A * | 6/1998 | Nakajima | H01L 21/28512 257/347 |
| 5,864,150 A * | 1/1999 | Lin | H01L 29/66765 257/61 |
| 6,004,836 A * | 12/1999 | Chang | H01L 29/66757 257/E21.413 |
| 6,501,095 B2 | 12/2002 | Yamaguchi et al. | |
| 6,573,161 B1 * | 6/2003 | Miyasaka | H01L 21/2026 257/E21.134 |
| 6,602,765 B2 * | 8/2003 | Jiroku | H01L 21/2026 257/E21.134 |
| 6,794,682 B2 | 9/2004 | Watanabe et al. | |
| 6,953,714 B2 | 10/2005 | Kimura et al. | |
| 7,338,845 B2 | 3/2008 | Kuo | |
| 7,714,387 B2 * | 5/2010 | Shiota | H01L 27/1214 257/347 |
| 8,283,671 B2 | 10/2012 | Kim et al. | |
| 2002/0100909 A1 | 8/2002 | Yamaguchi et al. | |
| 2002/0113236 A1 | 8/2002 | Park et al. | |
| 2002/0146871 A1 | 10/2002 | Watanabe et al. | |
| 2003/0132439 A1 | 7/2003 | Kimura et al. | |
| 2003/0180992 A1 * | 9/2003 | Shimomura | H01L 21/2026 438/166 |
| 2005/0006646 A1 | 1/2005 | Nakano et al. | |
| 2005/0161676 A1 | 7/2005 | Kimura et al. | |
| 2005/0218403 A1 | 10/2005 | Kuo | |
| 2006/0199316 A1 | 9/2006 | Kuo | |
| 2007/0072439 A1 * | 3/2007 | Akimoto | H01L 27/1225 438/795 |
| 2008/0258140 A1 * | 10/2008 | Lee | H01L 21/02554 257/43 |
| 2009/0039352 A1 | 2/2009 | Kobayashi et al. | |
| 2009/0218572 A1 | 9/2009 | Dairiki et al. | |
| 2009/0236600 A1 | 9/2009 | Yamazaki et al. | |
| 2009/0289258 A1 | 11/2009 | Kim et al. | |
| 2010/0117090 A1 | 5/2010 | Roh et al. | |
| 2010/0327285 A1 | 12/2010 | Yamamoto et al. | |
| 2011/0006297 A1 | 1/2011 | Inoue et al. | |
| 2012/0049193 A1 | 3/2012 | Saito et al. | |
| 2012/0161143 A1 | 6/2012 | Segawa | |

FOREIGN PATENT DOCUMENTS

| | | |
|---|---|---|
| JP | 2003-158137 | 5/2003 |
| JP | 2005-322898 | 11/2005 |
| JP | 2009-290168 | 12/2009 |
| JP | 2009-290192 | 12/2009 |
| JP | 2010-283233 | 12/2010 |
| JP | 2011-014595 | 1/2011 |
| WO | 2010/089988 | 8/2010 |
| WO | 2011/033718 | 3/2011 |

OTHER PUBLICATIONS

U.S. Appl. No. 13/737,275 to Arinobu Kanegae et al., filed Jan. 9, 2013.
U.S. Appl. No. 13/742,481 to Arinobu Kanegae et al., filed Jan. 16, 2013.
U.S. Appl. No. 13/681,867 to Arinobu Kanegae, filed Nov. 20, 2012.
U.S. Appl. No. 13/679,313 to Kenichirou Nishida et al., filed Nov. 16, 2012.
U.S. Appl. No. 13/686,043 to Arinobu Kanegae, filed Nov. 27, 2012.
U.S. Appl. No. 13/710,969 to Arinobu Kanegae et al., filed Dec. 11, 2012.
International Search Report in PCT/JP2011/003845, dated Oct. 4, 2011.
English Written Opinion for PCT/JP2011/003845, dated Oct. 4, 2011.

* cited by examiner

FIG. 6B

| Optical thickness of non-crystalline silicon / wavelength | 0 | 0.095 | 0.191 | 0.286 | 0.382 | 0.477 | 0.572 | 0.668 | 0.763 | 0.858 | 0.954 |
|---|---|---|---|---|---|---|---|---|---|---|---|
| Thickness of non-crystalline silicon film when wavelength is 473 nm (nm) | 0 | 9 | 18 | 27 | 36 | 44 | 53 | 62 | 71 | 80 | 89 |
| Thickness of non-crystalline silicon film when wavelength is 532 nm (nm) | 0 | 10 | 20 | 30 | 40 | 50 | 60 | 70 | 80 | 90 | 100 |
| Thickness of non-crystalline silicon film when wavelength is 569 nm (nm) | 0 | 11 | 21 | 32 | 43 | 53 | 64 | 75 | 86 | 96 | 107 |

FIG. 6C

| Optical thickness of gate insulating layer / wavelength | 0 | 0.138 | 0.276 | 0.414 | 0.552 | 0.689 | 0.827 | 0.965 | 1.103 | 1.379 |
|---|---|---|---|---|---|---|---|---|---|---|
| Thickness of silicon oxide film when wavelength is 473 nm (nm) | 0 | 44 | 89 | 133 | 178 | 222 | 267 | 311 | 356 | 445 |
| Thickness of silicon oxide film when wavelength is 532 nm (nm) | 0 | 50 | 100 | 150 | 200 | 250 | 300 | 350 | 400 | 500 |
| Thickness of silicon oxide film when wavelength is 569 nm (nm) | 0 | 54 | 107 | 161 | 214 | 267 | 321 | 374 | 428 | 535 |
| Thickness of silicon nitride film when wavelength is 473 nm (nm) | 0 | 34 | 67 | 101 | 134 | 167 | 201 | 234 | 268 | 335 |
| Thickness of silicon nitride film when wavelength is 532 nm (nm) | 0 | 38 | 75 | 113 | 151 | 188 | 226 | 264 | 301 | 377 |
| Thickness of silicon nitride film when wavelength is 569 nm (nm) | 0 | 40 | 81 | 121 | 161 | 201 | 242 | 282 | 322 | 403 |

FIG. 13B

Wavelength of silicon oxide (nm) / silicon nitride (nm)
= 561 nm

| C:140nm | C:120nm | C:100nm | Converted optical thickness of silicon oxide / wavelength |
|---|---|---|---|
|  | 115/9 | 81/35 | 0.226 |
| 139/2 | 105/28 | 70/54 | 0.252 |
| 129/21 | 94/47 | 60/73 | 0.278 |
| 118/40 | 84/66 | 49/92 | 0.304 |
| 107/59 | 73/85 | 39/111 | 0.33 |
| 97/78 | 62/104 | 73/130 | 0.357 |
| 86/97 | 52/123 | 17/149 | 0.383 |
| 76/116 | 41/142 | 7/168 | 0.409 |
| 65/136 | 31/162 |  | 0.435 |
| 54/155 | 20/181 |  | 0.462 |
| 44/174 | 9/200 |  | 0.488 |
| 33/193 |  |  | 0.515 |
| 23/212 |  |  | 0.541 |

FIG. 13C

Wavelength of silicon oxide (nm) / silicon nitride (nm)
= 532 nm

| C:140nm | C:120nm | C:100nm | Converted optical thickness of silicon oxide / wavelength |
|---|---|---|---|
|  | 120/0 | 86/26 | 0.226 |
|  | 110/18 | 76/44 | 0.252 |
| 134/10 | 100/36 | 66/62 | 0.278 |
| 124/28 | 90/54 | 56/80 | 0.304 |
| 114/46 | 80/72 | 46/98 | 0.33 |
| 104/64 | 70/90 | 36/116 | 0.357 |
| 94/82 | 60/108 | 26/134 | 0.383 |
| 84/101 | 50/126 | 16/152 | 0.409 |
| 74/119 | 40/144 | 6/170 | 0.435 |
| 64/137 | 30/162 |  | 0.462 |
| 54/155 | 20/181 |  | 0.488 |
| 44/173 | 10/199 |  | 0.515 |
| 34/191 | 0/217 |  | 0.541 |

FIG. 13D

Wavelength of silicon oxide (nm) / silicon nitride (nm)
= 473 nm

| C:140nm | C:120nm | C:100nm | Converted optical thickness of silicon oxide / wavelength |
|---|---|---|---|
| | | 95/9 | 0.226 |
| | | 86/25 | 0.252 |
| | 112/15 | 78/41 | 0.278 |
| 137/5 | 103/31 | 69/57 | 0.304 |
| 128/21 | 94/47 | 60/73 | 0.33 |
| 120/37 | 85/63 | 51/89 | 0.357 |
| 111/53 | 76/79 | 42/105 | 0.383 |
| 102/69 | 68/95 | 33/121 | 0.409 |
| 93/85 | 59/111 | 24/137 | 0.435 |
| 84/101 | 50/127 | 16/153 | 0.462 |
| 75/117 | 41/143 | 7/169 | 0.488 |
| 66/133 | 32/159 | | 0.515 |
| 57/149 | 23/175 | | 0.541 |

THIN-FILM TRANSISTOR, METHOD FOR FABRICATING THIN-FILM TRANSISTOR, AND DISPLAY DEVICE

CROSS REFERENCE TO RELATED APPLICATION

This is a continuation application of U.S. patent application Ser. No. 13/772,723, filed Feb. 21, 2013, which is a continuation application of PCT Patent Application No. PCT/JP2011/003845 filed on Jul. 5, 2011, designating the United States of America. The entire disclosure of each of the above-identified applications, including the specification, drawings and claims, is incorporated herein by reference in its entirety.

TECHNICAL FIELD

One non-limiting and exemplary embodiment provides a thin-film transistor, a method for fabricating the thin-film transistor, and a display device.

BACKGROUND ART

In recent years, organic EL displays using electroluminescence (EL) of an organic material have been attracting attention as one of the next generation flat-panel displays replacing liquid crystal displays. Unlike voltage-operating liquid crystal displays, the organic EL displays are current-operating device, and there is an urgent need for development of thin-film transistors (thin-film semiconductor device) having excellent on-off characteristics as the driving circuits of the active-matrix display device.

As a thin-film transistor achieving excellent on-characteristics, a thin-film transistor having one semiconductor layer on the gate insulating layer, which is used as a projecting channel layer has been disclosed (patent literature 1). According to this technology disclosed, the thickness from the bottom surface of the projecting shape to the upper surface on each side is smaller than the thickness from the bottom surface of the projecting shape to the upper surface at the center of the projecting shape. More specifically, at the lower part of the projecting shape in the channel layer which is a current path, when current flows between the source electrode and the drain electrode through the lower part of the sides of the projecting shape in the channel layer, the thickness on the lower part on both sides of the projecting shape of the channel layer is smaller than the upper part of the projecting shape. Accordingly, it is possible to reduce the resistance component in the vertical direction of the channel layer. Accordingly, it is possible to achieve low resistance across the lower part of the projecting shape in the channel layer, and thus the on-state current in the thin-film transistor is increased. Note that, while the mobility of the non-crystalline silicon is approximately 1 $cm^2/Vs$, the mobility of the crystalline silicon is large, and is approximately 100 $cm^2/Vs$. Accordingly, in order to implement a thin-film transistor having excellent on-characteristics, the semiconductor layer is formed of crystalline silicon, for example.

As a thin-film transistor achieving excellent on-characteristics and off-characteristics, the a thin-film transistor including a crystalline silicon layer formed on the gate insulating layer, and a non-crystalline silicon layer formed on both sides of the crystalline silicon layer is disclosed (the patent literature 2). According to this technology, the non-crystalline silicon is irradiated with a laser beam from an opening between the source electrode and the drain electrode so as to crystallize the non-crystalline silicon as the channel layer. With this, the non-crystalline silicon in the central region of the channel layer is crystallized into crystalline silicon, and the crystalline silicon is formed as a path for current in the channel layer. Accordingly, the on-state current in the thin-film transistor increases. In addition, when the turn-off operation is performed in the thin-film transistor, a depletion layer formed in a reverse-bias state between the channel layer and the drain serves as a barrier for carriers, achieving the turn-off operation. However, in the depletion layer, electrons and holes are thermally formed, which results in thermal generation current that deteriorates off-characteristics. Furthermore, a gate voltage large on the turn-off side is applied; the depletion layer is formed in the channel layer on the side facing the gate electrode. Here, since a large electric field is applied in a concentrated matter in the depletion layer, the band in the channel layer is significantly curved. As a result, tunnel current is generated, which deteriorates the off-characteristics as the leakage current. According to this technique disclosed, a non-crystalline silicon layer is formed on both sides of the crystalline silicon layer. The band gap of the non-crystalline silicon is larger than the crystalline silicon. Accordingly, a large energy is necessary for thermally generating electrons and holes, and a potential barrier causing the tunnel effect is large as well. Accordingly, forming the non-crystalline silicon layer on both sides of the crystalline silicon layer prevents the generation of the thermal generation current and the tunnel leakage current, reducing the off-state current. As described above, forming a channel layer including crystalline silicon increasing the on-state current and non-crystalline silicon reducing the off-state current achieves excellent on-characteristics and off-characteristics.

CITATION LIST

Patent Literature

[Patent Literature 1] U.S. Pat. No. 6,794,682 Specification
[Patent Literature 2] Japanese Unexamined Patent Application Publication No. 2005-322898

SUMMARY

Technical Problem

However, according to the technique disclosed in the patent literature 1, the quality of the film is identical in a region at the center having a large thickness and a region on the sides having a small thickness. Accordingly, there is a limitation in reducing the off-state current. More specifically, in the region having a small thickness on both sides, the volume of the depletion layer decreases as much as the decrease in the thickness, and thus there is a tendency of lowering leakage current. However, as illustrated in the patent literature 2, it is difficult to reduce the off-state current more than a case in which the non-crystalline silicon layer is provided on both sides of the crystalline silicon layer. Accordingly, in the technique disclosed in the patent literature 1, in the thin-film transistor in which the channel layer is made of crystalline silicon, the thermal generation current and the tunnel current significantly degrade off-characteristics, causing a serious problem upon achieving excellent off-characteristics.

Furthermore, in the technique disclosed in the patent literature 2, the part in which the source electrode, the drain electrode, the channel protective layer, and the channel layer overlap is made of the non-crystalline silicon. Accordingly, a large part of the channel length of the thin-film transistor defined as the width of the channel protective layer is occupied by the non-crystalline silicon layer. The non-crystalline silicon layer serves as the resistance component, which becomes a barrier in the current path horizontal to the channel layer. Furthermore, the thickness of the crystalline silicon layer and the thickness of the non-crystalline silicon layer are identical, and the upper surface of the crystalline silicon layer and the upper surface of the non-crystalline silicon layer are flat continuous surfaces. Accordingly, when the current flows between the source electrode and the drain electrode through the both sides of the channel layer, the non-crystalline silicon on both sides of the channel layer has a certain thickness. Accordingly, the non-crystalline silicon layer serves as the resistance component, becoming the barrier on the current path vertical to the channel layer. As described above, the resistance component due to the non-crystalline silicon is present in the horizontal direction and the vertical direction in the channel layer. Accordingly, there is a limit on improving the on-characteristics.

Furthermore, when forming the source electrode and the drain electrode, there is a fabrication variation. Accordingly, it is difficult to form the positions of the source electrode and the drain electrode completely evenly with respect to the lower layer present before forming the source electrode and the drain electrode. When the source electrode and the drain electrode are formed unevenly with respect to the lower layer, the distance from the non-crystalline silicon layer to the source electrode and the distance from the crystalline silicon region to the drain electrode are not even when the crystalline silicon layer is formed by irradiating the non-crystalline silicon layer with the laser beam from the opening between the source electrode and the drain electrode. More specifically, there is imbalance in the characteristics of the thin-film transistors between different substrates due to a bias in either the source electrode side or the drain electrode side in the resistance component in the channel path due to the non-crystalline silicon layer present in the part in which the source electrode or the drain electrode overlaps with the channel protective layer and the channel layer. When the thin-film transistor is formed in a large substrate, the displacement of the position when forming the source electrode and the drain electrode is large compared to a small substrate. Accordingly, this particularly poses a problem when forming the thin-film transistor on the large substrate. Furthermore, even in the same substrate, the electrical characteristics become asymmetric to the switching the source electrode and the drain electrode when the operation is performed by switching the source electrode and the drain electrode. If the electrical characteristics are asymmetric even when the source electrode and the drain electrode are switched, a problem accompanying the asymmetric characteristics of the electrical characteristics may occur in the operation of the driving circuit composed of the thin-film transistor. For example, using the thin-film transistor having asymmetric electrical characteristics as the switching transistor of the liquid crystal display causes a flicker, damaging the display characteristics as the image display apparatus.

One non-limiting and exemplary embodiment provides a thin-film transistor capable of balancing excellent on-characteristics and excellent off-characteristics, and in which the electrical characteristics are symmetric even when the source electrode and the drain electrode are switched, a method for fabricating the thin-film transistor, and a display device.

Solution to Problem

In one general aspect, the thin-film transistor disclosed here feature a substrate; a gate electrode above the substrate; a gate insulating layer above the gate electrode; a crystalline silicon layer above the gate insulating layer; a non-crystalline silicon layer above the gate insulating layer and on both sides of the crystalline silicon layer, having a thickness smaller than a thickness of the crystalline silicon layer; a channel protective layer above the crystalline silicon layer; a source electrode and a drain electrode a contact layer between (i) at least a side surface of the crystalline silicon layer and an upper surface of the non-crystalline silicon layer and (ii) at least one of the source electrode and the drain electrode, the contact layer comprising non-crystalline silicon doped with impurity or polysilicon doped with impurity, in which the source electrode and the drain electrode are formed along at least the side surface of the crystalline silicon layer and the upper surface of the non-crystalline silicon layer and with the contact layer in between, the source electrode being above one portion of the non-crystalline silicon layer, and the drain electrode being above the other portion of the non-crystalline silicon layer.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

The thin-film transistor capable of balancing excellent on-characteristics and excellent off-characteristics, and in which the electrical characteristics are symmetric even when the source electrode and the drain electrode are switched, the method for fabricating the thin-film transistor, and the display apparatus are provided.

BRIEF DESCRIPTION OF DRAWINGS

These and other advantages and features will become apparent from the following description thereof taken in conjunction with the accompanying Drawings, by way of non-limiting examples of embodiments of the present disclosure.

FIG. 6B illustrates an example in which the values obtained by converting the values in the horizontal axes in FIG. 5A to FIG. 5F into the thickness of the non-crystalline silicon layer.

FIG. 6C illustrates examples of values obtained by converting the values in the vertical axes in FIG. 5A to FIG. 5F into thickness of the silicon oxide layer or the silicon nitride layer.

FIG. 13B is a diagram illustrating an example of values obtained by converting values in the vertical axis in FIG. 13A into thicknesses of a silicon oxide layer and a silicon nitride layer composing the gate insulating layer 120.

FIG. 13C is a diagram illustrating an example of values obtained by converting values in the vertical axis in FIG. 13A into thicknesses of a silicon oxide layer and a silicon nitride layer composing the gate insulating layer 120.

FIG. 13D is a diagram illustrating an example of values obtained by converting values in the vertical axis in FIG. 13A into thicknesses of a silicon oxide layer and a silicon nitride layer composing the gate insulating layer 120.

DESCRIPTION OF EMBODIMENT(S)

Figure 1:
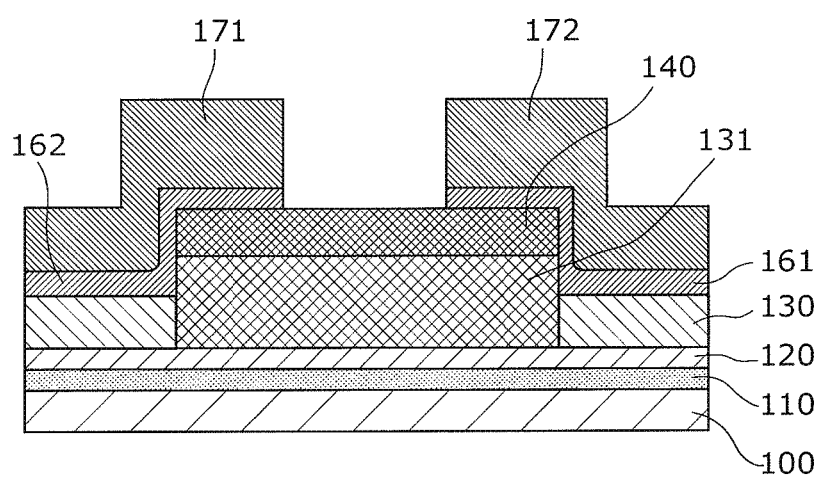
FIG. 1 is a cross-sectional view schematically illustrating the configuration of a thin-film transistor according to the embodiment 1.

A thin-film transistor according to one non-limiting and exemplary embodiment includes: a substrate; a gate electrode above the substrate; a gate insulating layer above the gate electrode; a crystalline silicon layer above the gate insulating layer; a non-crystalline silicon layer above the gate insulating layer and on both sides of the crystalline silicon layer, having a thickness smaller than a thickness of the crystalline silicon layer; a channel protective layer above the crystalline silicon layer; a source electrode and a drain electrode; and a contact layer between (i) at least a side surface of the crystalline silicon layer and an upper surface of the non-crystalline silicon layer and (ii) at least one of the source electrode and the drain electrode, the contact layer comprising non-crystalline silicon doped with impurity or polysilicon doped with impurity, in which the source electrode and the drain electrode along at least the side surface of the crystalline silicon layer and the upper surface of the non-crystalline silicon layer and with the contact layer in between, the source electrode being above one portion of the non-crystalline silicon layer, and the drain electrode being above the other portion of the non-crystalline silicon layer.

Here, an average grain size of crystals in the crystalline silicon layer is in a range from 10 nm to 1 μm, for example. Note that, in this Specification, the expression "in a range from X to Y" includes the meaning encompassed by the expression "in a range from equal to or more than X to equal to or less than Y". The same interpretation is applied to the following description.

In addition, the side surface of the crystalline silicon layer and a side surface of the channel protective layer are coplanar with each other, for example.

According to this aspect, the channel layer having a projecting shape including the crystalline silicon layer formed under the channel protective layer and the non-crystalline silicon layer formed on both sides of the crystalline silicon layer is formed, and thickness from the bottom surface of the channel layer to the upper surface on the parts on both sides of the projecting part of the channel layer is smaller than the thickness from the bottom surface of the channel layer to the upper surface of the projecting part of the channel layer. The crystalline silicon layer is formed under the channel protective layer, and all of the channel length defined as the width of the channel protective layer is occupied by the crystalline silicon layer. Accordingly, the resistance component in the horizontal direction of the channel layer by the non-crystalline silicon layer decreases. Furthermore, the thickness from the bottom surface of the channel layer to the upper surface on the parts on both sides of the projecting part of the channel layer is smaller than the thickness from the bottom surface of the channel layer to the upper surface of the projecting part. Accordingly, compared to a case in which the thickness from the bottom surface of the channel layer to the upper surface of the projecting part is equal to the thickness from the bottom surface of the channel layer to upper surface on both sides of the projecting part, the resistance component in the vertical direction of the channel layer due to the non-crystalline silicon layer decreases. As described above, since the crystalline silicon layer occupies all of the channel length defined by the width of the channel protective layer. Accordingly, the horizontal resistance component and the vertical resistance component of the channel layer due to the non-crystalline silicon layer are reduced, and the on-characteristics may be significantly improved.

Furthermore, according to this aspect, the parts on both sides of the projecting part of the channel layer are made of non-crystalline silicon layer. Accordingly, the band gap on the part on both sides of the projecting part in the channel layer is larger than the case in which the parts on both sides of the projecting part of the channel is made of crystalline silicon. Accordingly, it is possible to significantly suppress the thermal generation current and the tunnel current, which significantly reduces the off-characteristics. Furthermore, the thickness from the bottom surface of the channel layer to the upper surface on both sides of the projecting part is smaller than the thickness from the bottom surface of the channel layer to the upper surface of the projecting part. Accordingly, it is possible to reduce the volume of the depletion layer which is the cause of the thermal generation current and the tunnel current, and to reduce the off-state current. Therefore, the off-characteristics are significantly improved.

With these effects, excellent on-characteristics and off-characteristics are balanced.

Furthermore, in this aspect, the entire channel length defined by the width of the channel protective layer is occupied by the crystalline silicon layer, as described above. Accordingly, even when the source electrode and the drain electrode are provided uneven with respect to the channel protective layer underneath, the distance from the crystalline silicon layer to the source electrode in the channel path and the distance from the crystalline silicon layer to the drain electrode in the channel path become equal, which suppresses variation in the characteristics of the thin-film transistors between different substrates. Furthermore, in the same substrate, when the operation is performed after switching the source electrode and the drain electrode, the electrical characteristics are symmetrical to the switching of the source electrode and the drain electrode. Accordingly, in the operation of the drive circuit composed of thin-film transistors, it is possible to suppress the problem accompanying the asymmetrical property of the electric characteristics.

The thin-film transistor according to an aspect of the present disclosure includes: a substrate; a gate electrode above the substrate; a gate insulating layer above the gate electrode; a first crystalline silicon layer above the gate insulating layer; a second crystalline silicon layer above the gate insulating layer and on both sides of the first crystalline silicon layer, having a thickness smaller than a thickness of the first crystalline silicon layer; a channel protective layer above the first crystalline silicon layer; a source electrode and a drain electrode; and a contact layer between (i) at least a side surface of the first crystalline silicon layer and an upper surface of the second crystalline silicon layer and (ii) at least one of the source electrode and the drain electrode, the contact layer comprising non-crystalline silicon doped with impurity or polysilicon doped with impurity, in which the source electrode and the drain electrode are formed along at least the side surface of the first crystalline silicon layer and the upper surface of the second crystalline silicon layer and with the contact layer in between, the source electrode being above one portion of the second crystalline silicon layer, and the drain electrode being above the other portion of the second crystalline silicon layer, in which an average grain size of crystals in the first crystalline silicon layer is larger than an average grain size of crystals in the second crystalline silicon layer.

Here, the average grain size of the crystals in the first crystalline silicon layer is in a range from 40 nm to 1 µm, and the average grain size of the crystals in the second crystalline silicon layer is at least 10 nm and smaller than 40 nm, for example.

In addition, the side surface of the first crystalline silicon layer and a side surface of the channel protective layer are coplanar with each other, for example.

According to this aspect, the channel layer having the projecting shape including the first crystalline silicon layer having low resistance formed under the channel protective layer and the second crystalline silicon layer having high resistance and smaller average grain size of crystals than the first crystalline silicon layer is formed. The thickness from the bottom surface of the channel layer to the upper surface of the part on both sides of the projecting part of the channel layer is smaller than the thickness from the bottom surface of the channel layer to the upper surface of the projecting part of the channel layer. The first crystalline silicon layer is formed under the channel protective layer, and all of the channel length defined as the width of the channel protective layer is the crystalline silicon layer having low resistance. Accordingly, the resistance component in the horizontal direction of the channel layer by the crystalline silicon layer having high resistance decreases. Furthermore, the thickness from the bottom surface of the channel layer to the upper surface on the parts on both sides of the projecting part of the channel layer is smaller than the thickness from the bottom surface of the channel layer to the upper surface of the projecting part. Accordingly, compared to a case in which the thickness from the bottom surface of the channel layer to the upper surface of the projecting part is equal to the thickness from the bottom surface of the channel layer to upper surface on both sides of the projecting part, the resistance component in the vertical direction of the channel layer due to the crystalline silicon layer having high resistance decreases. As described above, since the crystalline silicon layer having low resistance occupies all of the channel length defined by the width of the channel protective layer, and the horizontal resistance component and the vertical resistance component of the channel layer by the crystalline silicon layer having high resistance are reduced, the on-characteristics may be significantly improved.

Furthermore, according to this aspect, the part on both sides of the projecting part in the channel layer is made of the crystalline silicon layer having a small average grain size of crystals. Accordingly, the crystallinity is lower than the case in which the part on both sides of the projecting part of the channel layer is made of a crystalline silicon layer having a large average grain size of crystals, and the component of non-crystalline silicon having a large band gap increases. Accordingly, it is possible to significantly suppress the thermal generation current, which significantly reduces the off-characteristics. Furthermore, the thickness from the bottom surface of the channel layer to the upper surface on both sides of the projecting part is smaller than the thickness from the bottom surface of the channel layer to the upper surface of the projecting part. Accordingly, it is possible to reduce the volume of the depletion layer which is the cause of the thermal generation current and the tunnel current, and to reduce the off-state current. Therefore, the off-characteristics are significantly improved.

With these effects, excellent on-characteristics and off-characteristics are balanced.

Furthermore, in this aspect, the entire channel length defined by the width of the channel protective layer is occupied by the crystalline silicon layer having low resistance, as described above. Accordingly, even when the source electrode and the drain electrode are provided uneven with respect to the channel protective layer underneath, the distance from the crystalline silicon layer having low resistance to the source electrode in the channel path and the distance from the crystalline silicon layer having low resistance to the drain electrode in the channel path becomes equal, which suppresses variation in the characteristics of the thin-film transistors between different substrates. Furthermore, in the same substrate, when the TFT is operated after switching the source electrode and the drain electrode, the electrical characteristics are symmetrical to the switching of the source electrode and the drain electrode. Accordingly, in the operation of the driving circuit composed of thin-film transistors, it is possible to suppress the problem accompanying the asymmetrical property of the electric characteristics.

This aspect also has flexibility which allows the second crystalline silicon layer to be a crystalline silicon layer having a small average grain size of crystals. Accordingly, it is possible to fabricate the crystalline silicon layer in the projecting part of the channel layer and underneath the projecting part and the crystalline silicon layer in the part on both sides of the projecting part of the channel layer to have different crystallinity such that the crystallinity appropriate for the design of the desired thin-film transistor, for example, focusing on the on-state current or focusing on the off-state current.

The method for fabricating thin-film transistor according to an aspect of the present disclosure includes: preparing a substrate; forming a gate electrode above the substrate; forming a gate insulating layer above the gate electrode; forming a non-crystalline silicon layer above the gate insulating layer; forming a channel protective layer above the non-crystalline silicon layer; forming a projecting part by processing the non-crystalline silicon layer and the channel protective layer, the projecting part having an upper layer composed of the channel protective layer and the lower layer composed of the non-crystalline silicon layer; irradiating, with a laser beam, the projecting part, a portion under the projecting part, and portions on both sides of the projecting part which are the non-crystalline silicon layer, the non-crystalline silicon layer in the projecting part and the portion under the projecting part being crystallized into a crystalline silicon layer, and the portions on both sides of the projecting part remaining as the non-crystalline silicon layer; forming a contact layer between (i) at least a side surface of the crystalline silicon layer and an upper surface of the non-crystalline silicon layer and (ii) at least one of a source electrode and a drain electrode, the contact layer comprising non-crystalline silicon doped with impurity or polysilicon doped with impurity; and forming the source electrode and the drain electrode along at least the side surface of the crystalline silicon layer and the upper surface of the non-crystalline silicon layer and with the contact layer in between, the source electrode being formed above one portion of the non-crystalline silicon layer, and the drain electrode being formed above the other portion of the non-crystalline silicon layer, in which when irradiating the non-crystalline silicon layer with the laser beam, absorptance of the non-crystalline silicon layer for the laser beam is greater in the projecting part and the portion under the projecting part of the non-crystalline silicon layer than in the portions on both sides of the projecting part of the non-crystalline silicon layer.

Here, when irradiating the non-crystalline silicon layer with the laser beam, the crystalline silicon layer including crystals having an average grain size in a range from 10 nm to 1 μm is formed by the laser irradiation, for example.

According to this aspect, the crystalline silicon layer is formed using the interference effect of the laser beam inside the channel protective layer, the non-crystalline silicon layer and the gate insulating layer, and the interference effect of the laser beam inside the non-crystalline silicon layer and the gate insulating layer. More specifically, the crystalline silicon layer is formed by controlling the absorptance of the laser beam on the non-crystalline silicon layer for the predetermined laser wavelength by using the configuration of the thickness of the channel protective layer and the non-crystalline silicon layer in the projecting part of the channel layer and the thickness of the gate insulating layer and the configuration of the non-crystalline silicon layer and the gate insulating layer on the part on both sides of the projecting part of the channel layer. More specifically, the crystalline silicon layer is formed by irradiating the non-crystalline silicon layer with the laser beam having the thicknesses set such that the non-crystalline silicon layer under the channel protective layer has high absorptance of the laser beam, and that the non-crystalline silicon layer present on both sides of the non-crystalline silicon layer under the channel protective layer has a lower absorptance of the laser beam by the process for forming the projecting shape. Since the thickness of the non-crystalline silicon layer under the channel protective layer is configured to have a high absorptance for the laser beam, the non-crystalline silicon layer irradiated with the laser beam is crystallized into the crystalline silicon layer. In contrast, the thickness of the non-crystalline silicon layer present on both sides of the non-crystalline silicon layer under the channel protective layer is set such that the non-crystalline silicon layer has a low absorptance for the laser beam. Accordingly, even after the non-crystalline silicon layer is irradiated with the laser beam, the non-crystalline silicon layer remains as the channel layer. According to this aspect, the channel layer having a projecting shape including the crystalline silicon layer and the non-crystalline silicon layer formed on both sides of the crystalline silicon layer is formed such that the thickness from the bottom surface of the channel layer to the upper surface on the parts on both sides of the projecting part of the channel layer is smaller than the thickness from the bottom surface of the channel layer to the upper surface of the projecting part of the channel layer. Accordingly, it is possible to balance excellent on-characteristics and off-characteristics.

According to this aspect, all of the channel length defined by the width of the channel protective layer is occupied by the crystalline silicon layer having low resistance. Accordingly, even when the source electrode and the drain electrode are provided uneven with respect to the channel protective layer underneath, the distance from the crystalline silicon layer having low resistance to the source electrode in the channel path and the distance from the crystalline silicon layer having low resistance to the drain electrode in the channel path become equal, which makes the electronic characteristics symmetric to the switching of the source electrode and the drain electrode.

In addition, when irradiating the non-crystalline silicon layer with the laser beam, a wavelength of the laser beam is in a range from 473 nm to 561 nm, for example.

According to this aspect, it is possible to easily cause the interference effect of the laser beam inside the channel protective layer, the non-crystalline silicon layer, and the gate insulating layer, and to easily cause the difference in the absorptance for the laser beam in the projecting part and the part on both sides of the projecting part in the channel layer.

The method for fabricating the thin-film transistor according to an aspect of the present disclosure preparing a substrate; forming a gate electrode above the substrate; forming a gate insulating layer above the gate electrode; forming a non-crystalline silicon layer above the gate insulating layer; forming a channel protective layer above the non-crystalline silicon layer; forming a projecting part by processing the non-crystalline silicon layer and the channel protective layer, the projecting part having an upper layer composed of the channel protective layer and the lower layer composed of the non-crystalline silicon layer; irradiating, with a laser beam, the projecting part, a portion under the projecting part, and portions on both sides of the projecting part which are the non-crystalline silicon layer, the non-crystalline silicon layer in the projecting part and the portion under the projecting part being crystallized into a first crystalline silicon layer, and the portions on both sides of the projecting part being crystallized into a second crystalline silicon layer; forming a contact layer between (i) at least a side surface of the first crystalline silicon layer and an upper surface of the second crystalline silicon layer and (ii) at least one of a source electrode and a drain electrode, the contact layer comprising crystalline silicon doped with impurity or polysilicon doped with impurity; and forming the source electrode and the drain electrode along at least the side surface of the first crystalline silicon layer and the upper surface of the second crystalline silicon layer and with the contact layer in between, the source electrode being formed above one portion of the second crystalline silicon layer, and the drain electrode being formed above the other portion of the second crystalline silicon layer, in which when irradiating the non-crystalline silicon layer with the laser beam, absorptance of the non-crystalline silicon layer for the laser beam is greater in the projecting part and the portion under the projecting part of the non-crystalline silicon layer than in the portions on both sides of the projecting part of the non-crystalline silicon layer, and the first crystalline silicon layer formed has crystals having an average grain size larger than an average size of crystals in the second crystalline silicon layer.

Here, the average grain size of the crystals in the first crystalline silicon layer is in a range from 40 nm to 1 μm, and the average grain size of the crystals in the second crystalline silicon layer is at least 10 nm and smaller than 40 nm, for example.

According to this aspect, not only the projecting part in the non-crystalline silicon layer in which the channel layer made of first crystalline silicon having high crystallinity but also the parts on both sides of the projecting part of the non-crystalline silicon layer for forming the second crystalline silicon layer, that is, a channel layer having low crystallinity are irradiated with the laser beam. Accordingly, by selecting appropriate intensity of the laser beam and thickness configuration, there is flexibility which allows fabricating a channel layer having low crystallinity up to the crystalline silicon layer having a small average grain size. In the channel layer having projecting shape, the second crystalline silicon layer on the parts on both sides of the projecting part has smaller average grain size of crystals and larger resistance than the first crystalline silicon layer in the projecting part. Accordingly, the off-characteristics can be reduced compared to the case when the entire channel layer has the average grain size of the first crystalline silicon layer. Furthermore, since the first crystalline silicon layer has a larger average grain size of crystals and smaller resistance than the second crystalline silicon layer. Accordingly, compared to the case in which the entire channel layer has the average grain size of the second crystalline silicon layer, the resistance across the channel layer is lower, and the on-state current is larger. Accordingly, it is possible to fabricate the thin-film transistor to have desired characteristics having a region in which the average grain size is large and a region in which the average grain size is small in the channel layer focusing on the on-state current or the off-state current. Accordingly, it is possible to balance excellent on-characteristics and off-characteristics.

According to this aspect, all of the channel length defined by the width of the channel protective layer is the crystalline silicon layer having low resistance. Accordingly, even when the source electrode and the drain electrode are provided uneven with respect to the channel protective layer underneath, the distance from the crystalline silicon layer having low resistance to the source electrode in the channel path and the distance from the crystalline silicon layer having low resistance to the drain electrode in the channel path become equal, which makes the electronic characteristics symmetric to the switching of the source electrode and the drain electrode.

Furthermore, when irradiating the laser, the wavelength of the laser beam may be in a range from 473 nm to 561 nm.

According to this aspect, it is possible to easily cause the interference effect of the laser beam inside the channel protective layer, the non-crystalline silicon layer, and the gate insulating layer, and to easily cause the difference in the absorptance for the laser beam in (i) the projecting part and the part underneath, and (ii) the part on both sides of the projecting part in the channel layer.

Alternatively, when irradiating the non-crystalline silicon layer with the laser beam, the wavelength of the laser beam is 473 nm, and when forming the projecting part, the projecting part is formed such that a thickness of the non-crystalline silicon layer from a bottom surface to an upper surface on a side of the projecting part of the non-crystalline silicon layer is smaller, by at least 13 nm, than a thickness of the non-crystalline silicon layer from the bottom surface to an upper surface in the projecting part, for example.

Alternatively, when irradiating the non-crystalline silicon layer with the laser beam, the wavelength of the laser beam is 532 nm, and when forming the projecting part, the projecting part is formed such that a thickness of the non-crystalline silicon layer from a bottom surface to an upper surface on a side of the projecting part of the non-crystalline silicon layer is smaller, by at least 15 nm, than a thickness of the non-crystalline silicon layer from the bottom surface to an upper surface in the projecting part, for example.

Alternatively, when irradiating the non-crystalline silicon layer with the laser beam, the wavelength of the laser beam is 561 nm, and when forming the projecting part, the projecting part is formed such that a thickness of the non-crystalline silicon layer from a bottom surface to an upper surface on a side of the projecting part of the non-crystalline silicon layer is smaller, by at least 16 nm, than a thickness of the non-crystalline silicon layer from the bottom surface to an upper surface of the projecting part, for example.

According to this aspect, the projecting part of the channel layer may be polycrystalline silicon layer, and the parts of the channel layer on both sides of the projecting part may be a non-crystalline silicon layer or microcrystalline silicon layer.

In addition, when irradiating the non-crystalline silicon layer with the laser beam, a difference between absorptance of the non-crystalline silicon layer in the projecting part and a part under the projecting part for the laser beam and absorptance of the non-crystalline silicon layer in portions on both sides of the projecting part for the laser beam is at least 3%, for example.

According to this aspect, the projecting part of the channel layer may be the polycrystalline silicon layer, and the parts of the channel layer on both sides of the projecting part may be the non-crystalline silicon layer or microcrystalline silicon layer.

In addition, when irradiating the non-crystalline silicon layer with the laser beam, the wavelength of the laser beam is 473 nm, and when forming the projecting part, the projecting part is formed such that a thickness of the non-crystalline silicon layer from a bottom surface to an upper surface on a side of the projecting part of the non-crystalline silicon layer is smaller, by at least 4 nm, than a thickness of the non-crystalline silicon layer from the bottom surface to an upper surface in the projecting part, for example. More specifically, when forming the projecting part, the projecting part may be formed such that the thickness from the bottom surface of the non-crystalline silicon layer to the upper surface on the parts on both sides of the projecting part of the non-crystalline silicon layer is at most 27 nm and over 0 nm, and the thickness from the bottom surface of the non-crystalline silicon layer to the upper surface of the projecting part of the non-crystalline silicon layer is at least 35 nm.

Alternatively, when irradiating the non-crystalline silicon layer with the laser beam, the wavelength of the laser beam is 532 nm, and when forming the projecting part, the projecting part is formed such that a thickness of the non-crystalline silicon layer from a bottom surface to an upper surface on a side of the projecting part of the non-crystalline silicon layer is smaller, by at least 5 nm, than a thickness of the non-crystalline silicon layer from the bottom surface to an upper surface in the projecting part, for example. More specifically, when forming the projecting part, the projecting part may be formed such that the thickness from the bottom surface of the non-crystalline silicon layer to the upper surface on the parts on both sides of the projecting part of the non-crystalline silicon layer is at most 30 nm and over 0 nm, and the thickness from the bottom surface of the non-crystalline silicon layer to the upper surface of the projecting part of the non-crystalline silicon layer is at least 40 nm.

Alternatively, when irradiating the non-crystalline silicon layer with the laser beam, the wavelength of the laser beam is 561 nm, and when forming the projecting part, the projecting part is formed such that a thickness of the non-crystalline silicon layer from a bottom surface to an upper surface on a side of the projecting part of the non-crystalline silicon layer is smaller, by at least 5 nm, than a thickness of the non-crystalline silicon layer from the bottom surface to an upper surface in the projecting part, for example. More specifically, when forming the projecting part, the projecting part may be formed such that the thickness from the bottom surface of the non-crystalline silicon layer to the upper surface on the parts on both sides of the projecting part of the non-crystalline silicon layer is at most 32 nm and over 0 nm, and the thickness from the bottom surface of the non-crystalline silicon layer to the upper surface of the projecting part of the non-crystalline silicon layer is at least 42 nm.

According to this aspect, the projecting part of the channel layer and the part underneath may be polycrystalline silicon layer, and the parts of the channel layer on both sides of the projecting part may be a non-crystalline silicon layer or microcrystalline silicon layer.

In addition, when irradiating the non-crystalline silicon layer with the laser beam, an absorptance of the non-crystalline silicon layer in the projecting part and the part under the projecting part for the laser beam is at least 30%, and an absorptance of the portions of the non-crystalline silicon layer on both sides of the projecting part for the laser beam is at most 20%, for example.

According to this aspect, the projecting part of the channel layer may be polycrystalline silicon layer, and the parts of the channel layer on both sides of the projecting part may be a non-crystalline silicon layer or microcrystalline silicon layer.

Furthermore, when irradiating the substrate with the laser beam, the value obtained by dividing, by the wavelength of the laser beam, the optical thickness of the non-crystalline silicon layer obtained by multiplying the thickness from the bottom surface of the non-crystalline silicon layer to the parts on both sides of the projecting part of the non-crystalline silicon layer may be at most 0.286, and a value obtained by dividing, by the wavelength of the laser beam, the optical thickness of the non-crystalline silicon layer obtained by multiplying the thickness from the bottom surface of the non-crystalline silicon layer to the upper surface of the projecting part of the non-crystalline silicon layer may be at least 0.381.

According to this aspect, the absorptance of the laser beam in the projecting part of the non-crystalline silicon may be at least 30%, and the absorptance of the laser beam in the parts on both sides of the projecting part of the non-crystalline silicon layer may be at most 20%.

In addition, when irradiating the non-crystalline silicon layer with the laser beam, X and Y satisfy the following (Expression 1) and (Expression 2), where l and m denote integers starting from 0, X denotes a value obtained by dividing, by a wavelength of the laser beam, an optical thickness of the non-crystalline silicon layer calculated by multiplying a thickness of the non-crystalline silicon layer from a bottom surface to an upper surface in the projecting part and a refractive index of the non-crystalline silicon layer, and Y denotes a value obtained by dividing, by the wavelength of the laser beam, an optical thickness of the gate insulating layer obtained by multiplying a thickness of the gate insulating layer and a refractive index of the gate insulating layer, for example.

$$0.50m \le Y \le 0.40+0.50m \quad \text{(Expression 1)}$$

$$-4.00(X-0.50l)+1.92+0.50m \le Y \le -4.00(X-0.50l)+2.68+0.50m \quad \text{(Expression 2)}$$

According to this aspect, the absorptance of the projecting part of the non-crystalline silicon for the laser beam may be at least 50%, including the maximum absorptance, for example.

Alternatively, when forming the gate insulating layer, the gate insulating layer including a silicon nitride layer and a silicon oxide layer formed on the silicon nitride layer may be formed. More specifically, the gate insulating layer may be formed to have a thickness which makes the capacitance in the capacitors connected in series composed of the silicon nitride layer and the silicon oxide layer and the capacitance of a single-layer silicon oxide layer having a thickness in a range from 100 nm to 140 nm are equal.

According to this aspect, by having the two-layer structure for the gate insulating layer, the absorptance for the laser beam in the projecting part of the non-crystalline silicon and the part underneath increases. With this, it is possible to increase the average grain size of crystals in the projecting part in the channel layer and the part underneath so as to increase the on-state current.

In addition, when forming the gate insulating layer, the gate insulating layer including a silicon nitride layer and a silicon oxide layer on the silicon nitride layer is formed, when irradiating the non-crystalline silicon layer with the laser beam, X and Y satisfy the following (Expression 3) and (Expression 4) or (Expression 5) and (Expression 6), where n denotes integers starting from 0, X denotes a value obtained by dividing, by the wavelength of the laser beam, an optical thickness of the non-crystalline silicon layer calculated by multiplying a thickness of the non-crystalline silicon layer from a bottom surface to an upper surface in the projecting part and a refractive index of the non-crystalline silicon layer, and Y denotes a value obtained by dividing, by a value obtained by multiplying a refractive index of the silicon oxide layer and the wavelength of the laser beam, an optical thickness of the gate insulating layer including the silicon nitride layer and the silicon oxide layer obtained by a conversion using a refractive index of the silicon oxide layer, for example.

$$0.226 \le Y \le 0.26 \quad \text{(Expression 3)}$$

$$-2.90(X-0.5n)+1.39 \le Y \le -2.90(X-0.5n)+1.97 \quad \text{(Expression 4)}$$

$$0.340 \le Y \le 0.543 \quad \text{(Expression 5)}$$

$$-2.90(X-0.5n)+1.70 \le Y \le -2.90(X-0.5n)+2.28, \quad \text{(Expression 6)}$$

According to this aspect, in the configuration in which the gate insulating layer has a two-layer structure, the absorptance of the projecting part of the non-crystalline silicon and the part underneath may be at least 50%, including the maximum absorptance.

In addition, when forming the projecting part, Z satisfies the following (Expression 7), where Z denotes a value obtained by dividing, by the wavelength of the laser beam, an optical thickness of the channel protective layer obtained by multiplying a thickness of the channel protective layer and a refractive index of the channel protective layer, and k denotes an integer starting from 0.

$$0.5 \times (k+0.3) \le Z \le 0.5 \times (k+0.7) \quad \text{(Expression 7)}$$

According to this aspect, the channel protective layer serves as the anti-reflection film for the laser beam, and the absorptance of the non-crystalline silicon for the laser beam increases. Although the degree of increase in the absorptance periodically changes relative to the thickness of the channel protective layer, the range in which the absorptance particularly increases may be represented by (Expression 7) using the optical thickness of the channel protective layer. Accordingly, by forming the channel protective layer satisfying (Expression 7), the absorption efficiency for the laser beam in the projecting part of the channel layer and the part underneath increases.

Furthermore, when forming the projecting part, the projecting part is formed such that the thickness from the bottom surface of the non-crystalline silicon layer to the upper surface of the projecting part in the non-crystalline silicon layer is at most 100 nm.

When the non-crystalline silicon layer in the projecting part is extremely thick, the non-crystalline silicon layer transmits the laser beam in the thickness direction, and the laser beam is attenuated before reaching a part immediately above the gate insulating layer, which is to be the current path. However, by having the thickness of the non-crystalline silicon layer at most 100 nm, the laser beam reaches deep inside of the non-crystallizing layer. Accordingly, it is possible to crystallize the non-crystalline silicon layer immediately above the gate insulating layer which is to be the current path. With this, it is possible to improve the sub-threshold swing characteristics of the thin-film transistor may be improved.

More specifically, when forming the projecting part, the projecting part may be formed such that the thickness from the bottom surface of the non-crystalline silicon layer to the upper surface on the parts on both sides of the projecting part of the non-crystalline silicon layer is at least 10 nm.

When the non-crystalline silicon layer on the parts on both sides of the projecting part is extremely thin, the absorptance of the non-crystalline silicon layer for the laser beam is low. Accordingly, most of the energy of the laser beam transmitted through the non-crystalline silicon layer enters the gate electrode, damaging the gate electrode. However, by setting the thickness of the non-crystalline silicon layer at least 10 nm prevents the damage on the gate electrode caused by the excessive laser beam.

Furthermore, when forming the projecting part, the projecting part may be formed such that the side surface of the non-crystalline silicon layer which is the lower layer and the side surface of the channel protective layer which is the upper layer are coplanar with each other.

Furthermore, when preparing the substrate, the substrate having a surface on which the undercoat layer is formed may be prepared, and when forming the gate insulating layer, the gate electrode may be formed on the undercoat layer.

According to this aspect, it is possible to prevent the impurity included in the substrate from entering the channel layer.

Furthermore, when forming the gate electrode, a metal film made of refractory metal including Mo or MOW or an alloy made of refractory metal may be used as the gate electrode.

Furthermore, when forming the gate insulating layer, a film having an extinction coefficient at most 0.01 with respect to the wavelength of the laser beam may be formed as the gate insulating layer.

According to this aspect, it is possible to suppress the absorption of the laser beam by the gate insulating layer, and to increase the absorptance for the laser beam in the projecting part of the non-crystalline silicon and the part underneath.

Furthermore, when forming the gate insulating layer, the silicon oxide layer may be formed as the gate insulating layer.

Furthermore, when forming the gate insulating layer, the silicon nitride layer may be formed as the gate insulating layer.

Furthermore, when forming the channel protective layer, a film having an extinction coefficient at most 0.01 with respect to the wavelength of the laser beam may be formed as the channel protective layer.

According to this aspect, it is possible to suppress the absorption of the laser beam by the channel protective layer, and to increase the absorptance for the laser beam in the projecting part of the non-crystalline silicon and the part underneath.

Furthermore, when forming the channel protective layer, the silicon oxide layer may be formed as the channel protective layer.

Furthermore, when forming the channel protective layer, the silicon nitride layer may be formed as the channel protective layer.

Furthermore, when irradiating the non-crystalline silicon layer with the laser beam, the laser beam may be a beam in the continuous wave mode or the pseudo-continuous wave mode.

Furthermore, when irradiating the non-crystalline silicon layer with the laser beam, the laser beam may be a beam emitted from a solid-state laser device.

Furthermore, when irradiating the non-crystalline silicon layer with the laser beam, the laser beam may be a beam emitted from a semiconductor laser device.

Furthermore, when irradiating the non-crystalline silicon layer with the laser beam, the change in the density of emitted energy of the laser beam on the non-crystalline silicon layer may be less than 5%.

According to this aspect, the variation in the characteristics of the channel layer caused by the laser beam can be suppressed.

Furthermore, when irradiating the non-crystalline silicon layer with the laser beam, the laser beam may be emitted on the projecting part of the non-crystalline silicon layer, the part under the projecting part, and the parts on both sides of the projecting part at a constant scanning speed.

Furthermore, the display apparatus according to an aspect of the present disclosure is a display apparatus having a liquid crystal panel or an organic EL panel including the thin-film transistor, and when the display apparatus includes the liquid crystal panel, the thin-film transistor drives the liquid crystal panel, and when the display apparatus includes the organic EL panel, the TFT drives the organic EL panel.

According to this aspect, excellent on-characteristics and excellent off-characteristics are balanced, and the electrical characteristics may be symmetric to the switching of the source electrode and the drain electrode.

The following shall describe the thin-film transistor and the method for fabricating the thin-film transistor and the display apparatus according to the embodiment with reference to the drawings.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of appended Claims and their equivalents. Therefore, among the structural elements in the following exemplary embodiments, structural elements not recited in any one of the independent claims are described as arbitrary structural elements.

First Embodiment

First, the thin-film transistor according to the embodiment 1 shall be described below.

FIG. 1 is a cross-sectional view schematically illustrating the configuration of a thin-film transistor according to the embodiment 1.

The thin-film transistor is a channel-protective bottom-gate thin-film transistor for display device, and includes: a substrate 100, a gate electrode 110 formed on the substrate 100, a gate insulating layer 120 formed on the gate electrode 110, a crystalline silicon layer 131 formed above the gate insulating layer 120 above the gate electrode 110, a non-crystalline silicon layer (amorphous silicon) 130 formed on the gate insulating layer 120 on both sides of the crystalline silicon layer 131, a channel protective layer 140 formed on the crystalline silicon layer 131, a source electrode 171 formed above one of non-crystalline silicon layer 130 along an upper surface of an end portion of the channel protective layer 140, side surfaces of the channel protective layer 140 and the crystalline silicon layer 131, and an upper surface of the non-crystalline silicon layer 130, and a drain electrode 172 formed above the other non-crystalline silicon layer 130. Furthermore, a contact layer 162 formed between the non-crystalline silicon layer 130 and the source electrode 171, and a contact layer 161 formed between the non-crystalline silicon layer 130 and the drain electrode 172 are included.

Next, the thin-film transistor in FIG. 1 shall be described in detail.

The substrate 100 is a glass substrate made of, for example, a glass material such as silica glass, alkali-free glass, or highly heat-resistant glass. A substrate on which an undercoat layer made of a silicon nitride ($SiN_x$) film, a silicon oxide ($SiO_y$) film, a silicon oxynitride ($SiO_yN_x$) film, or others is formed in order to prevent impurity such as sodium and phosphorus in the glass substrate from entering the crystalline silicon thin layer 131 may be used. In addition, the undercoat layer may also function as a layer for buffering the heat on the substrate 100 in a high-temperature thermal treatment process such as laser annealing. The thickness of the undercoat layer is in a range approximately from 100 nm to 2000 nm.

The gate electrode 110 is made of a single-layer structure or multi-layer structure of a conductive material resistant to the melting temperature of silicon or its alloy. For example, the gate electrode 110 is formed by forming molybdenum (Mo), aluminum (Al), copper (Cu), tungsten (W), tantalum (Ta), niobium (Nb), nickel (Ni), titanium (Ti), chromium (Cr), molybdenum-tungsten (MoW) or others on the substrate 100, and patterning the metal into the predetermined shape. The thickness of the gate electrode 110 is preferably in a range from 30 nm to 300 nm, for example, and is more preferably in a range from 50 nm to 100 nm. This is because, if the gate electrode 110 is thin, the transmittance of the gate electrode 110 increases, which tends to reduce reflection of the laser beam. In contrast, if the gate electrode 110 is thick, the coverage of the gate insulating layer 120 is reduced, and more particularly, the characteristics of the thin-film transistor is likely to be degraded such as disconnection of the gate insulating layer 120 on the step at the end portion of the gate electrode 110, and others.

The crystalline silicon layer 131 and the non-crystalline silicon layer 130 are semiconductor layers formed on the gate insulating layer 120, and compose a channel layer in which the carrier movement is controlled by the voltage at the gate electrode 110. The crystalline silicon layer 131 is made of a crystalline silicon layer such as polysilicon layer, and is formed by crystallizing part of the amorphous silicon in the non-crystalline silicon layer 130 into polycrystals (including micro-crystals) by laser irradiation. The crystalline silicon semiconductor layer 131 may be formed as a silicon layer including a mixed crystal structure of amorphous silicon and crystalline silicon.

Note that, an average grain size of crystals included in the crystalline silicon layer 131 is in a range from 10 nm to 1 µm.

The channel layer has a projecting part and a flat part on the surface. In the channel layer, a thickness from the bottom surface of the channel layer (the bottom surfaces of the crystalline silicon layer 131 and the non-crystalline silicon layer 130) to the surface of the flat part (the upper surface of the non-crystalline silicon layer 130) (thickness of the flat part) is smaller than a thickness from the bottom surface of the channel layer to the upper surface of the projecting part (the upper surface of the crystalline silicon layer 131) (the thickness of the projecting part). Furthermore, the projecting part of the channel layer is located above the gate electrode 110, and the ends of the projecting part are located inside the ends of the gate electrode 110. More specifically, the gate length (channel length) of the gate electrode 110 is longer than a gate-length wise length of the channel layer. With this, the regions on the sides of the projecting part of the channel layer, that is, the flat parts of the channel layer serve as a path of the electric charges.

The gate insulating layer 120 is made of, for example, silicon oxide, silicon nitride, a silicon oxynitride film, aluminum oxide (AlOz), tantalum oxide (TaOw) or a stacked film of these materials, and is formed on the substrate 100 and the gate electrode 110 so as to cover the gate electrode 110 on the substrate 100.

Note that, since crystalline silicon is used for the channel layer, the gate insulating layer 120 is composed of silicon oxide, for example. This is because, maintaining excellent interface state between the channel layer and the gate insulating layer 120 is preferable to maintain excellent threshold voltage characteristics in TFT.

The channel protective layer 140 is a protective film for protecting the channel layer and is formed on the upper surface of the projecting part of the channel layer with each other. The side surfaces of the channel protective layer 140 and the side surfaces of the crystalline silicon layer 131 (side surfaces of the projecting part of the channel layer) are coplanar with each other. The channel protective layer 140 serves as a channel etching stopper (CES) layer for preventing the channel layer from being etched at the time of etching for forming a pair of contact layers 161 and 162. However, the upper part of the channel protective layer 140 is etched by the etching when patterning the contact layers 161 and 162 (not illustrated).

The channel protective layer 140 is an inorganic material layer having an inorganic material such as silicon oxide or silicon nitride as a main component. Note that, the channel protective layer 140 has insulating property, and the pair of contact layers 161 and 162 is not electrically connected.

The pair of contact layers 161 and 162 is made of an amorphous semiconductor layer containing impurity at high concentration or a polycrystalline semiconductor layer containing impurity at high concentration. Part of the contact layers 161 and 162 are formed above the channel layer interposing the channel protective layer 140 in between, and the rest of the contact layers 161 and 162 is formed on and in contact with the channel layer. The pair of the contact layers 161 and 162 is provided opposite to each other with a predetermined distance on the channel protective layer 140.

Each of the pair of the contact layers 161 and 162 is formed across the upper surface of the channel protective layer 140 and the flat part of the channel layer, and is formed to cover the upper surface and a side surface of the channel protective layer 140, and a side surface of the projecting part of the channel layer and the upper surface of the flat part of the channel layer. More specifically, the two contact layers 161 and 162 are separately provided on the both sides of the projecting part of the channel layer, and are formed on the upper surface and the side surfaces of the end portion of the channel protective layer 140, the side surfaces of the channel layer next to the side surfaces of the channel protective layer 140, and on the upper surface of the flat part of the channel layer next to the side surfaces of the projecting part of the channel layer.

The pair of contact layers 161 and 162 is an n-type semiconductor layer made of non-crystalline silicon having phosphorus (P) doped as impurity, and is an n$^+$ layer containing impurity at high concentration of at least $1 \times 10^{19}$ [atm/cm$^3$]. The thickness of the contact layers 161 and 162 may be in a range from 5 nm to 100 nm, for example.

The source electrode 171 and the drain electrode 172 which constitute a pair is formed along the upper surface and the side surfaces of the channel protective layer 140, side surfaces of the projecting part of the channel layer next to the side surfaces of the channel protective layer 140, and the upper surface of the flat part of the channel layer next to the side surfaces of the projecting part of the channel layer. The pair of the source electrode 171 and the drain electrode 172 is provided apart from each other.

The pair of the source electrode 171 and the drain electrode 172 is formed above the channel layer, and is formed on the corresponding contact layer 161 and 162, respectively. More specifically, the source electrode 171 is formed on the contact layer 162, and the drain electrode 172 is formed on the contact layer 161.

The source electrode 171 and the drain electrode 172 are made of single-layer structure or multi-layer structure of conductive materials or an alloy of the conductive materials, and may be formed of a material such as aluminum (Al), tantalum (Ta), molybdenum (Mo), tungsten (W), silver (Ag), copper (Cu), titanium (Ti), chromium (Cr), or others, for example. Alternatively, the source electrode 171 and the drain electrode 172 may be a three-layer structure including MoW/Al/MoW. Note that, the thickness of the source electrode 171 and the drain electrode 172 is approximately in a range from 100 nm to 500 nm, for example.

Figure 2:
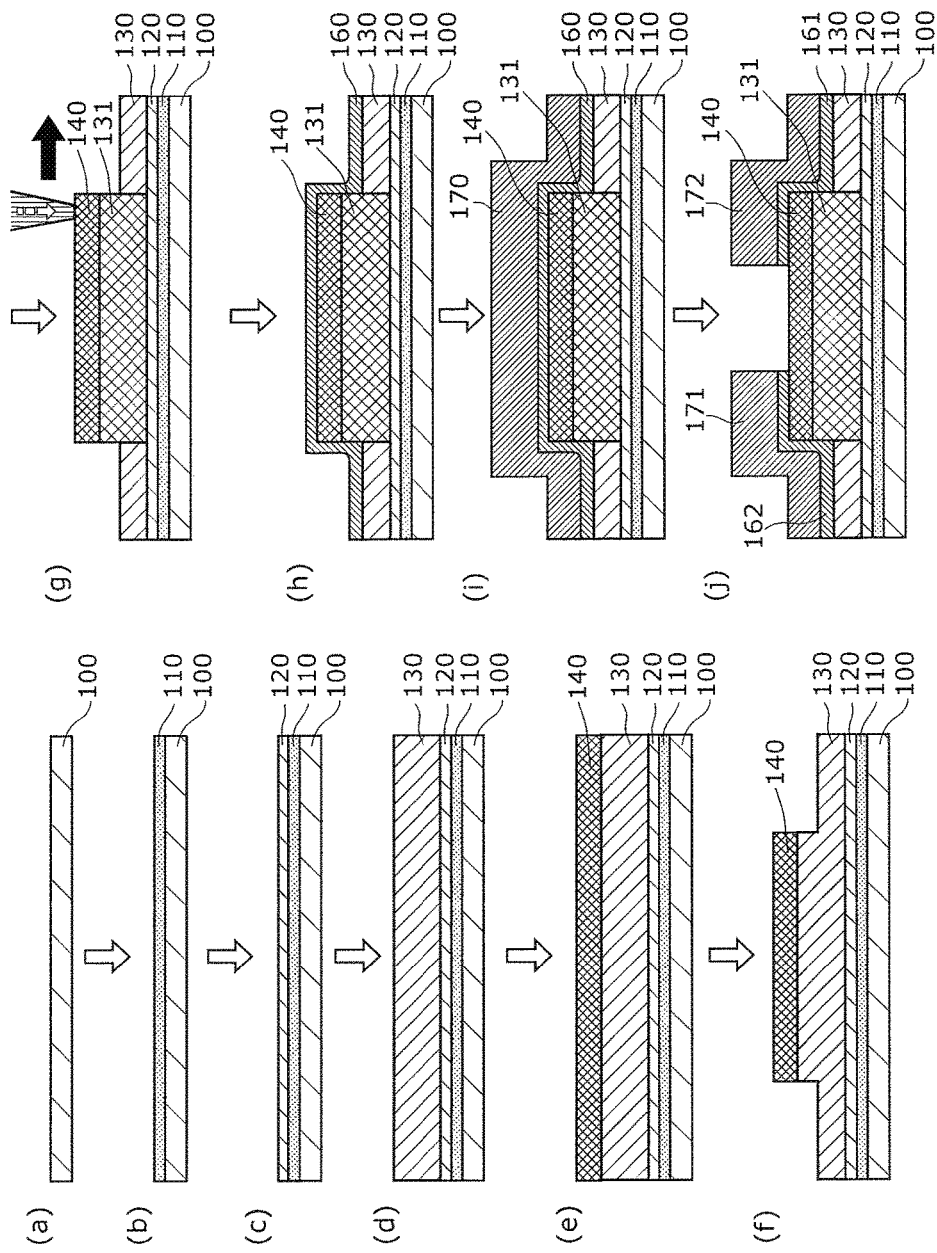
FIG. 2, illustrating processes (a) to (j), is a cross-sectional view schematically illustrating processes in a method for fabricating a thin-film transistor according to the embodiment 1.

The following shall describe the method for fabricating the thin-film transistor according to the embodiment with reference to FIG. 2. FIG. 2 is a cross-sectional view schematically illustrating processes in the method for fabricating the thin-film transistor according to the embodiment 1.

The method for fabricating the thin-film transistor includes: preparing the substrate 100; forming the gate electrode 110 above the substrate 100; forming the gate insulating layer 120 above the gate electrode 110; forming the non-crystalline silicon layer 130 above the gate insulating layer 120; forming the channel protective layer 140 above the non-crystalline silicon layer 130; forming a projecting part by processing the non-crystalline silicon layer 130 and the channel protective layer 140, the projecting part having an upper layer composed of the channel protective layer 140 and the lower layer composed of the non-crystalline silicon layer 130; irradiating, with a laser beam, the projecting part, a portion under the projecting part, and portions on both sides of the projecting part which are the non-crystalline silicon layer 130, the non-crystalline silicon layer 130 in the projecting part and the portion under the projecting part being crystallized into the crystalline silicon layer 131, and the portions on both sides of the projecting part remaining as the non-crystalline silicon layer 130; forming the source electrode 171 and the drain electrode 172 along at least the side surface of the crystalline silicon layer 131 and the upper surface of the non-crystalline silicon layer 130, the source electrode 171 being formed above one portion of the non-crystalline silicon layer 130, and the drain electrode 172 being formed above the other portion of the non-crystalline silicon layer 130, in which when irradiating the non-crystalline silicon layer 130 with the laser beam, absorptance of the non-crystalline silicon layer 130 for the laser beam is greater in the projecting part and the portion under the projecting part of the non-crystalline silicon layer 130 than in the portions on both sides of the projecting part of the non-crystalline silicon layer 130.

Next, the method for fabricating the thin-film transistor in FIG. 2 shall be described in detail.

First, as illustrated in (a) in FIG. 2, a glass substrate is prepared as the substrate 100. Note that, before forming the gate electrode 110, an undercoat layer made of a silicon nitride film, a silicon oxide film, a silicon oxynitride film or others may be formed on the surface of the substrate 100 by the plasma chemical vapor deposition (CVD) or others. The undercoat layer is preferably formed of a silicon oxide film (SiOy), where $1.5<y<2.0$ is satisfied, and a thickness is in a range from 300 nm to 1500 nm. The more preferable range of the undercoat layer is in a range from 500 nm to 1000 nm. This is because, the thermal load on the substrate 100 is reduced if the thickness of the undercoat layer is increased, but if the undercoat layer is too thick; it causes a flake-off or crack.

Next, as illustrated in (b) in FIG. 2, the gate electrode 110 having the predetermined shape is formed on the substrate 100. For example, by depositing a gate metal film made of a refractory metal including Mo or MoW or an alloy including the refractory metal is formed by sputtering as the gate electrode 110, and patterning the gate metal film using the photolithography and the wet etching to form the gate electrode 110 in the predetermined shape. The wet etching on MoW may be performed using a chemical solution which is a mixture of trihydrogen phosphate ($H_3PO_4$), nitric acid ($HNO_3$), acetic acid ($CH_3COOH$) and water in a predetermined ratio, for example.

Note that, when an undercoat layer is formed on the surface of the substrate 100, the gate electrode 110 is formed on the undercoat layer.

Next, as illustrated in (c) in FIG. 2, the gate insulating layer 120 is formed on the substrate 100 and the gate electrode 110 so as to cover the gate electrode 110. For example, a silicon oxide layer or a silicon nitride layer is formed on the gate electrode 110 as the gate insulating layer 120 by the plasma CVD.

Next, as illustrated in (d) in FIG. 2, the non-crystalline silicon layer 130 made of non-crystalline silicon is formed on the gate insulating layer 120 by the plasma CVD or others continuous to the deposition of the gate insulating layer 120.

Next, as illustrated in (e) in FIG. 2, a channel protective layer 140 made of silicon oxide is deposited on the non-crystalline silicon layer 130 by the plasma CVD or others.

Next, as illustrated in (f) in FIG. 2, part of the non-crystalline silicon layer 130 and the channel protective layer 140 is continuously removed by etching. The removal continues after the channel protective layer 140 is removed and the non-crystalline silicon layer 130 is exposed to the surface. Accordingly, the projecting part and the flat part are formed in the non-crystalline silicon layer 130, while a channel protective layer 140 remains on the projecting part. Since the etching on the non-crystalline silicon layer 130 and the channel protective layer 140 are continuously performed, that is, the projecting part is formed by self-alignment. Accordingly, the projecting part having a side surface of the non-crystalline silicon layer 130 and a side surface of the channel protective layer 140 in the upper layer that are coplanar with each other is formed.

Next, as illustrated in (g) in FIG. 2, the non-crystalline silicon layer 130 is crystallized into the crystalline silicon layer 131 by the laser annealing. More specifically, the crystalline silicon layer 131 is formed by crystallizing the non-crystalline silicon layer 130 using a predetermined laser beam moving relative to the substrate 100 unidirectionally. More specifically, first, dehydrogenation process (dehydrogenation annealing in a temperature at least 400° C. which is a temperature at which hydrogen is released from the crystalline silicon layer 130) is performed on the non-crystalline silicon layer 130 formed. Subsequently, the crystalline silicon layer 131 is formed by changing the structure of the non-crystalline silicon layer 130 into polycrystalline structure (including microcrystals) by the laser annealing.

Here, the laser beam scans the non-crystalline silicon layer 130 from the flat part on one side of the non-crystalline silicon layer 130, the projecting part, and the flat part on the other side of the non-crystalline silicon layer 130. Since the thickness of the flat part is smaller than the projecting part, the absorptance of the laser beam in the flat part is low. Accordingly, in the non-crystalline silicon layer 130, the crystalline silicon layer 131 is formed in the projecting part and the part underneath without crystallization. In contrast, the flat part on both sides of the projecting part is not crystallized and remains as the non-crystalline silicon layer 130. As a result, only the projecting part of the non-crystalline silicon layer 130 and the part underneath the projecting part are selectively crystallized, and the crystalline silicon layer 131 is selectively formed only in the projecting part of the non-crystalline silicon layer 130 and the part underneath.

The laser light source of the laser beam is a laser having a wavelength in a visible light range. The laser having a wavelength in a visible light range is a laser having a wavelength in a range approximately from 380 nm to 780 nm, and is preferably a green laser having a wavelength in a range from 473 nm to 561 nm. Furthermore, it is preferable that the laser beam in a visible light range may be in a continuous wave mode or pseudo continuous wave mode. This is because, when the laser beam having a wavelength in a visible light range is in a pulse operation mode other than the continuous wave mode or the pseudo-continuous wave mode, the non-crystalline silicon layer 130 is irradiated with the laser beam discontinuously. Accordingly, it is not possible to maintain the continuing melting state of the non-crystalline silicon layer 130. Another reason that the pseudo-continuous wave mode is included is that the melting state is maintained by reheating the non-crystalline silicon layer 130 before being cooled to the melting point. Accordingly, in a preferred embodiment of the pseudo-continuous wave mode, the non-crystalline silicon layer 130 can be reheated by a pulse before cooled to the melting point, and the melting state can be maintained. Furthermore, the laser beam having the wavelength in the visible light range is a light beam emitted from the solid state laser device, and may be a light beam emitted from a laser device using a semiconductor laser device. Either way is preferable since the laser beam can be controlled highly accurately. Furthermore, the laser beam having the wavelength in the visible light range forms the crystalline silicon layer 131 is even in crystallinity. Accordingly, the laser beam is preferable when the change in the irradiation energy density of the laser beam on the amorphous silicon layer 130 when emitted on the non-crystalline silicon layer 130 is less than 5%. By forming the crystalline silicon layer 131 without uneven crystallinity, initial design characteristics of the thin-film transistor are achieved, implementing even characteristics.

When the non-crystalline silicon layer 130 in the projecting part is extremely thick, the non-crystalline silicon layer 130 transmits the laser beam in the thickness direction, and the laser beam is attenuated before reaching a part immediately above the gate insulating layer 120 which is the current path. However, by having the thickness of the non-crystalline silicon layer 130 at most 100 nm, the laser beam enters the non-crystalline silicon layer 130 deeply, allowing crystallization of the non-crystalline silicon layer 130 immediately above the gate insulating layer 120 which serves as a current path. Accordingly, in the process in (f) in FIG. 2, it is preferable that the projecting part is formed such that the thickness from the bottom surface of the non-crystalline silicon layer 130 to the upper surface of the projecting part of the non-crystalline silicon layer 130 is at most 100 nm.

Furthermore, when the non-crystalline silicon layer 130 on both sides of the projecting part of the non-crystalline silicon layer 130 is extremely thin, the absorptance of the non-crystalline silicon layer 130 for the laser beam becomes low. Accordingly, most of the energy of the laser beam transmitted the non-crystalline silicon layer 130 enters the gate electrode 110, damaging the gate electrode 110. However, by setting the thickness of the non-crystalline silicon layer 130 at least 10 nm prevents the damage on the gate electrode caused by the excessive laser beam. Accordingly, in the process in (f) in FIG. 2, it is preferable that the projecting part is formed to have a thickness of at least 10 nm from the bottom surface of the non-crystalline silicon layer 130 to the upper surface on the both sides of the projecting part of the non-crystalline silicon layer 130.

Furthermore, in order to reduce the absorption of the laser beam by the gate insulating layer 120 and increase the absorptance of the non-crystalline silicon layer 130 for the laser beam, it is preferable that a film made of silicon oxide or silicon nitride having an extinction coefficient at most 0.01 with respect to the wavelength of the laser beam in (g) in FIG. 2 is formed as the gate insulating layer 120 in the process in (c) in FIG. 2.

Furthermore, in order to reduce the absorption of the laser beam by the channel protective layer 140 and increase the absorptance of the non-crystalline silicon layer 130 for the laser beam, it is preferable that a film made of silicon oxide or silicon nitride having an extinction coefficient at most 0.01 with respect to the wavelength of the laser beam in (g) in FIG. 2 is formed as the channel protective layer 140, in the process in (c) in FIG. 2.

The non-crystalline silicon layer 130 is irradiated with a laser beam collected into linear form. There are two methods for the irradiation. In one method, the irradiation position of the linearly collected laser beam is fixed, and a stage on which the substrate 100 on which the non-crystalline silicon layer 130 is formed moves. In the other method, the stage is fixed, and the irradiation position of the laser beam moves. In either method, the non-crystalline silicon layer 130 is irradiated with the laser beam while the laser beam is moving relative to the non-crystalline silicon layer 130. As described above, the non-crystalline silicon layer 130 irradiated with the laser beam turns to the crystalline silicon layer 131 by crystallization caused by the increase in temperature by absorbing the energy of the laser beam.

Next, as illustrated in (h) in FIG. 2, the contact layer 160 to be the contact layers 161 and 162 is formed from the upper surface of the channel protective layer 140 to the flat part of the non-crystalline silicon layer 130. More specifically, the contact layer 160 made of non-crystalline silicon doped with impurity of pentavalent element such as phosphorus is formed by the plasma CVD, for example, so as to cover the upper surface and side surfaces of the channel protective layer 140, side surfaces of the projecting part of the crystalline silicon layer 131 and on the upper surface of the flat part of the non-crystalline silicon layer 130.

Next, as illustrated in (i) in FIG. 2, the source/drain metal film 170 to be the source electrode 171 and the drain electrode 172 is formed so as to cover the contact layer 160. For example, the source/drain metal film 170 having a tri-layer structure of MoW/Al/MoW is formed by sputtering.

Next, although not illustrated, in order to form the source electrode 171 and the drain electrode 172 in the predetermined shape, the source/drain metal film 170 is coated with a material for resist, and the resist material is exposed to light and developed so as to form the resist patterned into the predetermined shape. Subsequently, as illustrated in (j) in FIG. 2, etching is performed using the resist as the mask for patterning the source/drain metal film 170. With this, the source electrode 171 and the drain electrode 172 in the predetermined shape are formed. Here, the contact layer 160 serves as an etching stopper. Subsequently, the resist on the source electrode 171 and the drain electrode 172 is removed, and dry etching is performed using the source electrode 171 and the drain electrode 172 as the mask. With this, the contact layer 160 is patterned, and the channel layer is patterned into island shape. With this, it is possible to form a pair of contact layers 161 and 162 in the predetermined shape and an island-shaped channel layer.

The following shall describe the characteristics of the thin-film transistor according to the embodiment with reference to FIG. 3 to FIG. 8C.

Figure 3:
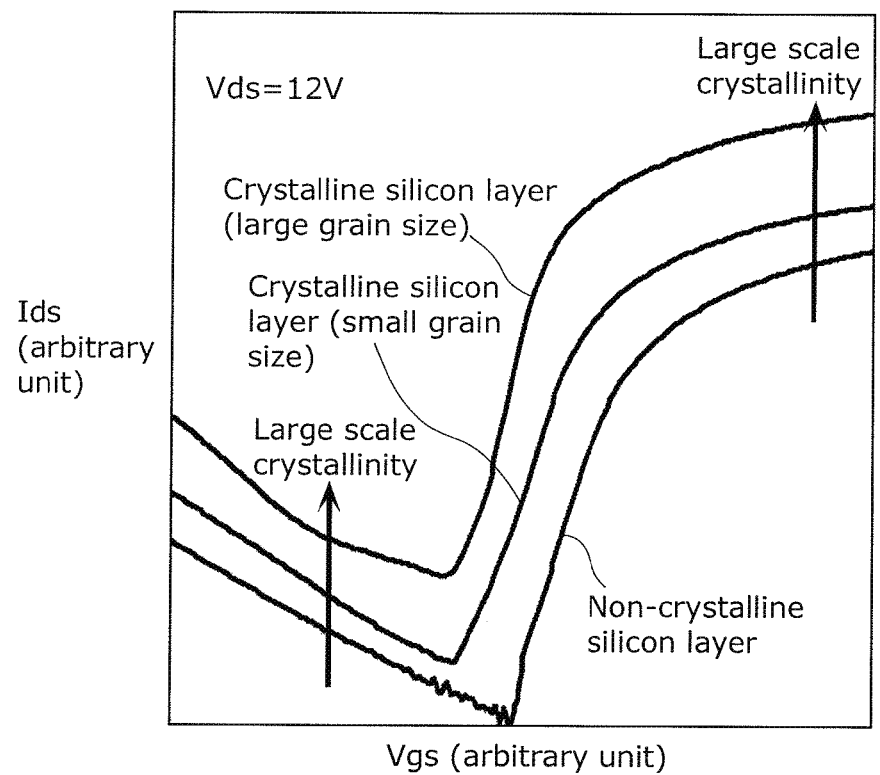
FIG. 3 is a diagram illustrating the change in the current-voltage characteristics of the thin-film transistor when the crystallinity of the channel layer changes.

FIG. 3 is a diagram illustrating the change in the current-voltage characteristics of the thin-film transistor when the crystallinity of the channel layer changes. Note that, FIG. 3 illustrates the characteristics when a voltage of 12 V is applied between the source and drain, and the horizontal axis represents the gate-source voltage, and the vertical axis represents source-drain current.

In the thin-film transistor in FIG. 1, the channel layer includes the non-crystalline silicon layer 130 and the crystalline silicon layer 131. However, the characteristics of the channel layer are different when the channel layer is composed only of the non-crystalline silicon layer 130 and when the channel layer is composed only of the crystalline silicon layer 131. More specifically, as illustrated in FIG. 3, when the channel layer is composed only of the non-crystalline silicon layer 130, the off-characteristics are good, while the on-characteristics are bad. In contrast, when the channel layer is composed only of the crystalline silicon layer 131, the off-characteristics are bad, while the on-characteristics are good.

The thin-film transistor illustrated in FIG. 1 uses the change in the characteristics depending on the difference between the crystallinity illustrated in FIG. 3, such that the excellent off-characteristics and on-characteristics are achieved at the same time. More specifically, while increasing the on-state current by having the crystalline silicon layer 131 as the projecting part below the channel protective layer 140 in the channel layer and all of the part below, the off-state current (leakage current) is reduced by having the non-crystalline silicon layer 130 as the part on both sides of the projecting part of the channel layer.

Figure 4A:
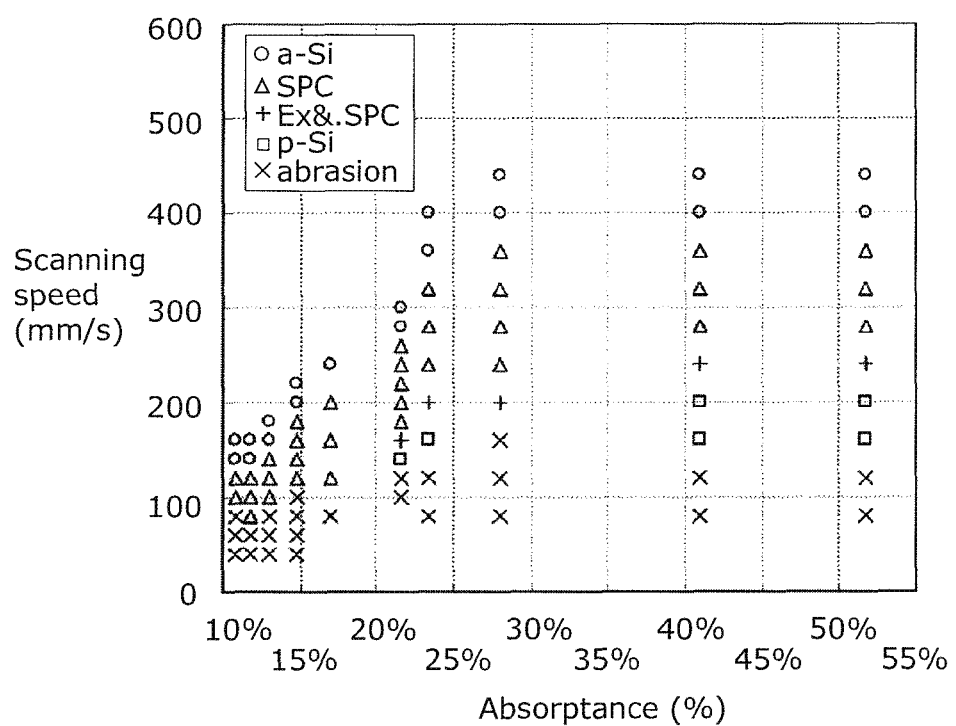
FIG. 4A illustrates the change in the crystalline silicon layer when the absorptance of the non-crystalline silicon layer for the laser beam and the scanning speed of the laser beam change.

FIG. 4A shows the change in the crystallinity of the crystalline silicon layer 131 in the laser annealing in the process in (g) in FIG. 2 when absorptance of the non-crystalline silicon layer 130 for the laser beam and the scanning speed of the laser beam changes.

Note that, changing the absorptance of the non-crystalline silicon layer 130 is achieved by changing the thickness of the non-crystalline silicon layer 130, that is, the channel layer.

Note that, in the measurement in FIG. 4A, the sample made under the laser output of 60 kW/cm$^2$, including the gate electrode 110 made of MoW having the thickness of 50 nm, and the gate insulating layer 120 made of silicon oxide having the thickness of 120 nm is used.

Furthermore, "a-Si" in FIG. 4A indicates that the crystalline silicon layer 131 is not crystallized into crystalline silicon but remains as non-crystalline silicon. "SPC" indicates that the average grain size of the crystals in the crystalline silicon layer 131 is in a range approximately from 25 nm to 35 nm. "Ex&.SPC" indicates that the average grain size of the crystalline silicon layer 131 is approximately at least 40 nm to smaller than 60 nm. "p-Si" indicates that the average grain size of the crystalline silicon layer 131 is in a range approximately from 60 nm to 1 μm. "abrasion" indicates that the crystalline silicon layer 131 does not function as the channel layer.

As illustrated in FIG. 4A, silicon layers having different crystallinity can be formed by changing the scanning speed of the laser annealing and the absorptance of the non-crystalline silicon layer 130. Even when the scanning speed is a constant speed, in the process in (f) in FIG. 2, the non-crystalline silicon layer and the crystalline silicon layer are simultaneously formed by one laser scanning, forming the crystalline silicon layer 131 in the projecting part of the channel layer and the non-crystalline silicon layer 130 on both sides of the projecting part by setting a difference between the absorptance of the projecting part of the non-crystalline silicon layer 130 and the part under the projecting part for the laser beam and the part on both sides of the non-crystalline silicon layer 130 to be at least 1%.

Note that, the absorptance of the non-crystalline silicon layer 130 is calculated by optical calculation, using the configuration, the thickness, and optical constant of the channel protective layer 140, the thickness and optical constant of the non-crystalline silicon layer 130, the configuration, thickness, and optical constant of the gate insulating layer 120, and the optical constant of the metal material for forming the gate electrode 110 underneath as parameters, and in consideration of the multiple interference of the laser beam. The following shall specifically describe the embodiment of the optical calculation.

Figure 4B:
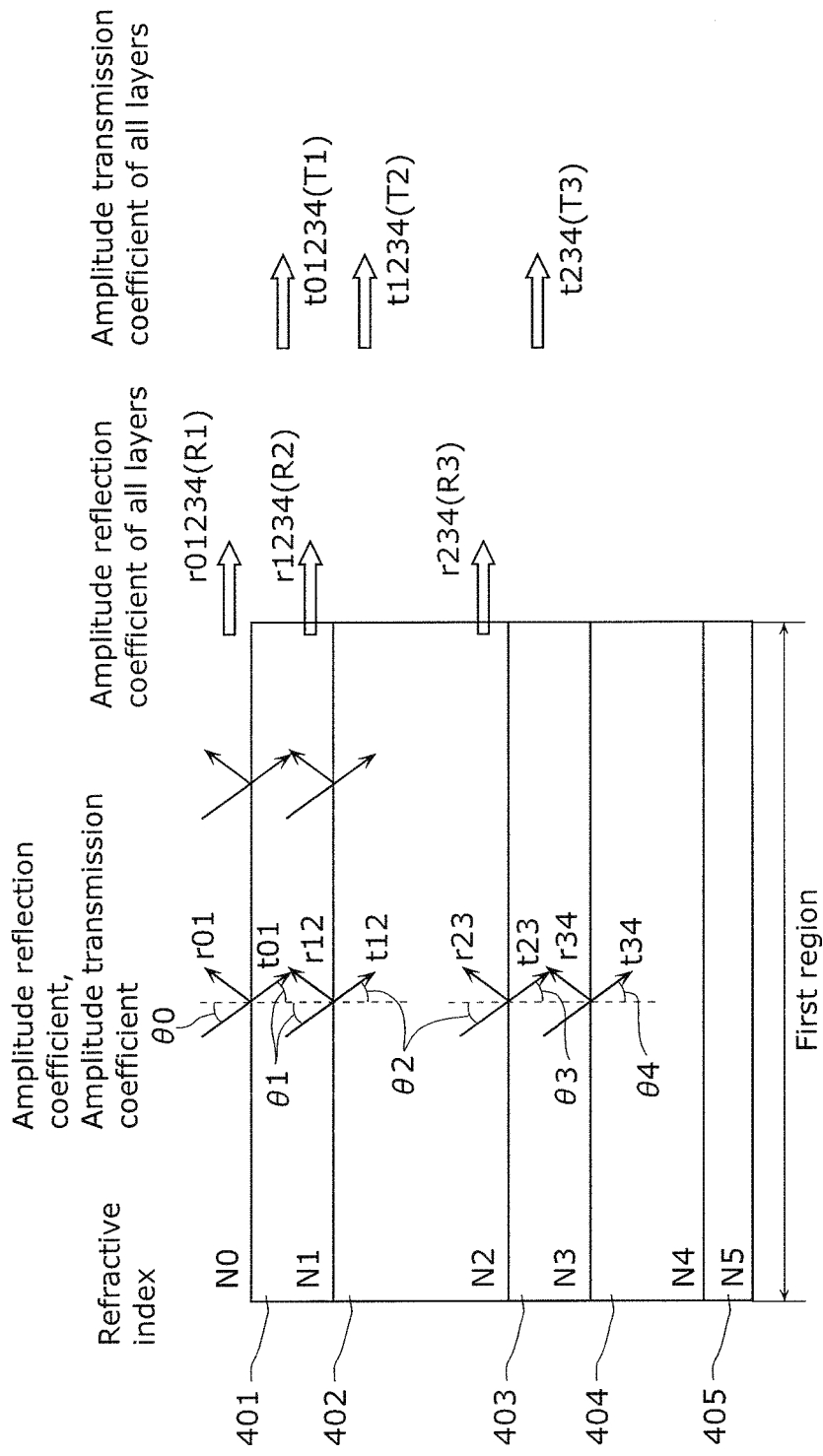
FIG. 4B is a diagram for describing the method for calculating the light absorptance on the non-crystalline silicon layer.

FIG. 4B is a diagram for describing the method for calculating the light absorptance on the non-crystalline silicon layer 130.

FIG. 4B illustrates the multi-layer structure modeling the structure of the thin-film transistor illustrated in FIG. 1. In the model structure illustrated in FIG. 4B, a layer 401 having a complex refractive index $N_1$, a layer 402 having a complex refractive index $N_2$, a layer 403 having a complex refractive index $N_3$, a layer 404 having a complex refractive index $N_4$, and a substrate 405 having a complex refractive index $N_5$ are included. The model structure illustrates the layer 404, the layer 403, the layer 402, and the layer 401 formed on the substrate 405 in order. A region having a complex refractive index $N_0$ in each of FIG. 4B is outside the model structure, and is on a side where the laser beam enters the model structure. For instance, this region is air. In such a case, the region has a refractive index of 1 and an extinction coefficient of 0.

The substrate 405 is a insulating substrate made of transparent glass or quartz, for example, has a refractive index 1.46 and corresponds to the substrate 100 illustrated in FIG. 1. The layer 404 is composed of MOW having a refractive index 3.47 and an extinction coefficient 3.78 and a thickness of 50 nm, and corresponds to the gate electrode 110 illustrated in FIG. 1. The layer 403 is composed of silicon oxide having a refractive index 1.467 and an extinction coefficient 0, and corresponds to the gate insulating layer 120 illustrated in FIG. 1. The layer 402 corresponds to the non-crystalline silicon layer 130 having a refractive index 5.074 and an extinction coefficient 0.621, for example. The layer 401 is composed of silicon oxide having a refractive index 1.467 and an extinction coefficient 0, and corresponds to the channel protective layer 140 illustrated in FIG. 1.

As illustrated in FIG. 4B, $r_{01}$ denotes an amplitude reflection coefficient for light entering the layer 401 from outside, $r_{12}$ denotes an amplitude reflection coefficient for light entering the layer 402 from the layer 401, $r_{23}$ denotes an amplitude reflection coefficient for light entering the layer 403 from the layer 402, and $r_{34}$ denotes an amplitude reflection coefficient for light entering the layer 404 from the layer 403. In addition, $t_{01}$ denotes an amplitude transmission coefficient for light entering the layer 401 from outside, $t_{12}$ denotes an amplitude transmission coefficient for light entering the layer 402 from the layer 401, $t_{23}$ denotes an amplitude transmission coefficient for light entering the layer 403 from the layer 402, and $t_{34}$ denotes an amplitude transmission coefficient for light entering the layer 404 from the layer 403.

Furthermore, $r_{01234}$ (R1), $r_{1234}$ (R2), and $r_{234}$ (R3) each denotes an amplitude reflection coefficient of all layers located above a region where the layer 404 corresponding to the gate electrode 110 is formed. In detail, $r_{234}$ (R3) denotes an amplitude reflection coefficient when the layers 404 and 403 are regarded as one layer. Likewise, $r_{1234}$ (R2) denotes an amplitude reflection coefficient when the layers 404, 403, and 402 are regarded as one layer, $r_{01234}$ (R1) denotes an amplitude reflection coefficient when the layers 404, 403, 402, and 401 are regarded as one layer. Meanwhile, $t_{01234}$ (T1), $t_{1234}$ (T2), and $t_{234}$ (T3) each denotes an amplitude transmission coefficient of all layers in the first region. In detail, $t_{234}$ (T3) denotes an amplitude transmission coefficient when the layers 404 and 403 are regarded as one layer. Likewise, $t_{1234}$ (T2) denotes an amplitude transmission coefficient when the layers 404, 403, and 402 are regarded as one layer, $t_{01234}$ (T1) denotes an amplitude transmission coefficient when the layers 404, 403, 402, and 401 are regarded as one layer.

The amplitude reflection coefficient and the amplitude transmission coefficient of all layers in the first region can be represented by the following (Expression 12) to (Expression 17).

[Math. 1]
$$r_{01234} = \frac{r_{01} + r_{1234}\exp(-i2\beta_1)}{1 + r_{01}r_{1234}\exp(-i2\beta_1)} \quad \text{(Expression 12)}$$

[Math. 2]
$$r_{1234} = \frac{r_{12} + r_{234}\exp(-i2\beta_2)}{1 + r_{12}r_{234}\exp(-i2\beta_2)} \quad \text{(Expression 13)}$$

[Math. 3]
$$r_{234} = \frac{r_{23} + r_{34}\exp(-i2\beta_3)}{1 + r_{23}r_{34}\exp(-i2\beta_3)} \quad \text{(Expression 14)}$$

[Math. 4]
$$t_{01234} = \frac{t_{01}t_{1234}\exp(-i\beta_1)}{1 + r_{01}r_{1234}\exp(-i2\beta_1)} \quad \text{(Expression 15)}$$

[Math. 5]
$$t_{1234} = \frac{t_{12}t_{234}\exp(-i\beta_2)}{1 + r_{12}r_{234}\exp(-i2\beta_2)} \quad \text{(Expression 16)}$$

[Math. 6]
$$t_{234} = \frac{t_{23}t_{34}\exp(-i\beta_3)}{1 + r_{23}r_{34}\exp(-i2\beta_3)} \quad \text{(Expression 17)}$$

The amplitude reflection coefficient and the amplitude transmission coefficient of all layers in the second region can be represented by the following (Expression 18) to (Expression 23)

[Math. 7]
$$r_{01235} = \frac{r_{01} + r_{1235}\exp(-i2\beta_1)}{1 + r_{01}r_{1235}\exp(-i2\beta_1)} \quad \text{(Expression 18)}$$

[Math. 8]
$$r_{1235} = \frac{r_{12} + r_{235}\exp(-i2\beta_2)}{1 + r_{12}r_{235}\exp(-i2\beta_2)} \quad \text{(Expression 19)}$$

[Math. 9]
$$r_{235} = \frac{r_{23} + r_{35}\exp(-i2\beta_3)}{1 + r_{23}r_{35}\exp(-i2\beta_3)} \quad \text{(Expression 20)}$$

[Math. 10]
$$t_{01235} = \frac{t_{01}t_{1235}\exp(-i\beta_1)}{1 + r_{01}r_{1235}\exp(-i2\beta_1)} \quad \text{(Expression 21)}$$

[Math. 11]
$$t_{1235} = \frac{t_{12}t_{235}\exp(-i\beta_2)}{1 + r_{12}r_{235}\exp(-i2\beta_2)} \quad \text{(Expression 22)}$$

[Math. 12]
$$t_{235} = \frac{t_{23}t_{35}\exp(-i\beta_3)}{1 + r_{23}r_{35}\exp(-i2\beta_3)} \quad \text{(Expression 23)}$$

Here, $$\beta_1 = 2\pi d_1 N_1 \cos\theta_1/\lambda \quad \text{[Math. 13]}$$

$$\beta_2 = 2\pi d_2 N_2 \cos\theta_2/\lambda \quad \text{[Math. 14]}$$

$$\beta_3 = 2\pi d_3 N_3 \cos\theta_3/\lambda \quad \text{[Math. 15]}$$

where d is the film thickness of each layer, $\theta$ is the angle of incidence/transmission in each layer, and $\lambda$ is the wavelength of the laser beam.

$\theta$ can be calculated according to Snell's law in the following manner.

$$N_0 \sin\theta_0 = N_1 \sin\theta_1 = N_2 \sin\theta_2 = N_3 \sin\theta_3 = N_4 \sin\theta_4 = N_5 \sin\theta_5 \quad \text{[Math. 16]}$$

The amplitude reflection coefficients $r_{01}$, $r_{12}$, $r_{23}$, and $r_{34}$ and the amplitude transmission coefficients $t_{01}$, $t_{12}$, $t_{23}$, and $t_{34}$ of the individual layers can be calculated using the following (Expression 24) to (Expression 33).

[Math. 17]
$$r_{01} = \frac{N_0\cos\theta_1 - N_1\cos\theta_0}{N_0\cos\theta_1 + N_1\cos\theta_0} \quad \text{(Expression 24)}$$

[Math. 18]
$$r_{12} = \frac{N_1\cos\theta_2 - N_2\cos\theta_1}{N_1\cos\theta_2 + N_2\cos\theta_1} \quad \text{(Expression 25)}$$

[Math. 19]
$$r_{23} = \frac{N_2\cos\theta_3 - N_3\cos\theta_2}{N_2\cos\theta_3 + N_3\cos\theta_2} \quad \text{(Expression 26)}$$

[Math. 20]
$$r_{34} = \frac{N_3\cos\theta_4 - N_4\cos\theta_3}{N_3\cos\theta_4 + N_4\cos\theta_3} \quad \text{(Expression 27)}$$

[Math. 21]
$$r_{35} = \frac{N_3\cos\theta_5 - N_5\cos\theta_3}{N_3\cos\theta_5 + N_5\cos\theta_3} \quad \text{(Expression 28)}$$

[Math. 22]
$$t_{01} = \frac{2N_0\cos\theta_1}{N_0\cos\theta_1 + N_1\cos\theta_0} \quad \text{(Expression 29)}$$

[Math. 23]
$$t_{12} = \frac{2N_1\cos\theta_2}{N_1\cos\theta_2 + N_2\cos\theta_1} \quad \text{(Expression 30)}$$

[Math. 24]
$$t_{23} = \frac{2N_2\cos\theta_3}{N_2\cos\theta_3 + N_3\cos\theta_2} \quad \text{(Expression 31)}$$

[Math. 25]

$$t_{34} = \frac{2N_3\cos\theta_4}{N_3\cos\theta_4 + N_4\cos\theta_3} \quad \text{(Expression 32)}$$

[Math. 26]

$$t_{35} = \frac{2N_3\cos\theta_5}{N_3\cos\theta_5 + N_5\cos\theta_3} \quad \text{(Expression 33)}$$

It is assumed here that the light is monochromatic laser beam, and p-polarized.

Following this, the amplitude reflection coefficient and the amplitude transmission coefficient of all layers in the first region are calculated as follows, using the aforementioned expressions. First, $r_{234}$ is calculated by substituting (Expression 26) and (Expression 27) into (Expression 14). Subsequently, $r_{1234}$ is calculated by substituting (Expression 25) and $r_{234}$ into (Expression 13). Subsequently, $r_{01234}$ is calculated by substituting (Expression 24) and $r_{1234}$ into (Expression 12). Subsequently, $t_{234}$ is calculated by substituting (Expression 26), (Expression 27), (Expression 31), and (Expression 32) into (Expression 17). Subsequently, $t_{1234}$ is calculated by substituting (Expression 25), (Expression 30), $r_{234}$ and $t_{234}$ into (Expression 16). Subsequently, $t_{01234}$ is calculated by substituting (Expression 24), (Expression 29), $r_{1234}$ and $t_{1234}$ into (Expression 15).

The reflectance R1, R2, and R3 and the transmittance T1, T2, and T3 of the layers are then calculated according to (Expression 34) to (Expression 39).

[Math. 27]

$$R_1 = |r_{01234}|^2 \quad \text{(Expression 34)}$$

[Math. 28]

$$R_2 = |r_{1234}|^2 \quad \text{(Expression 35)}$$

[Math. 29]

$$R_3 = |r_{234}|^2 \quad \text{(Expression 36)}$$

[Math. 30]

$$T_1 = \left(\frac{\text{Re}(N_4)\cos\theta_0}{\text{Re}(N_0)\cos\theta_4}\right)|t_{01234}|^2 \quad \text{(Expression 37)}$$

[Math. 31]

$$T_2 = \left(\frac{\text{Re}(N_4)\cos\theta_1}{\text{Re}(N_1)\cos\theta_4}\right)|t_{1234}|^2 \quad \text{(Expression 38)}$$

[Math. 32]

$$T_3 = \left(\frac{\text{Re}(N_4)\cos\theta_2}{\text{Re}(N_2)\cos\theta_4}\right)|t_{234}|^2 \quad \text{(Expression 39)}$$

Lastly, the light absorptance $A_{Si}$ of the non-crystalline silicon layer can be calculated according to (Expression 40).

[Math. 33]

$$A_{Si\ 1} = 1 - (R_1 + T_1) \quad \text{(Expression 40)}$$

In the case where a green laser beam of the wavelength in a range from 473 nm to 561 nm enters the model structure shown in FIG. 4B perpendicularly, i.e. at the incidence angle $\theta_0$ in a range where $\theta_0 = 0$ or $\sin\theta_0 = 0$ approximately holds, the absorptance of the non-crystalline silicon layer 130 is calculated. Note that the same calculation result is obtained even when the laser beam is s-polarized.

Note that, in this example, an embodiment using a model structure including the gate electrode 110 made of MoW, the gate insulating layer 120 made of silicon oxide, the non-crystalline silicon 130, and the channel protective layer 140 made of silicon oxide is illustrated. However, the calculation can be done in the same manner in variations such as a case in which the gate insulating film 120 is a stacked structure of silicon oxide and silicon nitride, and a case in which the channel protective layer 140 is not present by appropriately modifying the model structure in FIG. 4B. When changing the material for the gate electrode 110 (for example, when the material for the gate electrode 110 is Cu (refractive index 1.04, extinction coefficient 2.59), Al (refractive index 0.867, extinction coefficient 6.42), Mo (refractive index 3.61, extinction coefficient 3.79), W (refractive index 3.48, extinction coefficient 2.72), or when changing the materials for the gate insulating layer 120 and the channel protective layer 140 (when changing the material for the gate insulating layer 120 and the channel protective layer 140 to silicon nitride (refractive index 1.947, extinction coefficient 0)), the calculation can be performed in the same manner only by changing physical property values where appropriate.

FIG. 5A to FIG. 5F are contour diagrams illustrating results of calculations of the absorptance of the non-crystalline silicon layer 130 when the thickness of the non-crystalline silicon layer 130 and the thickness of the gate insulating layer 120 in the laser annealing process in (g) in FIG. 2. FIG. 6A illustrates the change in the absorptance of the non-crystalline silicon layer 130 when the thickness of the gate insulating layer 120 made of silicon oxide is 120 nm in FIG. 5D and FIG. 5F.

Note that, in FIG. 5A to FIG. 5F, the lower horizontal axes represent values each obtained by dividing an optical thickness of the non-crystalline silicon layer 130 by the wavelength of the laser beam. The optical thickness of the non-crystalline silicon layer 130 is calculated by multiplying the thickness of the non-crystalline silicon layer 130 and the refractive index of the non-crystalline silicon layer 130. The vertical axes on the left represent values each obtained by dividing the optical thickness of the gate insulating layer 120 by the wavelength of the laser beam. The optical thickness of the gate insulating layer 120 is obtained by multiplying the thickness of the gate insulating layer 120 and the refractive index of the gate insulating layer 120. The upper horizontal axes represent the thickness of the non-crystalline silicon layer 130, and the right vertical axes represent the thickness of the gate insulating layer 120 for reference, when the wavelength of the laser beam is set to be 532 nm without standardizing the thickness of the non-crystalline silicon layer 130 by the wavelength of the laser beam. In FIG. 6A, the horizontal axis represents a value obtained by dividing the optical thickness of the non-crystalline silicon layer 130 by the wavelength of the laser beam, and the vertical axis represents the absorptance of the non-crystalline silicon layer 130.

Figure 5A:
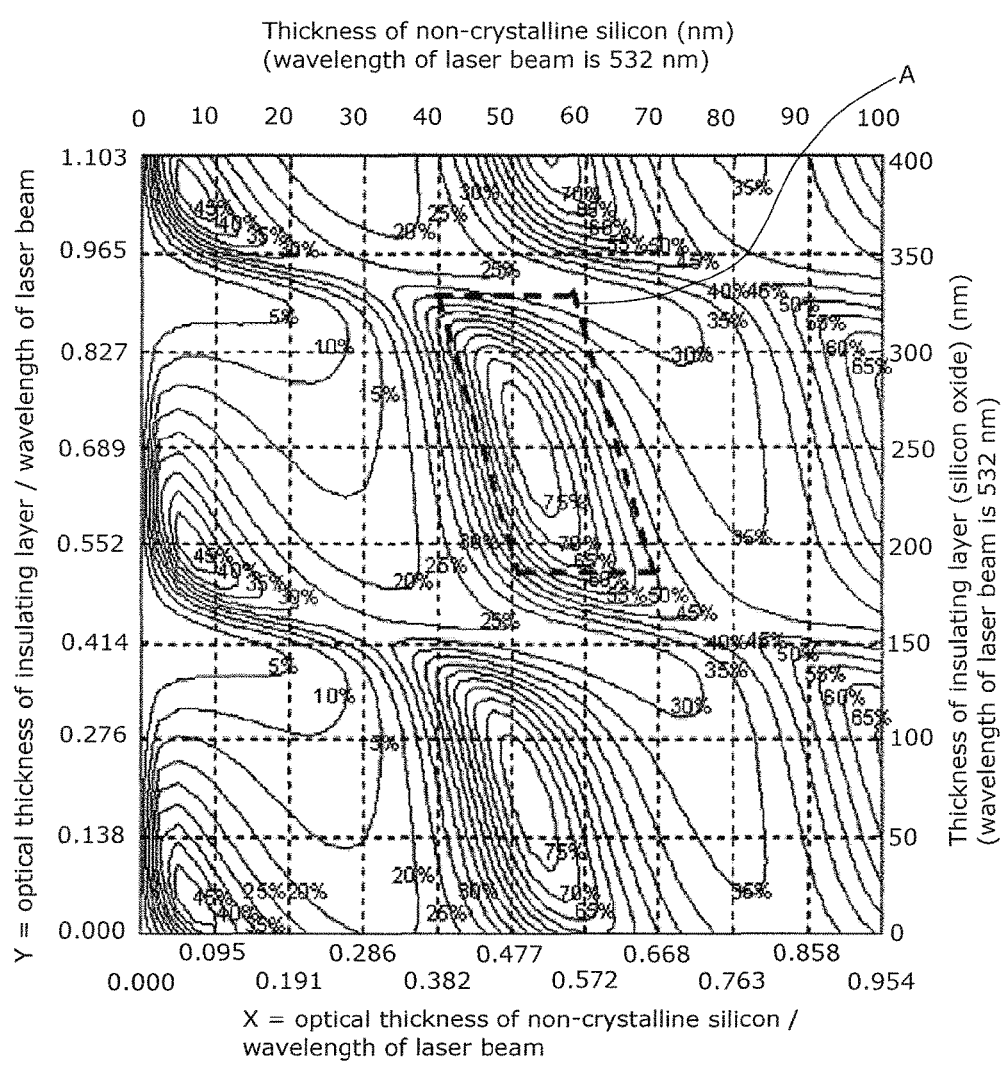
FIG. 5A is a contour diagram illustrating calculation results of the absorptance of the non-crystalline silicon layer when the thickness of the non-crystalline layer and the thickness of the gate insulating layer change, when performing laser annealing.
Figure 5B:
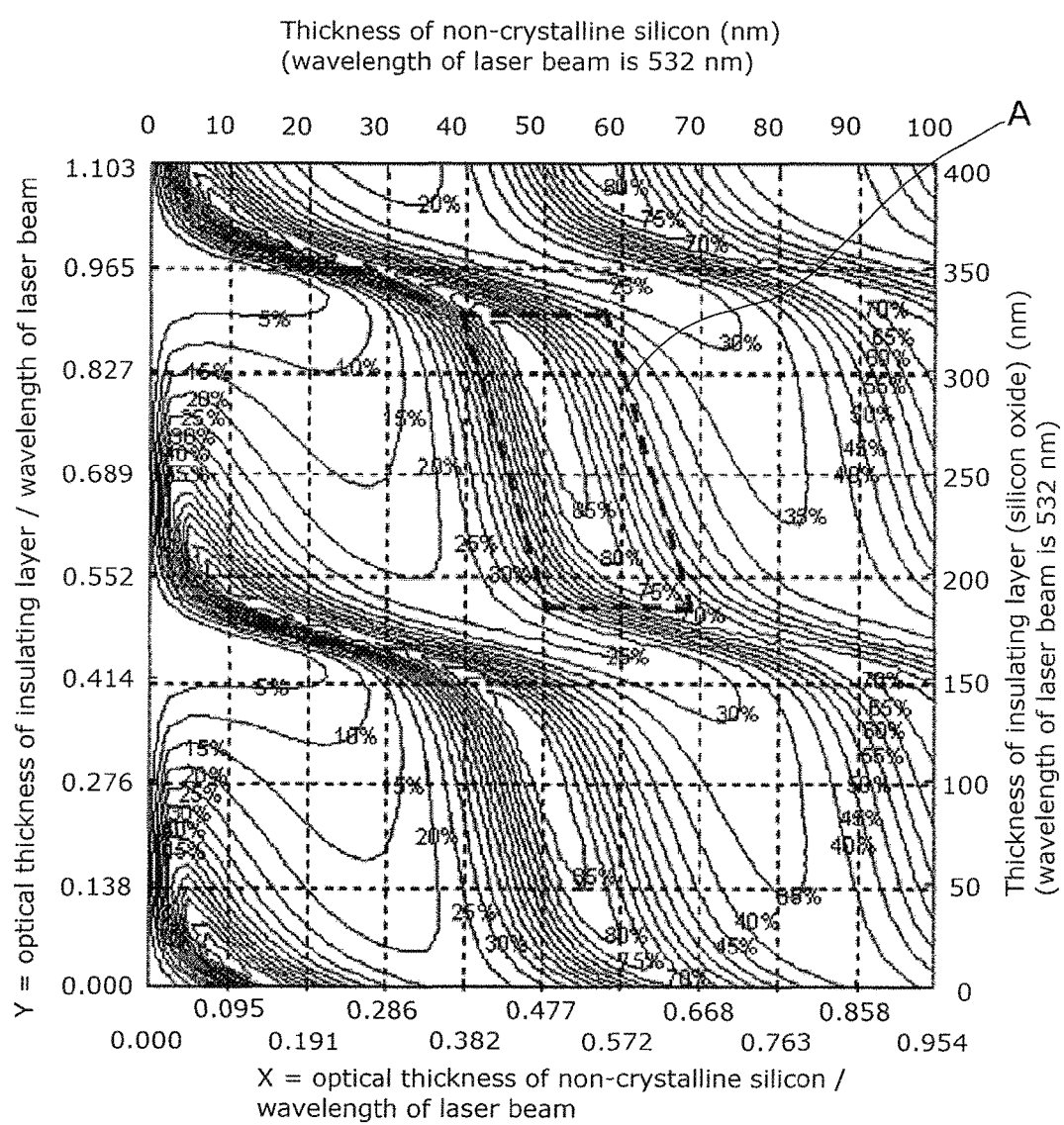
FIG. 5B is a contour diagram illustrating calculation results of the absorptance of the non-crystalline silicon layer when the thickness of the non-crystalline layer and the thickness of the gate insulating layer change, when performing laser annealing.
Figure 5C:
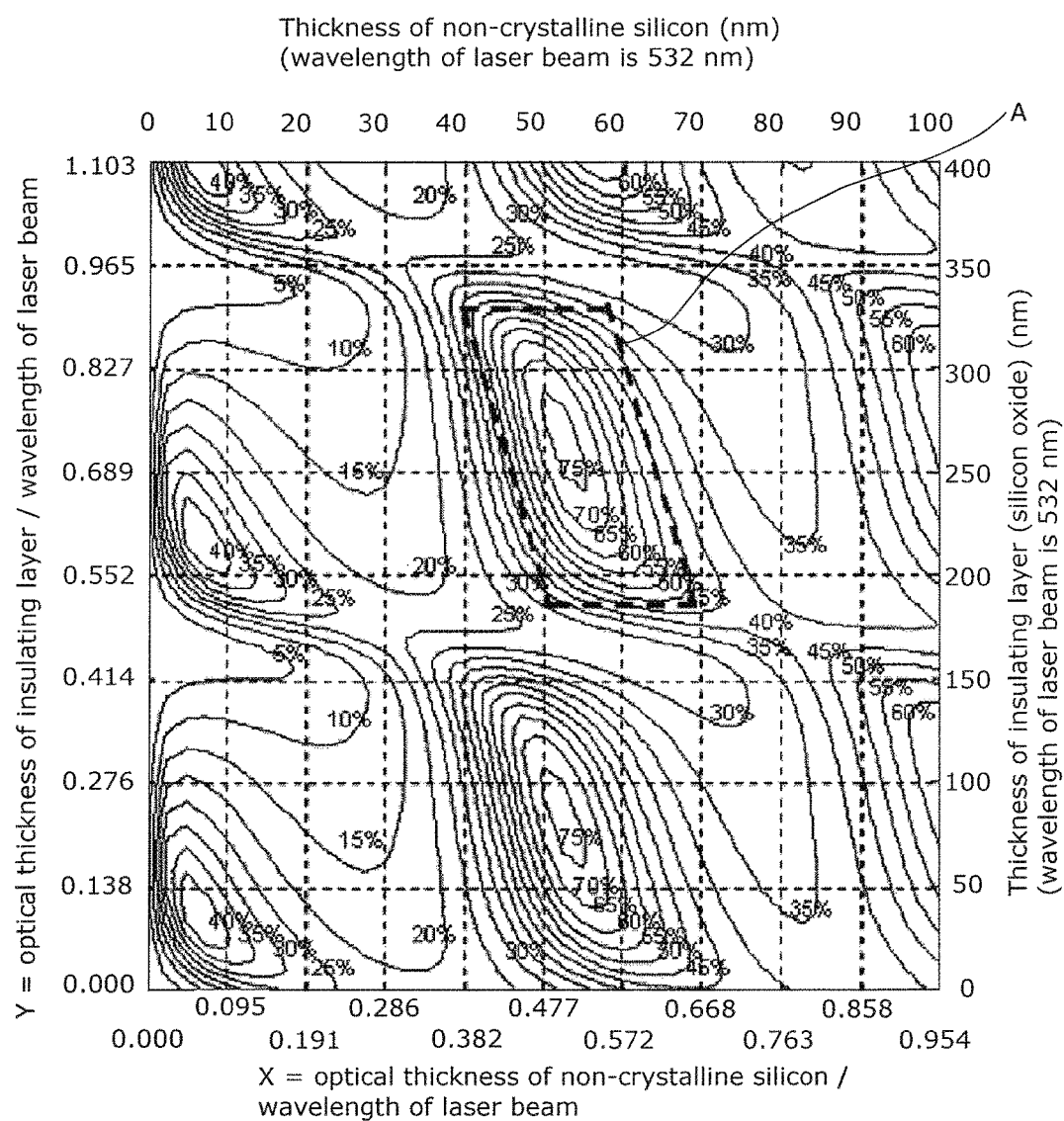
FIG. 5C is a contour diagram illustrating calculation results of the absorptance of the non-crystalline silicon layer when the thickness of the non-crystalline layer and the thickness of the gate insulating layer change, when performing laser annealing.
Figure 5D:
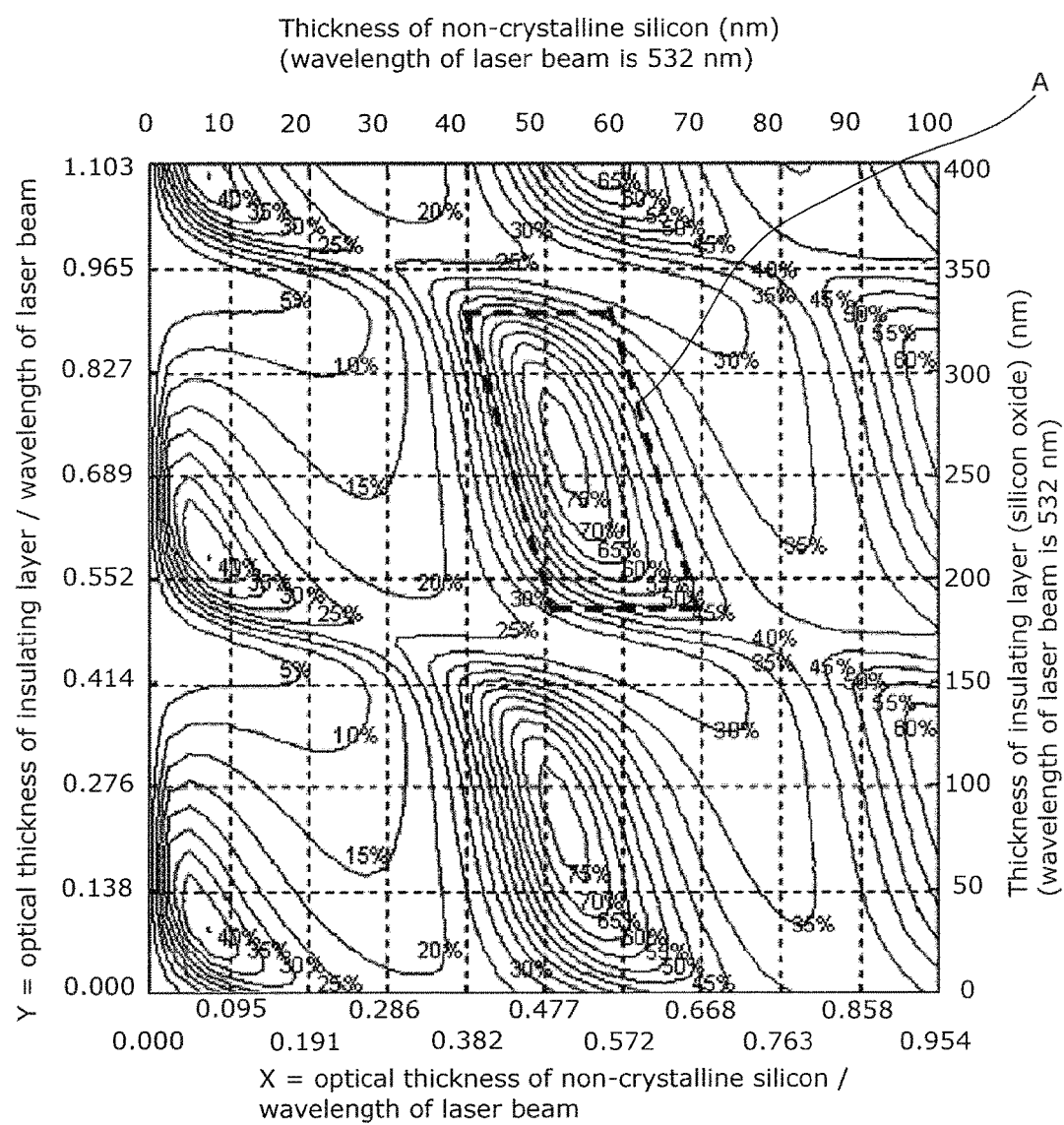
FIG. 5D is a contour diagram illustrating calculation results of the absorptance of the non-crystalline silicon layer when the thickness of the non-crystalline layer and the thickness of the gate insulating layer change, when performing laser annealing.
Figure 5E:
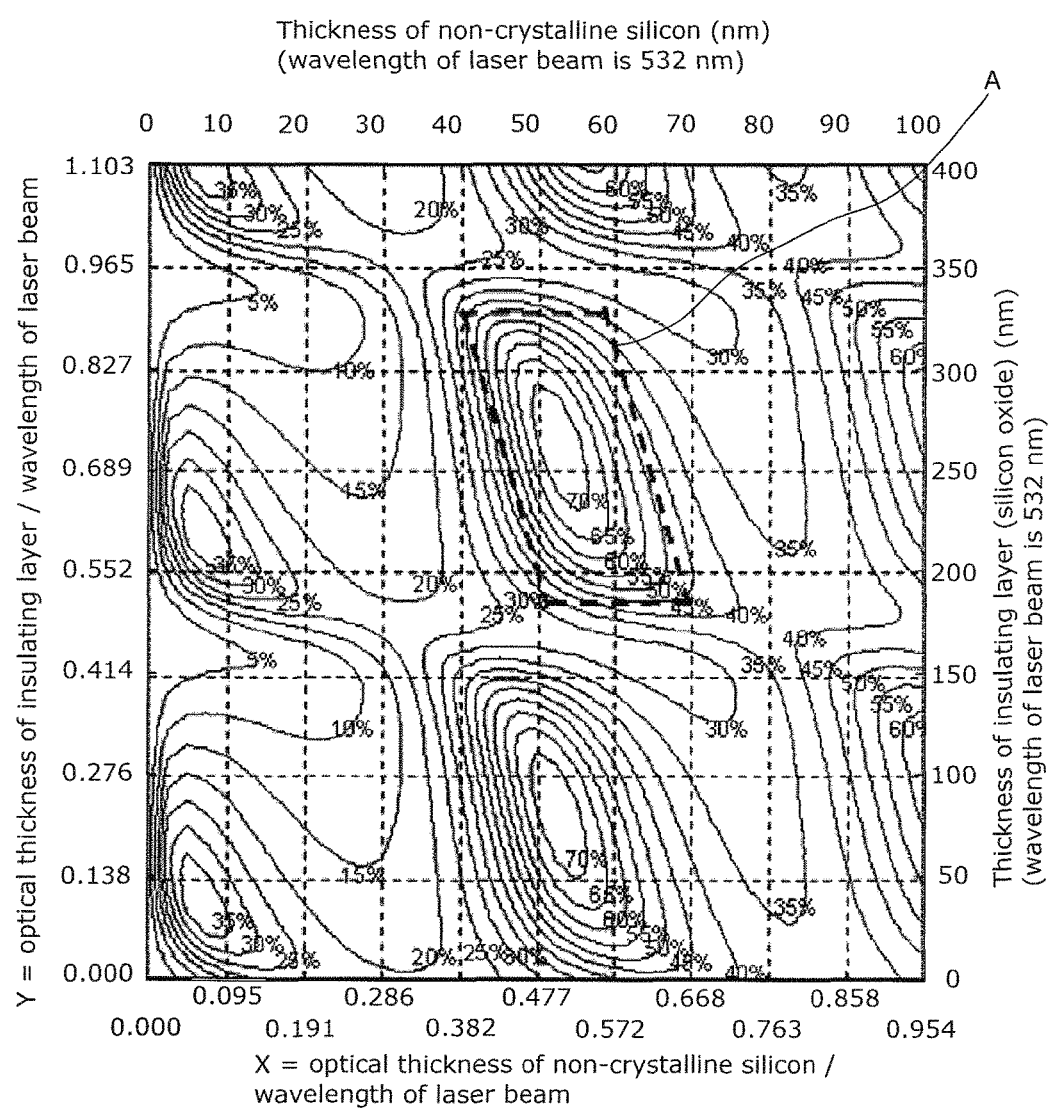
FIG. 5E is a contour diagram illustrating calculation results of the absorptance of the non-crystalline silicon layer when the thickness of the non-crystalline layer and the thickness of the gate insulating layer change, when performing laser annealing.
Figure 5F:
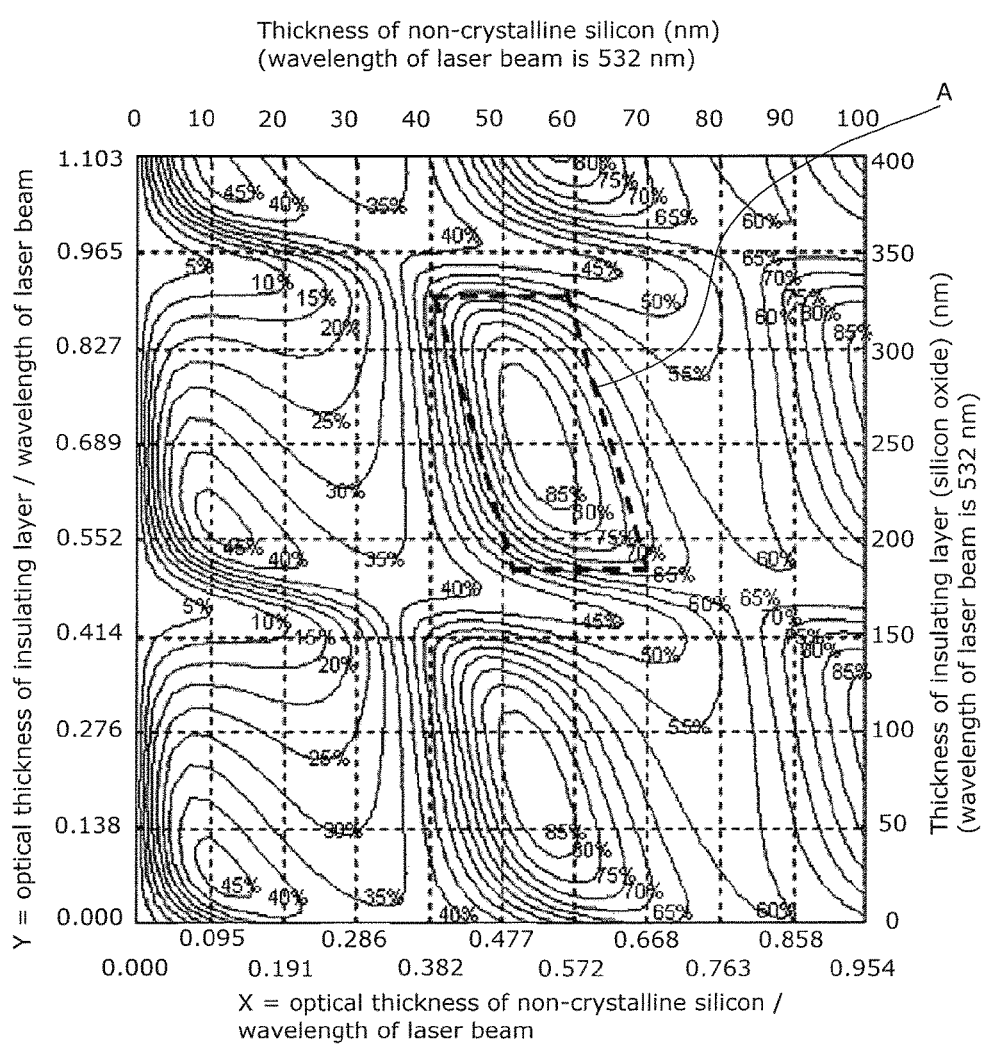
FIG. 5F is a contour diagram illustrating calculation results of the absorptance of the non-crystalline silicon layer when the thickness of the non-crystalline layer and the thickness of the gate insulating layer change, when performing laser annealing.
Figure 6A:
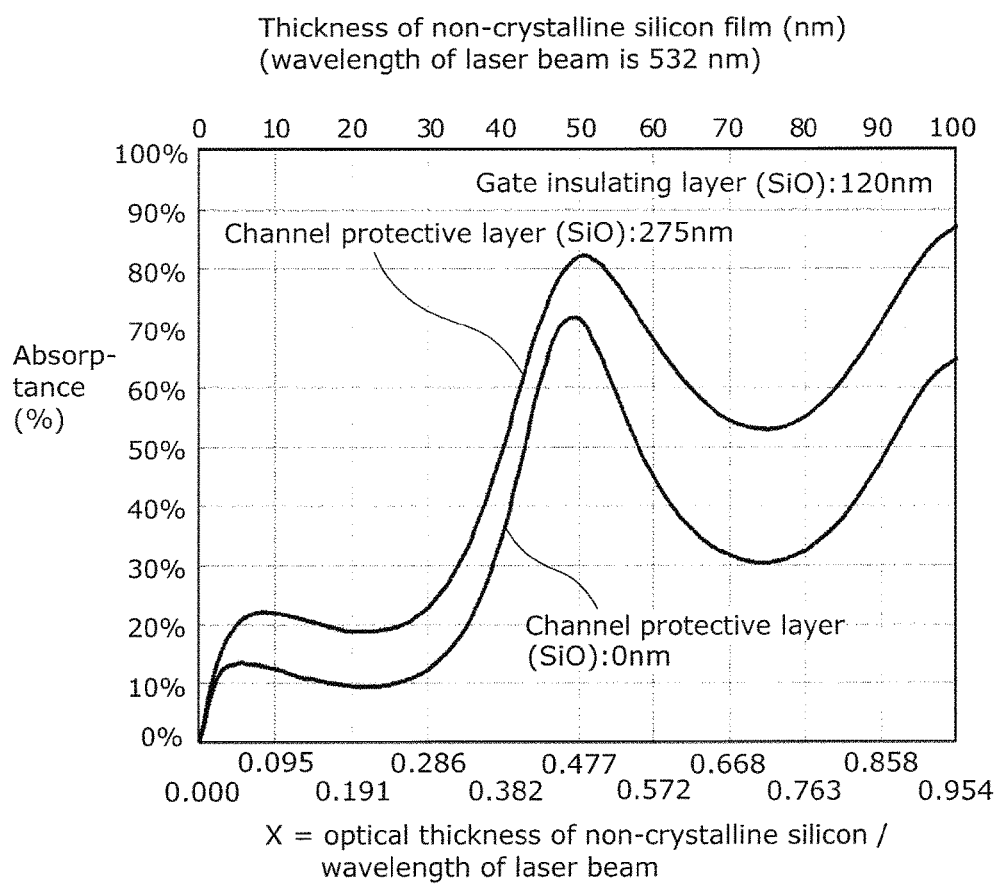
FIG. 6A illustrates change in the absorptance of the non-crystalline silicon layer when a value obtained by dividing an optical thickness of the gate insulating layer which is a value obtained by multiplying the thickness of the gate insulating layer and the refractive index of the gate insulating layer by the wavelength of the laser beam is 0.330 (corresponding to the wavelength of 532 nm and the thickness of the oxide silicon layer of 120 nm), when performing laser annealing.

In the calculation illustrated in FIG. 5A, a model in which the gate electrode 110 is made of Cu, the gate insulating layer 120 is made of silicon oxide, and the thickness of the channel protective layer 140 is 0 nm (no channel protective layer 140 is formed) is used. In the calculation illustrated in FIG. 5B, a model in which the gate electrode 110 is made of Al, the gate insulating layer 120 is made of silicon oxide, and the thickness of the channel protective layer 140 is 0 nm. In the calculation illustrated in FIG. 5C, a model in which the gate electrode 110 is made of Mo, the gate insulating layer 120 is made of silicon oxide, and the thickness of the channel protective layer 140 is 0 nm is used. In the calculation illustrated in FIG. 5D, a model in which the gate electrode 110 is made of MoW, the gate insulating layer 120 is made of silicon oxide, and the thickness of the channel protective layer 140 is 0 nm is used. In the calculation illustrated in FIG. 5E, a model in which the gate electrode 110 is made of W, the gate insulating layer 120 is made of silicon oxide, and the thickness of the channel protective layer 140 is 0 nm. In the calculation illustrated in FIG. 5F, a model in which the gate electrode 110 is made of MOW, the gate insulating layer 120 is made of silicon oxide, and the thickness of the channel protective layer 140 is 275 nm.

Note that, the values in the horizontal axes in FIG. 5A to FIG. 5F can be converted into thicknesses of the non-crystalline silicon layer 130 by using the refractive index of the non-crystalline silicon layer 130 when the wavelength is 532 nm. FIG. 6B illustrates examples in which the values in the horizontal axes of the FIG. 5A to FIG. 5F are converted into thicknesses of the non-crystalline silicon layer 130. FIG. 6B indicates values obtained by converting the values in the horizontal axes in FIG. 5A to FIG. 5F into thicknesses of the non-crystalline silicon layer 130 when the wavelength is 532 nm, 473 nm, and 569 nm.

Similarly, the values in the vertical axes in FIG. 5A to FIG. 5F can be converted into thicknesses of the gate insulating layer 120 by using the refractive index of the gate insulating layer 120 when the wavelength is 532 nm, for example. FIG. 6C illustrates examples of values obtained by converting the values in the vertical axes in FIG. 5A to FIG. 5F into thicknesses of the gate insulating layer 120 made of silicon oxide or thicknesses of the gate insulating layer 120 made of silicon nitride. FIG. 6C indicates values obtained by converting the values in the vertical axes in FIG. 5A to FIG. 5F into thicknesses of the gate insulating layer 120 when the wavelength is 532 nm, 473 nm, and 569 nm. Note that, FIG. 6C is also applicable as a chart illustrating examples of values obtained by converting the values in the horizontal axis and the vertical axis of FIG. 7 to be described layer into thickness of the channel protective layer 140 made of silicon oxide or silicon nitride, or the thickness of the gate insulating layer 120.

Based on FIG. 4 to FIG. 6C, regardless of the material for the gate electrode 110 and the thickness of the channel protective layer 140, the wavelength of the laser beam is 473 nm in the process in (g) in FIG. 2, the crystalline silicon layer 131 in the projecting part of the channel layer and the non-crystalline silicon layer 130 on both sides of the projecting part are formed by forming the projecting part such that the thickness from the bottom surface of the non-crystalline silicon layer 130 to the both sides of the projecting part of the non-crystalline silicon layer 130 is smaller, by at least 4 nm, than the thickness from the bottom surface of the non-crystalline silicon layer 130 to the upper surface of the projecting part of the non-crystalline silicon layer 130 in the process in (f) in FIG. 2. More specifically, the crystalline silicon layer 131 in the projecting part of the channel layer and the non-crystalline silicon layer 130 on both sides of the projecting part can be formed by forming the projecting part such that the thickness from the bottom surface of the non-crystalline silicon layer 130 to the upper surface on both sides of the projecting part of the non-crystalline silicon layer 130 is over 0 nm and at most 27 nm, and that the thickness from the bottom surface of the non-crystalline silicon layer 130 to the upper surface of the projecting part of the non-crystalline silicon layer 130 is at least 35 nm, in the process in (f) in FIG. 2.

Stated differently, regardless of the material for the gate electrode 110 and the thickness of the channel protective layer 140, the crystalline silicon layer 131 at the projecting part of the channel layer and the non-crystalline silicon layer 130 on both sides of the projecting part can be formed by having the wavelength of 532 nm of the laser beam in the process in (g) in FIG. 2 and forming the projecting part such that the thickness from the bottom surface of the non-crystalline silicon layer 130 to the upper surface on both sides of the projecting part of the non-crystalline silicon layer 130 is smaller, by at least 5 nm, than the thickness from the bottom surface of the non-crystalline silicon layer 130 to the upper surface of the projecting part of the non-crystalline silicon layer 130 in the process in (f) in FIG. 2. More specifically, the crystalline silicon layer 131 in the projecting part of the channel layer and the non-crystalline silicon layer 130 on both sides of the projecting part can be formed by forming the projecting part such that the thickness from the bottom surface of the non-crystalline silicon layer 130 to the upper surface on both sides of the projecting part of the non-crystalline silicon layer 130 is over 0 nm and at most 30 nm, and that the thickness from the bottom surface of the non-crystalline silicon layer 130 to the upper surface of the projecting part of the non-crystalline silicon layer 130 is at least 40 nm, in the process in (f) in FIG. 2.

Stated differently, regardless of the material for the gate electrode 110 and the thickness of the channel protective layer 140, the crystalline silicon layer 131 at the projecting part of the channel layer and the non-crystalline silicon layer 130 on both sides of the projecting part can be formed by having the wavelength of 561 nm of the laser beam in the process in (g) in FIG. 2 and forming the projecting part such that the thickness from the bottom surface of the non-crystalline silicon layer 130 to the upper surface on both sides of the projecting part of the non-crystalline silicon layer 130 is smaller, by at least 5 nm, than the thickness from the bottom surface of the non-crystalline silicon layer 130 to the upper surface of the projecting part of the non-crystalline silicon layer 130 in the process in (f) in FIG. 2. More specifically, the crystalline silicon layer 131 in the projecting part of the channel layer and the non-crystalline silicon layer 130 on both sides of the projecting part can be formed by forming the projecting part such that the thickness from the bottom surface of the non-crystalline silicon layer 130 to the upper surface on both sides of the projecting part of the non-crystalline silicon layer 130 is over 0 nm and at most 32 nm, and that the thickness from the bottom surface of the non-crystalline silicon layer 130 to the upper surface of the projecting part of the non-crystalline silicon layer 130 is at least 42 nm, in the process in (f) in FIG. 2.

In addition, as shown in FIG. 5A to FIG. 6C, if a value which is obtained by dividing, by the wavelength of the laser beam, the optical thickness of the non-crystalline silicon layer 130 calculated by multiplying the thickness from the bottom surface of the non-crystalline silicon layer 130 to the upper surface on both sides of the projecting part of the non-crystalline silicon layer and the refractive index of the non-crystalline silicon layer 130 is at most 0.286, and a value obtained by dividing, by the wavelength of the laser beam, the optical thickness of the non-crystalline silicon layer 130 calculated by multiplying the thickness from the bottom surface of the non-crystalline silicon layer 130 to the upper surface of the projecting part of the non-crystalline silicon layer 130 is at least 0.381, the difference between the absorptance of the projecting part of the non-crystalline silicon layer 130 and the part underneath for the laser beam and the absorptance of the part on both sides of the projecting part in the non-crystalline silicon layer 130 can be at least 10%, regardless of the material of the gate electrode 110 and the thickness of the channel protective layer 140. For example, the absorptance of the projecting part of the non-crystalline silicon layer 130 and the part underneath for the laser beam can be at least 30%, and the absorptance of the part on both sides of the projecting part in the non-crystalline silicon layer 130 can be at most 20%. Accordingly, the crystalline silicon layer 131 in the projecting part of the channel layer and the non-crystalline silicon layer 130 on both sides of the projecting part can be formed.

In addition, as shown in FIG. 5A to FIG. 5F, in the process illustrated in (f) in FIG. 2, regardless of the material for the gate electrode 110 and the thickness of the channel protective layer 140, the absorptance of the non-crystalline silicon layer 130 in the projecting part and the part under the projecting part for the laser beam can be set to be at least 50% including the maximum absorptance if the following conditions are satisfied: X and Y satisfy the following (Expression 1) and (Expression 2), where l and m denote integers starting from 0; X denotes a value obtained by dividing, by a wavelength of the laser beam, an optical thickness of the non-crystalline silicon layer 130 calculated by multiplying a thickness of the non-crystalline silicon layer 130 from a bottom surface to an upper surface in the projecting part and a refractive index of the non-crystalline silicon layer 130; and Y denotes a value obtained by dividing, by the wavelength of the laser beam, an optical thickness of the gate insulating layer 120 obtained by multiplying a thickness of the gate insulating layer 120 and a refractive index of the gate insulating layer 120. Note that, A in FIG. 5A to FIG. 5F illustrate ranges in which X and Y satisfy the following (Expression 1) and (Expression 2).

$$0.50m \le Y \le 0.40 + 0.50m \quad \text{(Expression 1)}$$

$$-4.00(X-0.50l)+1.92+0.50m \le Y \le -4.00(X-0.50l)+2.68+0.50m \quad \text{(Expression 2)}$$

Figure 7:
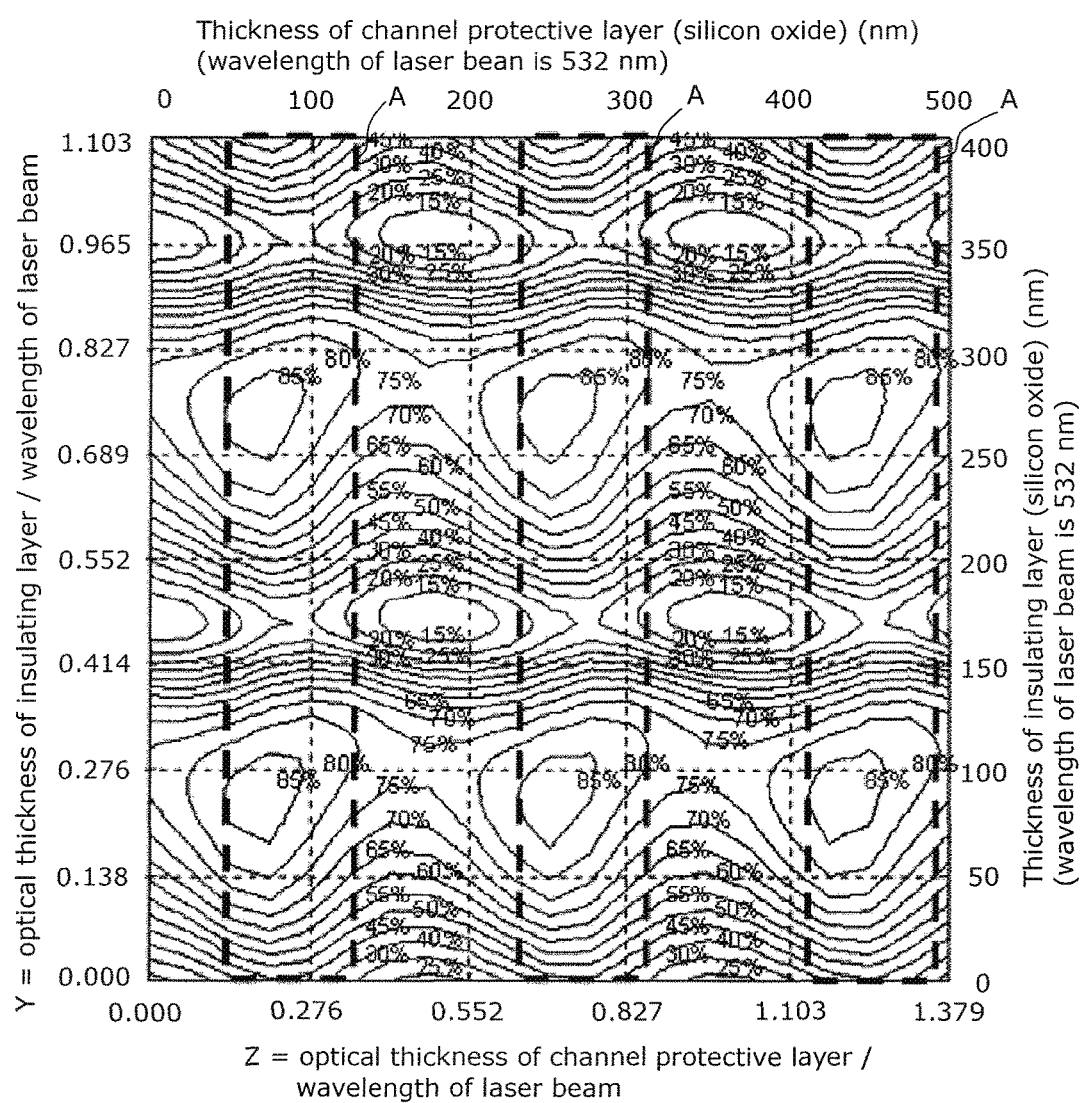
FIG. 7 is a contour diagram illustrating the calculation results of the absorptance in the projecting part of the non-crystalline silicon layer when the thickness of the channel protective layer and the thickness of the gate insulating layer change, when performing laser annealing.
Figure 8A:
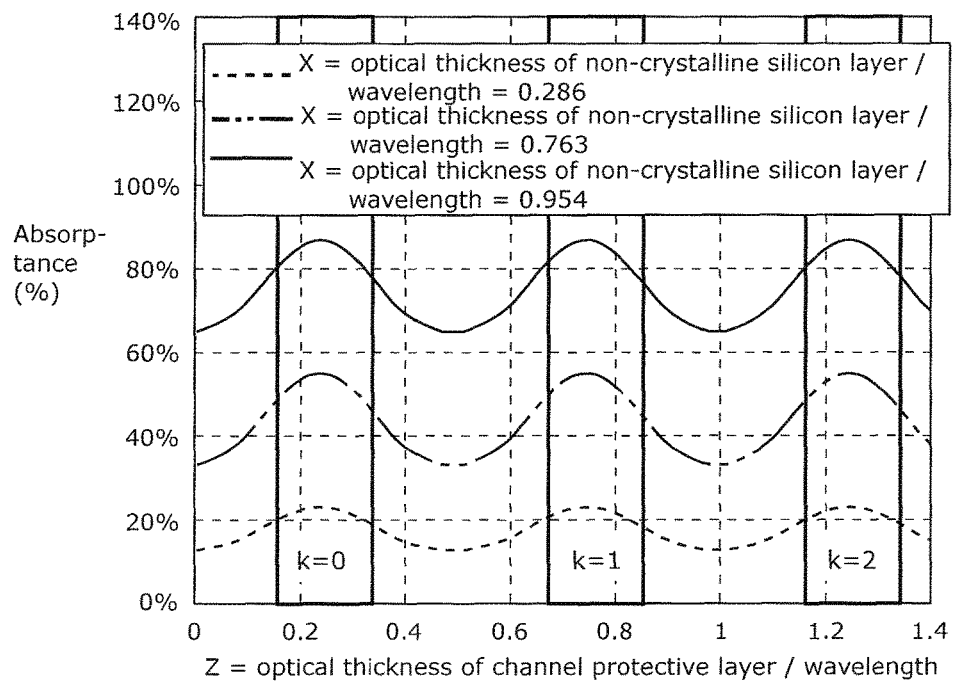
FIG. 8A illustrates changes in the absorptance in the projecting part of the non-crystalline silicon layer when the thickness of the channel protective layer changes.
Figure 8B:
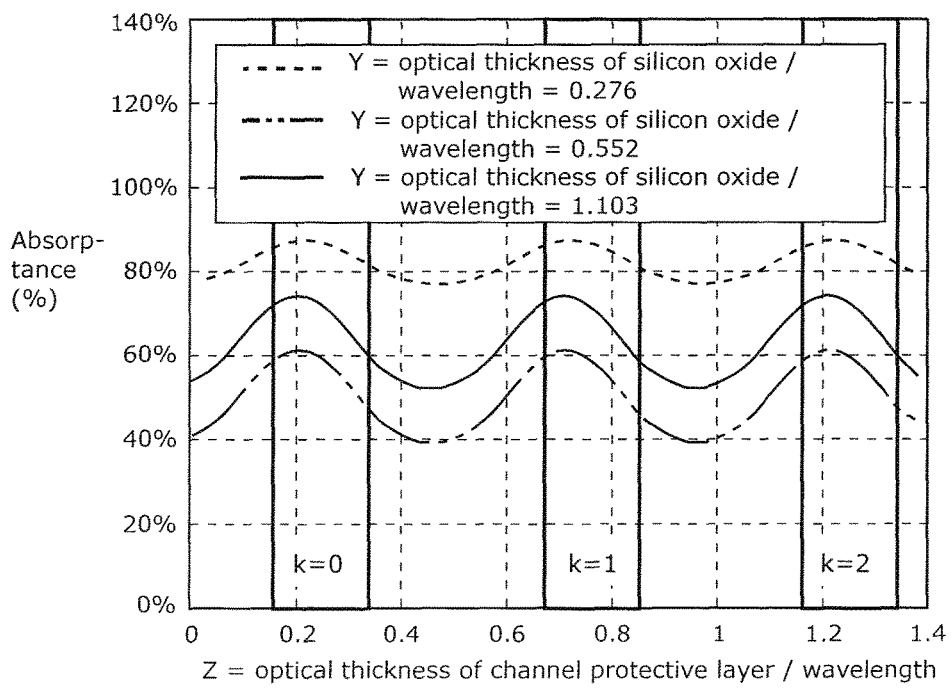
FIG. 8B illustrates changes in the absorptance in the projecting part of the non-crystalline silicon layer when the thickness of the channel protective layer changes.
Figure 8C:
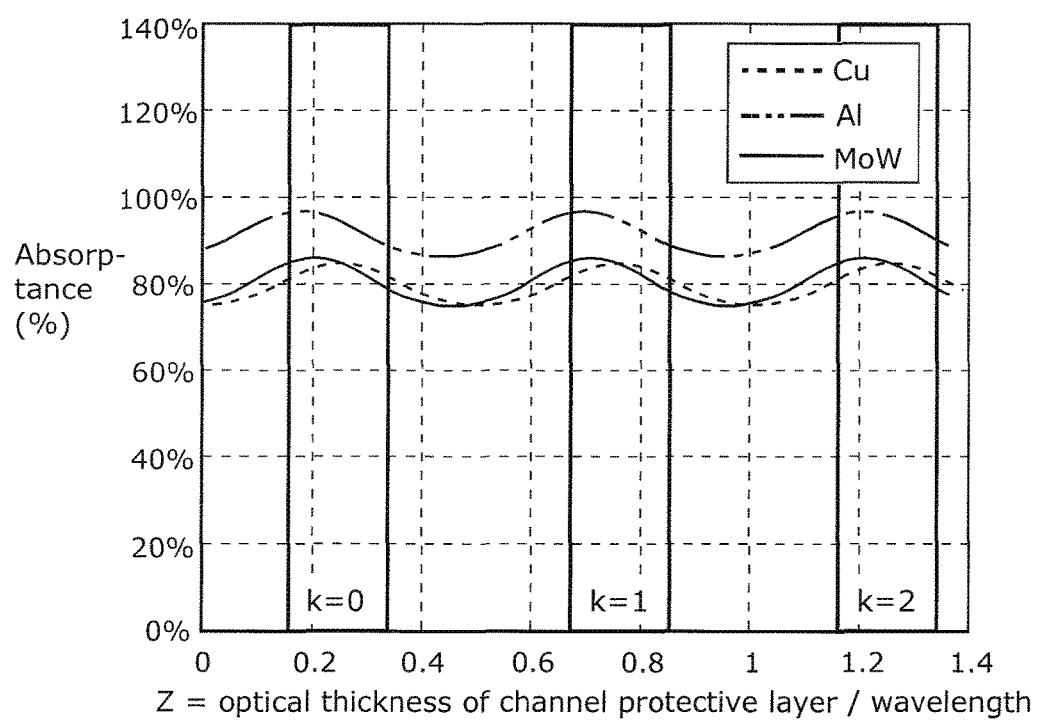
FIG. 8C illustrates changes in the absorptance in the projecting part of the non-crystalline silicon layer when the thickness of the channel protective layer changes.

FIG. 7 is a contour diagram illustrating the calculation result of the absorptance of the projecting part in the non-crystalline silicon layer 130 in the case of changing the thickness of the channel protective layer 140 and the thickness of the gate insulating layer 120 in the laser annealing in the process in (g) in FIG. 2. FIG. 8A to FIG. 8C illustrate the change in the absorptance of the projecting part in the non-crystalline silicon layer 130 in the case of changing the thickness of the channel protective layer 140.

Note that, in FIG. 7, the lower horizontal axis illustrates a value obtained by dividing the optical thickness of the channel protective layer 140 by the wavelength of the laser beam. The optical thickness of the channel protective layer 140 is calculated by multiplying the thickness of the channel protective layer 140 and the refractive index of the channel protective layer 140. The vertical axis on the left represents a value obtained by dividing the optical thickness of the gate insulating layer 120 by the wavelength of the laser beam. The optical thickness of the gate insulating layer 120 is obtained by multiplying the thickness of the gate insulating layer 120 and the refractive index of the gate insulating layer 120. The upper horizontal axis represents the thickness of the channel protective layer 140 when the wavelength of the laser beam is set to be 532 nm without standardizing the thickness of the channel protective layer 140 by the wavelength of the laser beam, and the right vertical axis represents the thickness of the gate insulating layer 120 for reference. In FIG. 8A to FIG. 8C, the horizontal axis represents a value obtained by dividing the optical thickness of the channel protective layer 140 by the wavelength of the laser beam, and the vertical axis represents the absorptance of the projecting part in the non-crystalline silicon layer 130.

Furthermore, in the calculation illustrated in FIG. 7, a model in which the gate electrode 110 is made of MoW, the gate insulating layer 120 is made of silicon oxide, a value obtained by dividing, by the wavelength of the laser beam, the optical thickness of the non-crystalline silicon layer 130 in the projecting part of the non-crystalline silicon layer 130 obtained by multiplying the thickness of the projecting part in the non-crystalline silicon layer 130 and the refractive index of the non-crystalline silicon layer 130 is 0.477 (corresponding to the thickness of 50 nm of the non-crystalline silicon layer when the wavelength is 532 nm), and the channel protective layer 140 is made of silicon oxide is used.

In the calculation illustrated in FIG. 8A, a model in which the gate electrode 110 is made of MoW, the value obtained by dividing, by the wavelength of the laser beam, the optical thickness of the gate insulating layer 120 obtained by multiplying the thickness of the gate insulating layer 120 and the refractive index of the gate insulating layer 120 is 0.331 (corresponding to the thickness of the silicon oxide layer of 120 nm when the wavelength is 532 nm), and the channel protective layer 140 is made of silicon oxide.

The broken line, the chain double-dashed line, and the solid line in FIG. 8A represent calculation results when a value obtained by dividing, by the wavelength of the laser beam, the optical thickness of the non-crystalline silicon layer 130 obtained by multiplying the thickness of the projecting part in the non-crystalline silicon layer 130 and the refractive index of the non-crystalline silicon layer 130 is 0.286 (corresponds to the thickness of 30 nm of the non-crystalline silicon layer when the wavelength is 532 nm), 0.763 (corresponds to the thickness of 80 nm of non-crystalline silicon layer when the wavelength is 532 nm), and 0.954 (corresponds to the thickness of 100 nm of non-crystalline layer when the wavelength is 532 nm), respectively.

Furthermore, in the calculation illustrated in FIG. 8B, a model in which the gate electrode 110 is made of MoW, the gate insulating layer 120 is made of silicon oxide, a value obtained by dividing, by the wavelength of the laser beam, the optical thickness of the non-crystalline silicon layer 130 in the projecting part of the non-crystalline silicon layer 130 obtained by multiplying the thickness of the projecting part in the non-crystalline silicon layer 130 and the refractive index of the non-crystalline silicon layer 130 is 0.477 (the wavelength of 532 nm corresponds to the thickness of 50 nm of the non-crystalline silicon layer), and the channel protective layer 140 is made of silicon oxide.

The broken line, the chain double-dashed line, and the solid line in FIG. 8B represent calculation results when a value obtained by dividing, by the wavelength of the laser beam, the optical thickness of the gate insulating layer 120 obtained by multiplying the thickness of the gate insulating layer 120 and the refractive index of the gate insulting layer 120 is 0.276 (corresponds to the thickness of 100 nm of the silicon oxide layer when the wavelength is 532 nm), 0.552 (corresponds to the thickness of 200 nm of the silicon oxide layer when the wavelength is 532 nm), and 1.103 (corresponds to the thickness of 400 nm of silicon oxide layer when the wavelength is 532 nm).

Furthermore, in the calculation illustrated in FIG. 8C, a model in which the gate insulating layer 120 is made of silicon oxide, a value obtained by dividing, by the wavelength of the laser beam, the optical thickness of the non-crystalline silicon layer 130 in the projecting part obtained by multiplying the thickness of the projecting part in the non-crystalline silicon layer 130 and the refractive index of the non-crystalline silicon layer 130 is 0.477 (corresponds to the thickness of 50 nm of the non-crystalline silicon layer when the wavelength is 532 nm), and the channel protective layer 140 is made of silicon oxide. The broken line, the chain double-dashed line, and the solid line in FIG. 8C represent calculation results when the gate electrode 110 is made of Cu, Al, and MoW, respectively.

FIG. 7 to FIG. 8C show that where Z denotes a value obtained by dividing the optical thickness of the channel protective layer 140 by the wavelength of the laser beam, k denotes an integer starting from 0, and Z satisfies the following (Expression 3) in the process in (f) in FIG. 2, it is possible to increase the efficiency in the absorption of the laser beam in the projecting part in the non-crystalline silicon layer 130 and the part underneath. Note that, A in FIG. 7 represent areas in which Z satisfies the following (Expression 3). In addition, k=0, 1, and 2 in FIG. 8A to FIG. 8C represent ranges of Z when k=0, 1, and 2 in (Expression 3), respectively.

$$0.5 \times (k+0.3) \leq Z \leq 0.5 \times (k+0.7) \quad \text{(Expression 3)}$$

According to the thin-film transistor according to the embodiment 1, the projecting part of the channel layer is formed as the crystalline silicon layer 131, and the parts on both sides of the projecting part is formed as the non-crystalline silicon layer 130. Accordingly, it is possible to balance excellent on-characteristics and excellent off-characteristics.

Furthermore, even when the source electrode 171 and the drain electrode 172 are provided unevenly with respect to the channel protective layer 140 underneath, the distance from the crystalline silicon layer 131 to the source electrode 171 in the channel path and the distance from the crystalline silicon layer 131 to the drain electrode 172 in the channel path are equal. Accordingly, the electronic characteristics may be symmetric when the source electrode and the drain electrode are switched.

Second Embodiment

Next, the thin-film transistor according to the embodiment 2 shall be described below.

Figure 9:
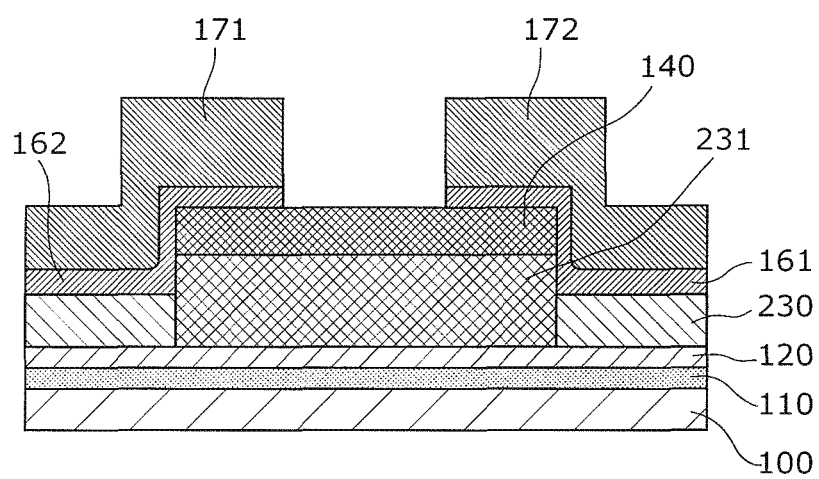
FIG. 9 is a cross-sectional view schematically illustrating the configuration of a thin-film transistor according to the embodiment 2.

FIG. 9 is a cross-sectional view schematically illustrating the configuration of a thin-film transistor according to the embodiment 2.

The thin-film transistor according to the embodiment 2 is different from the thin-film transistor according to the embodiment 1 in that the non-crystalline silicon layer 130 is replaced with the second crystalline silicon layer 230 and the crystalline silicon layer 131 is replaced with the first crystalline silicon layer 231. The following description focuses on the difference from the embodiment 1.

The thin-film transistor includes: a substrate 100, a gate electrode 110 formed on the substrate 100, a gate insulating layer 120 formed on the gate electrode 110, a first crystalline silicon layer 231 formed on the gate insulating layer 120 above the gate electrode 110, a second crystalline silicon layer 230 formed on the gate insulating layer 120 on both sides of the first crystalline silicon layer 231 having a thickness smaller than the first crystalline silicon layer 231, a channel protective layer 140 formed on the first crystalline silicon layer 231, the source electrode 171 and the drain electrode 172 along at least the side surface of the first crystalline silicon layer 231 and the upper surface of the second crystalline silicon layer 230, the source electrode 171 being above one portion of the second crystalline silicon layer 230, and the drain electrode 172 being above the other portion of the second crystalline silicon layer 230, in which an average grain size of crystals in the first crystalline silicon layer 231 is larger than an average grain size of crystals in the second crystalline silicon layer 230. Furthermore, a contact layer 162 formed between the second crystalline silicon layer 230 and the source electrode 171, and a contact layer 161 formed between the second crystalline silicon layer 230 and the drain electrode 172 are included.

Next, the thin-film transistor in FIG. 9 shall be described in detail.

The first crystalline silicon layer 231 and the second crystalline silicon layer 230 are semiconductor layers formed on the gate insulating layer 120, and compose a channel layer in which the carrier movement is controlled by the voltage at the gate electrode 110. The first crystalline silicon layer 231 and the second crystalline silicon layer 230 are made of crystalline silicon layers, and are formed by crystallizing the amorphous silicon in the non-crystalline silicon layer into polycrystals (including micro-crystals) by laser irradiation. The first crystalline silicon semiconductor layer 231 and the second crystalline silicon layer 230 may be formed as a silicon layer including a mixed crystal structure of amorphous silicon and crystalline silicon.

Note that, an average grain size of crystals included in the first crystalline silicon layer 231 is in a range from 40 nm to 1 μm, and an average grain size of crystals included in the second crystalline silicon layer 230 is in at least 10 nm and smaller than 40 nm.

The channel layer has a projecting part and a flat part on the surface. In the channel layer, a thickness from the bottom surface of the channel layer (the bottom surfaces of the first crystalline silicon layer 231 and the second crystalline silicon layer 230) to the surface of the flat part (the upper surface of the second crystalline silicon layer 230) (the thickness of the flat part) is smaller than a thickness from the bottom surface of the channel layer to the upper surface of the projecting part (the upper surface of the first crystalline silicon layer 231) (the thickness of the projecting part). Furthermore, the projecting part of the channel layer is located above the gate electrode 110, and the ends of the projecting part are located inside the ends of the gate electrode 110.

The side surfaces of the channel protective layer 140 and the side surfaces of the first crystalline silicon layer 231 (side surfaces of the projecting part of the channel layer) are coplanar with each other.

Figure 10:
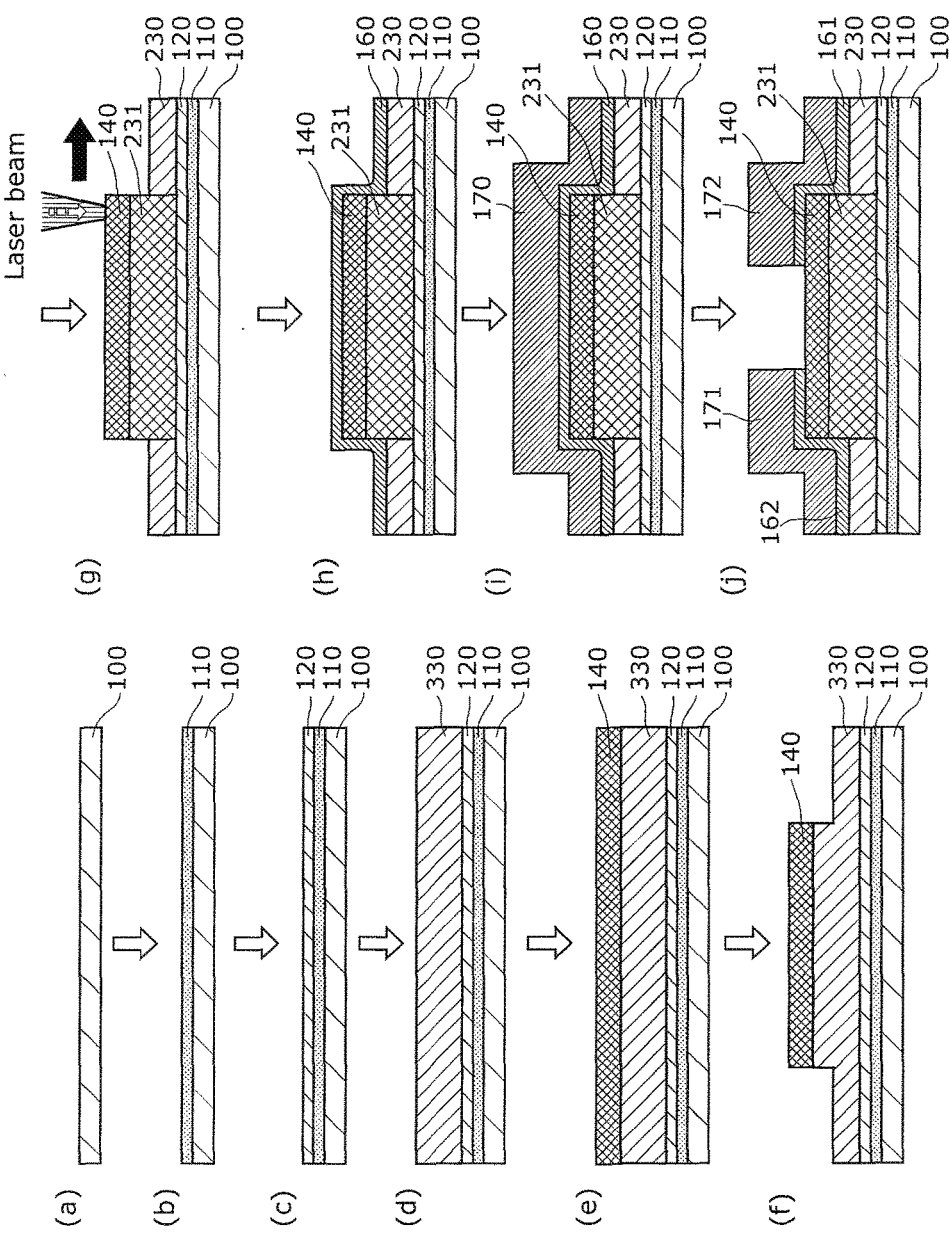
FIG. 10, illustrating process (a) to (j), is a cross-sectional view schematically illustrating processes in a method for fabricating a thin-film transistor according to the embodiment 2.

The following shall describe the method for fabricating the thin-film transistor according to the embodiment with reference to FIG. 10. FIG. 10 is a cross-sectional view schematically illustrating processes in the method for fabricating the thin-film transistor according to the embodiment 2.

The method for fabricating the thin-film transistor includes: preparing the substrate 100; forming the gate electrode 110 above the substrate 100; forming the gate insulating layer 120 above the gate electrode 110; forming the non-crystalline silicon layer 330 above the gate insulating layer 120; forming the channel protective layer 140 above the non-crystalline silicon layer 330; forming a projecting part by processing the non-crystalline silicon layer 330 and the channel protective layer 140, the projecting part having an upper layer composed of the channel protective layer 140 and the lower layer composed of the non-crystalline silicon layer 330; irradiating, with a laser beam, the projecting part, a portion under the projecting part, and portions on both sides of the projecting part which are the non-crystalline silicon layer 330, the non-crystalline silicon layer 330 in the projecting part and the portion under the projecting part being crystallized into the first crystalline silicon layer 231, and the portions on both sides of the projecting part being crystallized into the second crystalline silicon layer 230; forming the contact layer between (i) at least a side surface of the first crystalline silicon layer 231 and an upper surface of the second crystalline silicon layer 230 and (ii) at least one of the source electrode 171 and the drain electrode 171, the contact layer comprising crystalline silicon doped with impurity or polysilicon doped with impurity; and forming the source electrode 171 and the drain electrode 171 along at least the side surface of the first crystalline silicon layer 231 and the upper surface of the second crystalline silicon layer 230 and with the contact layer in between, the source electrode 171 being formed above one portion of the second crystalline silicon layer 230, and the drain electrode 171 being formed above the other portion of the second crystalline silicon layer 230, in which when irradiating the non-crystalline silicon layer 330 with the laser beam, absorptance of the non-crystalline silicon layer 330 for the laser beam is greater in the projecting part and the portion under the projecting part of the non-crystalline silicon layer 330 than in the portions on both sides of the projecting part of the non-crystalline silicon layer 330, and the first crystalline silicon layer 231 formed has crystals having an average grain size larger than an average size of crystals in the second crystalline silicon layer 230.

Next, the method for fabricating the thin-film transistor illustrated in FIG. 10 shall be described in detail.

First, as illustrated in (a) in FIG. 10, a glass substrate is prepared as the substrate 100.

Next, as illustrated in (b) in FIG. 10, the gate electrode 110 having the predetermined shape is formed on the substrate 100.

Next, as illustrated in (c) in FIG. 10, the gate insulating layer 120 is formed on the substrate 100 and the gate electrode 110 so as to cover the gate electrode 110.

Next, as illustrated in (d) in FIG. 10, the non-crystalline silicon layer 330 made of non-crystalline silicon is continuously formed on the gate insulating layer 120 to the forming of the gate insulating layer 120 by the plasma CVD and others. Note that, the non-crystalline silicon layer 330 is composed of the same material as the non-crystalline silicon layer 130.

Next, as illustrated in (e) in FIG. 10, the channel protective layer 140 is formed on the non-crystalline silicon layer 330.

Next, as illustrated in (f) in FIG. 10, part of the non-crystalline silicon layer 330 and the channel protective layer 140 are continuously removed by etching. With this, the projecting part of the non-crystalline silicon layer 330 is formed by self-alignment, and the projecting part of the non-crystalline silicon layer 330 is formed such that the side surface of the lower non-crystalline silicon layer 330 and the side surface of the channel protective layer 140 are coplanar with each other.

Next, as illustrated in (g) in FIG. 10, the non-crystalline silicon layer 330 is crystallized into the first crystalline silicon layer 231 and the second crystalline silicon layer 230 by the laser annealing. More specifically, the first crystalline silicon layer 231 and the second crystalline silicon layer 230 are formed by crystallizing the non-crystalline silicon layer 330 using the predetermined laser beam by moving the laser beam unidirectionally relative to the substrate 100. More specifically, first, the dehydrogenation is performed on the non-crystalline silicon layer 330 formed. Subsequently, the first crystalline silicon layer 231 and the second crystalline silicon layer 230 are formed by changing the non-crystalline silicon layer 330 to have polycrystalline structure (including microcrystals) by the laser annealing.

Here, the laser beam scans the flat part on one side, the projecting part, and the other flat part of the non-crystalline silicon layer 330 sequentially. However, the thickness of the flat part is smaller than the thickness of the projecting part. Accordingly, the absorptance of the flat part for the laser beam is low. Accordingly, in the non-crystalline silicon layer 330, the first crystalline silicon layer 231 having a large average grain size of crystals is formed in the projecting part and the part underneath. However, the second crystalline silicon layer 230 having a small average grain size of crystals is formed in the flat part on both sides of the projecting part.

Furthermore, the source of the laser beam is a laser having a wavelength in the visible light range. The laser having a wavelength in the visible light range is a laser having a wavelength in a range approximately from 380 nm to 780 nm, and more preferably, is a green laser having a wavelength in a range from 473 nm to 561 nm. It is preferable that the laser beam having the wavelength in the visible light range is a laser beam in the continuous wave mode or the pseudo continuous wave mode. This is because, when the laser beam having the wavelength in the visible light range is in the pulse oscillation mode which is other than the continuous wave mode or the pseudo continuous wave mode, the non-crystalline silicon layer 330 is discontinuously irradiated with the laser beam. Consequently, the non-crystalline silicon layer 330 cannot be kept in the melting state constantly. The pseudo-continuous wave mode is included because the melting state can be maintained by reheating the non-crystalline silicon layer 330 by applying pulses before the non-crystalline silicon layer 330 is cooled to a temperature lower than its melting point. Accordingly, an aspect of the pseudo continuous mode allows reheating the non-crystalline silicon layer 330 before the non-crystalline silicon layer 330 is cooled to a temperature lower than the melting point, and maintaining the melting state. The laser beam having a wavelength in the visible light range may be a beam emitted from the solid-state laser device, or may be a beam emitted from a laser device using a semiconductor laser device. Either way is preferable because the laser beam can be controlled highly accurately. Furthermore, the laser beam having a wavelength in the visible light range preferably has the change of less than 5% in the emitted energy on the non-crystalline silicon layer 330 when the non-crystalline silicon layer 330 is irradiated with the laser beam for forming a crystalline silicon layer without unevenness in crystals. By forming the first crystalline silicon layer 231 and the second crystalline silicon layer 230 without unevenness in crystals, it is possible to achieve the initial design characteristics of the thin-film transistor and uniform characteristics.

Furthermore, in the process in (f) in FIG. 10, it is preferable to form the projecting part such that the thickness from the bottom surface of the non-crystalline silicon layer 330 to the upper surface of the non-crystalline silicon layer 330 is at most 100 nm. With this, the laser beam does not attenuate before reaching the part immediately above the gate insulating layer 120.

Furthermore, in the process in (f) in FIG. 10, it is preferable that the projecting part is formed such that the thickness from the bottom surface of the non-crystalline silicon layer 330 to the upper surface of the parts on both sides of the projecting part is at least 10 nm. With this, it is possible to reduce the probability that the non-crystalline silicon layer 330 transmits the laser beam, damaging the gate electrode 110.

Furthermore, in the process in (c) in FIG. 10, it is preferable that the gate insulating layer 120 is formed as a film composed of silicon oxide, silicon nitride, or others having an extinction coefficient of at most 0.01 with respect to the wavelength of the laser beam in (g) in FIG. 10. With this, it is possible to reduce the probability that the laser beam is absorbed by the gate insulating layer 120.

Furthermore, in the process in (e) in FIG. 10, it is preferable that the channel protective layer 140 is formed as a film composed of silicon oxide, silicon nitride, or others having an extinction coefficient of at most 0.01 with respect to the wavelength of the laser beam in (g) in FIG. 10. With this, it is possible to reduce the probability that the laser beam is absorbed by the channel protective layer 140.

The non-crystalline silicon layer 330 is irradiated with a laser beam collected into linear form. There are two exemplary methods of irradiation as described above.

Next, as illustrated in (h) in FIG. 10, the contact layer 160 to be the contact layers 161 and 162 is formed from the upper surface of the channel protective layer 140 to the flat part of the second crystalline silicon layer 230. More specifically, the contact layer 160 is formed so as to cover the upper surface and side surfaces of the channel protective layer 140, side surfaces of the first crystalline silicon layer 231 and on the upper surface of the flat part of the second crystalline silicon layer 230.

Next, as illustrated in (i) in FIG. 10, the source/drain metal film 170 to be the source electrode 171 and the drain electrode 172 is formed so as to cover the contact layer 160.

Subsequently, as illustrated in (j) in FIG. 10, using the photolithography and the etching, the source electrode 171 and the drain electrode 172 and the corresponding contact layers 161 and 162 are formed, respectively.

Based on FIG. 4A to FIG. 6C, regardless of the material for the gate electrode 110 and the thickness of the channel protective layer 140, the wavelength of the laser beam is 473 nm in the process in (g) in FIG. 10, and the first crystalline silicon layer 231 in the projecting part of the channel layer and the second crystalline silicon layer 230 on both sides of the projecting part are formed by forming a projecting part such that the thickness from the bottom surface of the non-crystalline silicon layer 330 to the both sides of the projecting part of the second crystalline silicon layer 230 is smaller, by at least 13 nm, than the thickness from the bottom surface of the second crystalline silicon layer 230 to the upper surface of the projecting part of the second crystalline silicon layer 230 in the process in (f) in FIG. 10.

Stated differently, regardless of the material for the gate electrode 110 and the thickness of the channel protective layer 140, the first crystalline silicon layer 231 at the projecting part of the channel layer and the second crystalline silicon layer 230 on both sides of the projecting part can be formed by having the wavelength of 532 nm of the laser beam in the process in (g) in FIG. 10 and forming the projecting part such that the thickness from the bottom surface of the non-crystalline silicon layer 330 to the upper surface on both sides of the projecting part of the non-crystalline silicon layer 330 is smaller, by at least 15 nm, than the thickness from the bottom surface of the non-crystalline silicon layer 330 to the upper surface of the projecting part of the non-crystalline silicon layer 330 in the process in (f) in FIG. 10.

Stated differently, regardless of the material for the gate electrode 110 and the thickness of the channel protective layer 140, the first crystalline silicon layer 231 at the projecting part of the channel layer and the second crystalline silicon layer 230 on both sides of the projecting part can be formed by having the wavelength of 561 nm of the laser beam in the process in (g) in FIG. 10 and forming the projecting part such that the thickness from the bottom surface of the non-crystalline silicon layer 330 to the upper surface on both sides of the projecting part of the non-crystalline silicon layer 330 is smaller, by at least 16 nm, than the thickness from the bottom surface of the non-crystalline silicon layer 330 to the upper surface of the projecting part of the non-crystalline silicon layer 330 in the process in (f) in FIG. 10.

FIG. 4A shows that, even when the scanning speed is a constant speed, in the process in (f) in FIG. 10, silicon layers having different average grain sizes of crystals are formed by one laser scanning, forming the first crystalline silicon layer 231 in the projecting part of the channel layer and the second crystalline silicon layer 230 on both sides of the projecting part by setting a difference between the absorptance of the projecting part of the non-crystalline silicon layer 330 and the part under the projecting part for the laser beam and the absorptance of the projecting part of the non-crystalline silicon layer 330 and the part on both sides of the non-crystalline silicon layer 330 to be at least 3%.

As described above, according to the thin-film transistor according to the embodiment 2, the projecting part of the channel layer is formed of the first crystalline silicon layer 231 having a large average grain size of crystals, and the parts on both sides of the projecting parts are formed of the second crystalline silicon layer 230 having a small average grain size of crystals. Accordingly, it is possible to balance excellent on-characteristics and excellent off-characteristics.

Furthermore, even when the source electrode 171 and the drain electrode 172 are provided unevenly with respect to the channel protective layer 140 underneath, the distance from the first crystalline silicon layer 231 to the source electrode 171 in the channel path and the distance from the first crystalline silicon layer 231 to the drain electrode 172 in the channel path are equal. The electrical characteristics can be symmetric to the switching of the source electrode and the drain electrode.

(Variation)

Next, the variations of the thin-film transistor according to the embodiments 1 and 2 shall be described below. Note that, in the following description, a variation of the thin-film transistor according to the embodiment 1 shall be described. However, needless to say, the variation is applicable to the thin-film transistor according to the embodiment 2.

Figure 11:
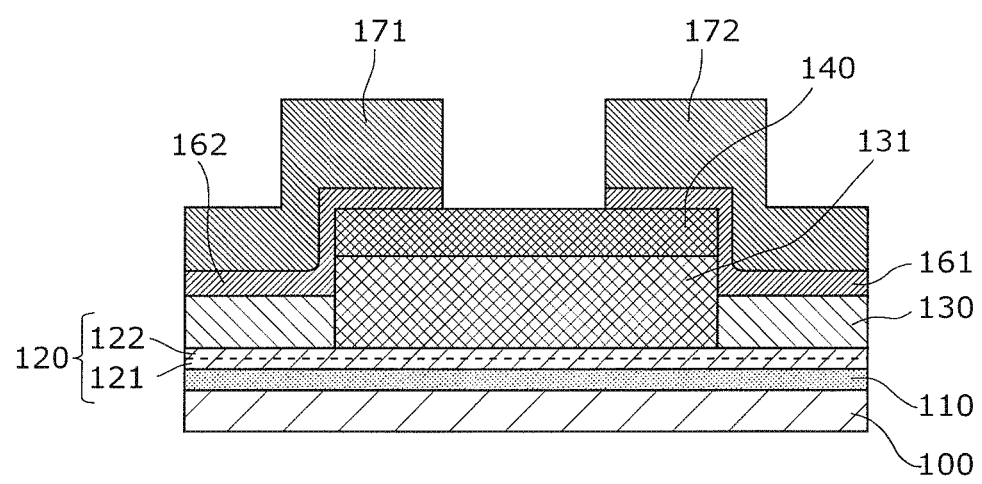
FIG. 11 is a cross-sectional view schematically illustrating the configuration of a thin-film transistor according to a variation of the embodiment 1 and the embodiment 2.

FIG. 11 is a cross-sectional view schematically illustrating the configuration of the thin-film transistor according to the variation.

The thin-film transistor is different from the embodiments 1 and 2 in that the gate insulating layer 120 has a two-layered structure including the silicon nitride layer 121 and the silicon oxide layer 122 formed on the silicon nitride layer 121. The following description focuses on the difference from the embodiments 1 and 2.

The thin-film transistor includes the substrate 100, the gate electrode 110, the gate insulating layer 120, the crystalline silicon layer 131, the non-crystalline silicon layer 130, the channel protective layer 140, the source electrode 171, the drain electrode 172, and the contact layers 162 and 161.

The gate insulating layer 120 has a thickness which allows the capacitance in the capacitor in series composed of the silicon nitride layer 121 and the silicon oxide layer 122 and the capacitance of the single-layer silicon oxide layer 122 having a thickness in a range from 100 nm to 140 nm.

The method for fabricating the thin-film transistor according to the variation is identical to the fabrication method illustrated in FIG. 2. However, the fabrication method according to the variation is different from the method in FIG. 2 in that, in the process in (c) in FIG. 2, the gate insulating layer 120 is composed of the silicon nitride layer 121 and the silicon oxide layer 122 formed on the silicon nitride layer 121. Having the two-layer structure of the gate insulating layer 120, the gate insulating layer 120 is likely to reflect the laser beam in the laser annealing in (g) in FIG. 2. Accordingly, it is possible to increase the absorptance of the non-crystalline silicon layer 130 for the laser beam.

Figure 12:
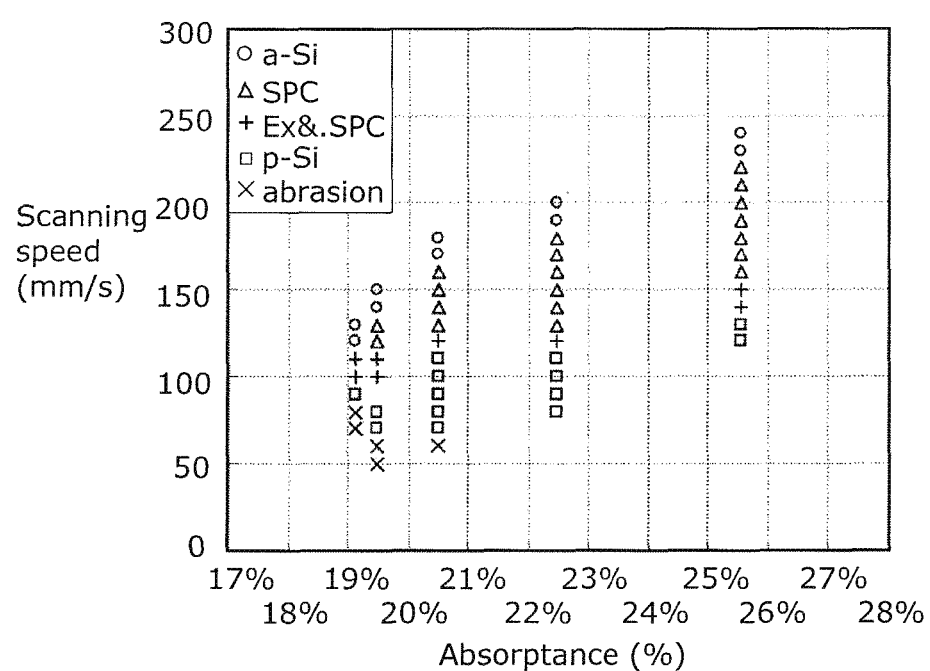
FIG. 12 illustrates the change in the crystallinity in the crystalline silicon layer when the absorptance of the non-crystalline silicon layer for the laser beam and the scanning speed of the laser beam change in the laser annealing.

The following shall describe the characteristics of the thin-film transistor according to the variation with reference to FIG. 12 to FIG. 13D.

FIG. 12 illustrates the change in the crystallinity of the crystalline silicon layer 131 when the absorptance of the non-crystalline layer 130 for the laser beam and the scanning speed of the laser beam change in the process in (g) in FIG. 2 according to the variation.

Note that, changing the absorptance of the non-crystalline silicon layer 130 is achieved by changing the thickness of the non-crystalline silicon layer 130, that is, the thickness of the channel layer.

In addition, in the measurement in FIG. 12, the sample in which the laser output is 40 kW/cm$^2$, the gate electrode 110 is made of MoW having the thickness of 50 nm, the gate insulating layer 120 is made of the silicon nitride layer 121 having the thickness of 65 nm and the silicon oxide layer 122 having the thickness of 85 nm.

Furthermore, in FIG. 12, "a-Si" indicates that the crystalline silicon layer 131 is not crystallized to crystalline silicon but remains as non-crystalline silicon. "SPC" indicates that the average grain size of the crystals in the crystalline silicon layer 131 is in a range approximately from 25 nm to 35 nm. "Ex&.SPC" indicates that the average grain size of the crystalline silicon layer 131 is approximately at least 40 nm to smaller than 60 nm. "p-Si" indicates that the average grain size of the crystalline silicon layer 131 is in a range approximately from 60 nm to 1 μm. "abrasion" indicates that the crystalline silicon layer 131 does not function as the channel layer.

As illustrated in FIG. 12, the non-crystalline silicon layer and the crystalline silicon layer are formed by changing the scanning speed of the laser annealing and the absorptance of the non-crystalline silicon layer 130. Even when the scanning speed is a constant speed, the non-crystalline silicon layer 130 in the flat part of the channel layer and the crystalline silicon layer 131 in the projecting part are formed by setting a difference between the absorptance of the projecting part of the non-crystalline silicon layer 130 and the flat part to be at least 1%. When the variation is applied to the thin-film transistor according to the embodiment 2, by setting the difference of 3% or greater between the absorptance of the projecting part of the non-crystalline silicon layer 330 and the absorptance of the flat part, it is possible to form the first crystalline silicon layer 231 in the projecting part of the channel layer and the second crystalline silicon layer 230 on both sides of the projecting part.

Figure 13A:
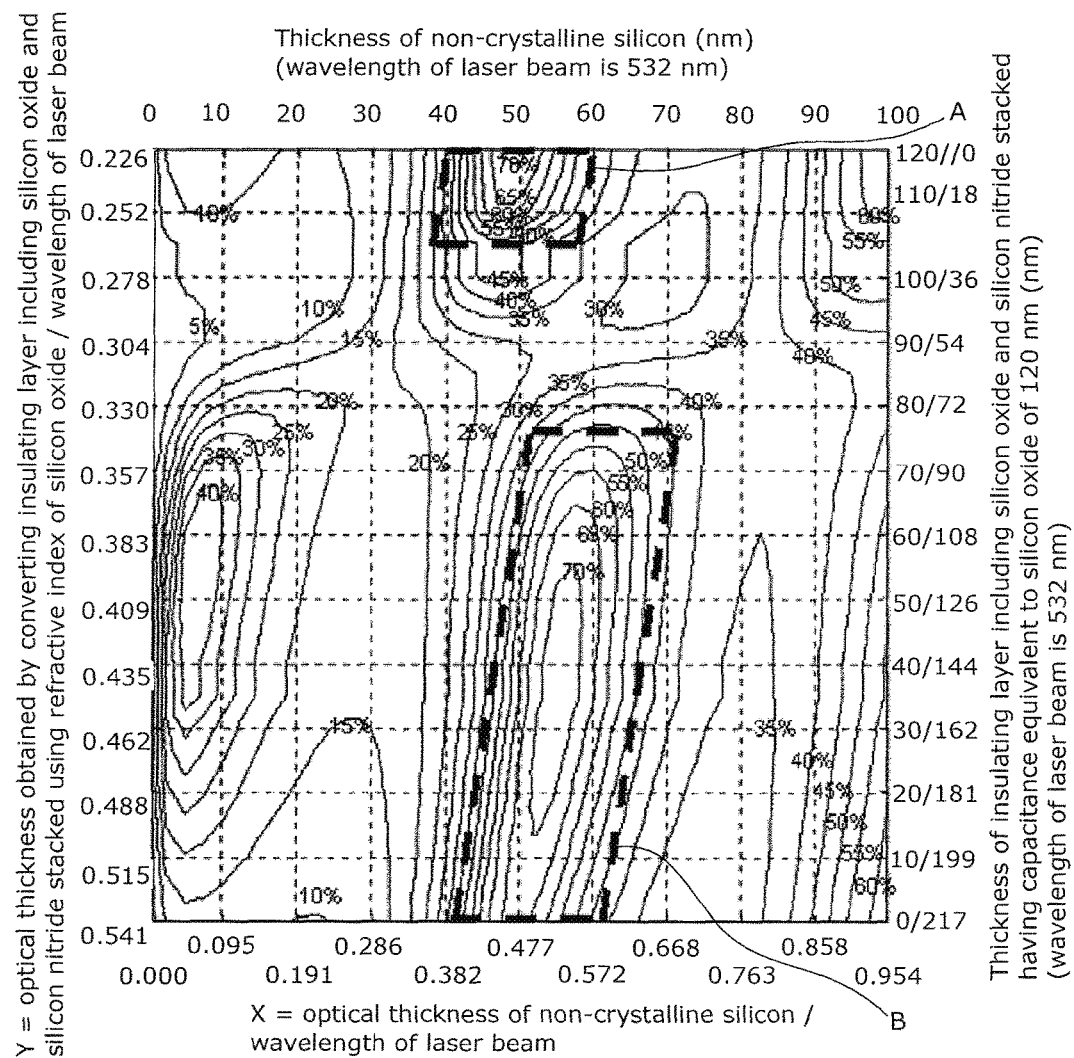
FIG. 13A is a contour diagram illustrating calculation results of the absorptance of the non-crystalline silicon layer when the thickness of the non-crystalline layer and the thickness of the gate insulating layer change in the laser annealing.

FIG. 13A is a contour diagram illustrating the results of the calculation of the absorptance of the non-crystalline silicon layer 130 when the thickness of the non-crystalline silicon layer 130 and the thickness of the gate insulating layer 120 change in the process in (g) in FIG. 2 in the variation.

Note that, in FIG. 13A, the lower horizontal axis represents a value obtained by dividing, by the wavelength of the laser beam, the optical thickness of the non-crystalline silicon layer 130, that is, a value obtained by multiplying the thickness of the non-crystalline silicon layer 130 and the refractive index of the non-crystalline silicon layer 130. The vertical axis on the left represents a value obtained by dividing the optical thickness of the gate insulating layer 120 including the silicon nitride layer 121 and the silicon oxide layer 122 converted by the refractive index of the silicon oxide layer 122 by the value obtained by multiplying the refractive index of the silicon oxide layer 122 and the wavelength of the laser beam. The optical thickness is a sum of a value obtained by multiplying the thickness of the silicon nitride layer 121 and the refractive index of the silicon nitride layer 121 and a value obtained by multiplying the thickness of the silicon oxide layer 122 and the refractive index of the silicon oxide layer 122. For reference, the upper horizontal axis represents the thickness of the non-crystalline silicon layer 130 when the wavelength of the laser beam is 532 nm without standardization using the laser beam, and the vertical axis on the right represents the thickness of the gate insulating layer 120 (the thickness which is the capacitance of the single-layer silicon oxide layer 122 having the thickness of 120 nm). The vertical axis on the right represents the ratio of the thickness of the silicon oxide layer 122 and the thickness of the silicon nitride layer 121 as "thickness of silicon oxide layer 122/thickness of silicon nitride layer 121".

In the calculation illustrated in FIG. 13A, a model in which the gate electrode 110 is made of MoW and the thickness of the channel protective layer 140 is 0 nm.

By using the refractive indices of the silicon oxide layer 122 and the silicon nitride layer 121 when the wavelength is 532 nm, it is possible to calculate the thickness of the silicon oxide layer 122 and the silicon nitride layer 121 composing the gate insulating layer 120 from the value in the vertical axis of FIG. 13A. FIG. 13B to FIG. 13D illustrate examples in which the values in the vertical axis in FIG. 13A is converted into the thicknesses of the silicon oxide layer 122 and the silicon nitride layer 121 composing the gate insulating layer 120. FIG. 13B indicates thicknesses of the silicon oxide layer 122 and the silicon nitride layer 121 calculated when the wavelength is 532 nm. FIG. 13C and FIG. 13D show thicknesses of the silicon oxide layer 122 and the silicon nitride layer 121 calculated when the wavelength is 561 nm and the wavelength is 473 nm, respectively. Here, relative permittivity of the silicon oxide layer 122 and the silicon nitride layer 121 used for the calculation are determined as 4.1 and 7.9, respectively. Note that, C in the graphs represent the thickness of the thickness of the single-layer silicon oxide layer corresponding to the total capacitance of the stacked film composed of the silicon oxide layer and the silicon nitride layer. It is shown that the total capacitance of the stacked film is fixed to the capacitance value when the gate insulating layer 120 is made of the single-layer silicon oxide layer having the thickness C. For example, when C=140 nm, the value of the total capacitance of the gate insulating layer 120 is the capacitance value of the single-layer silicon oxide layer having the thickness of 140 nm. Similarly, when C=120 nm or 100 nm, the value of the total capacitance of the gate insulating layer 120 is the capacitance value of the single-layer silicon oxide layer having the thickness of 120 nm or 100 nm, respectively.

In addition, as shown in FIG. 12 to FIG. 13D, in the process illustrated in (f) in FIG. 2, regardless of the material for the gate electrode 110 and the thickness of the channel protective layer 140, the absorptance of the non-crystalline silicon layer 130 in the projecting part and the part under the projecting part for the laser beam can be set to be at least 50% including the maximum absorptance if the following conditions are satisfied: X and Y satisfy the following (Expression 4), (Expression 5), (Expression 6), and (Expression 7); where n denotes integers starting from 0, X denotes a value obtained by dividing, by the wavelength of the laser beam, an optical thickness of the non-crystalline silicon layer 130 calculated by multiplying a thickness of the non-crystalline silicon layer 130 from a bottom surface to an upper surface in the projecting part and a refractive index of the non-crystalline silicon layer 130, and Y denotes a value obtained by dividing, by a value obtained by multiplying a refractive index of the silicon oxide layer 122 and the wavelength of the laser beam, an optical thickness of the gate insulating layer including the silicon nitride layer 121 and the silicon oxide layer 122 obtained by a conversion using a refractive index of the silicon oxide layer 122. Note that, A in FIG. 13A represents a range in which X and Y satisfy the following (Expression 4) and (Expression 5), and B in FIG. 13A represents a range in which X and Y satisfy the following (Expression 6) and (Expression 7).

$$0.226 \leq Y \leq 0.26 \quad \text{(Expression 4)}$$

$$-2.90(X-0.5n)+1.39 \leq Y \leq -2.90(X-0.5n)+1.97 \quad \text{(Expression 5)}$$

$$0.340 \leq Y \leq 0.543 \quad \text{(Expression 6)}$$

$$-2.90(X-0.5n)+1.70 \leq Y \leq -2.90(X-0.5n)+2.28 \quad \text{(Expression 7)}$$

As described above, the thin-film transistor according to the variation can balance the excellent on-characteristics and excellent off-characteristics for the same reasons as the embodiment 1. The electrical characteristics can be symmetric to the switching of the source electrode and the drain electrode as well.

According to the thin-film transistor according to the variation, the gate insulating layer 120 has the two-layer structure. Accordingly, the absorptance of the projecting part and the part underneath of the non-crystalline silicon layer 130 can be increased. Accordingly, it is possible to increase the average grain size of the crystals in the projecting part and the part underneath in the channel layer so as to increase the on-state current.

Comparative Example

Next, the comparative example of the thin-film transistors according to the embodiments 1 and 2 shall be described below.

Figure 14:
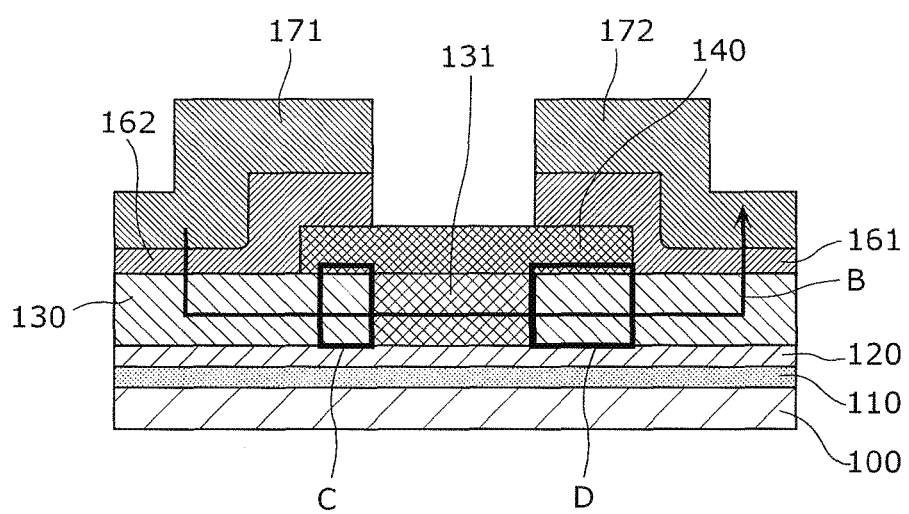
FIG. 14 is a cross-sectional view schematically illustrating the configuration of a thin-film transistor according to a comparative example of the embodiment 1 and the embodiment 2.

FIG. 14 is a cross-sectional view schematically illustrating the configuration of the thin-film transistor according to the comparative example.

The thin-film transistor is different from the embodiments 1 and 2 in that the crystalline silicon layer 131 is formed by irradiating the non-crystalline silicon layer 131 with the laser beam using the source electrode 171 and the drain electrode 172 as masks.

The thin-film transistor includes the substrate 100, the gate electrode 110, the gate insulating layer 120, the crystalline silicon layer 131, the non-crystalline silicon layer 130, the channel protective layer 140, the source electrode 171, the drain electrode 172, and the contact layers 162 and 161.

The crystalline silicon layer 131 is not formed on the entire region under the channel protective layer 140, and is formed in a part of the region. Accordingly, a part of the channel length defined by the width of the channel protective layer is the non-crystalline silicon layer 130 having high resistance (C and D in FIG. 14), and the resistance component of the channel layer in the horizontal direction increases, compared to the embodiments 1 and 2.

The source electrode 171 and the drain electrode 172 are provided uneven with respect to the channel protective layer 140 which is a lower layer. Accordingly, the distance from the crystalline silicon layer 131 to the source electrode 171 in the channel path (B in FIG. 14) and the distance from the crystalline silicon layer 131 to the drain electrode 172 in the channel path are not equal. Consequently, when operating the source electrode 171 and the drain electrode 171 after switching the source electrode 171 and the drain electrode 172, the electric characteristics become uneven relative to the switching of the source electrode 171 and the drain electrode 172.

As described above, the thin-film transistor according to the embodiments 1 and 2 can achieve excellent on-characteristics and off-characteristics compared to the thin-film transistor according to the comparative example, and the electric characteristics can be symmetric even when the source electrode and the drain electrode are switched.

Third Embodiment

Figure 15:
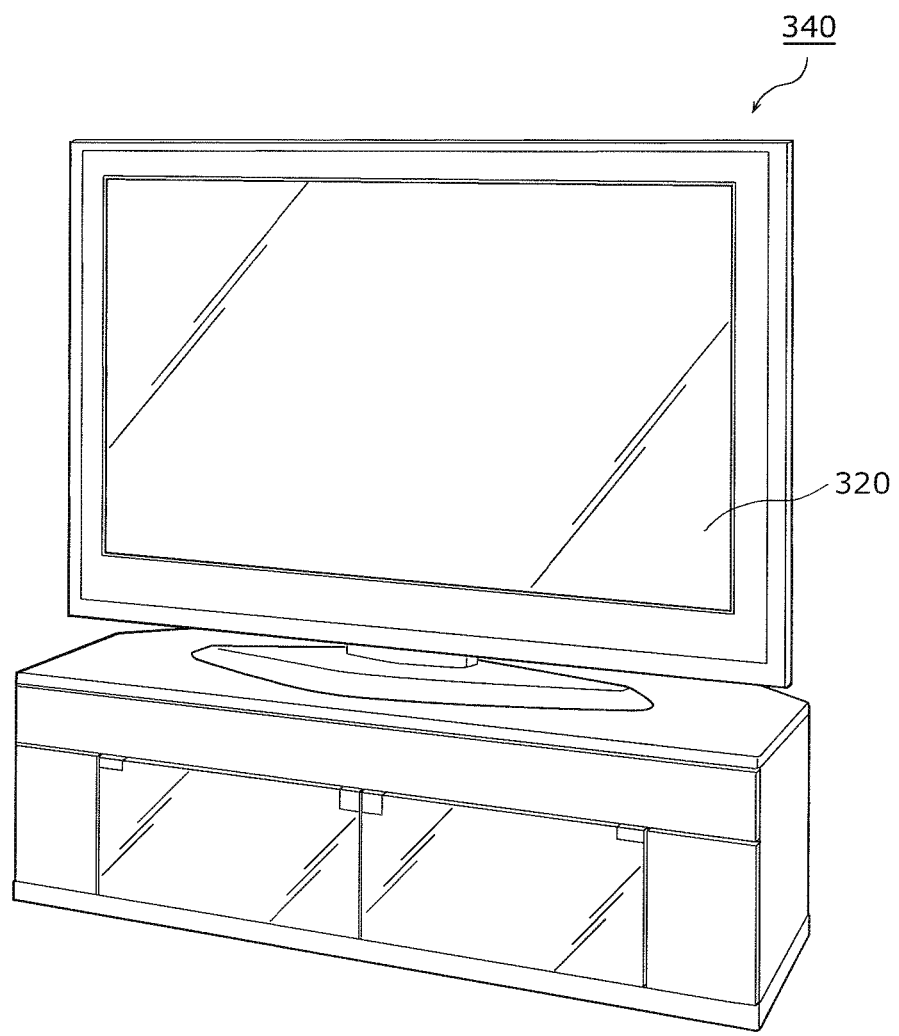
FIG. 15 is an external view of a display device according to the embodiment 3.
Figure 16:
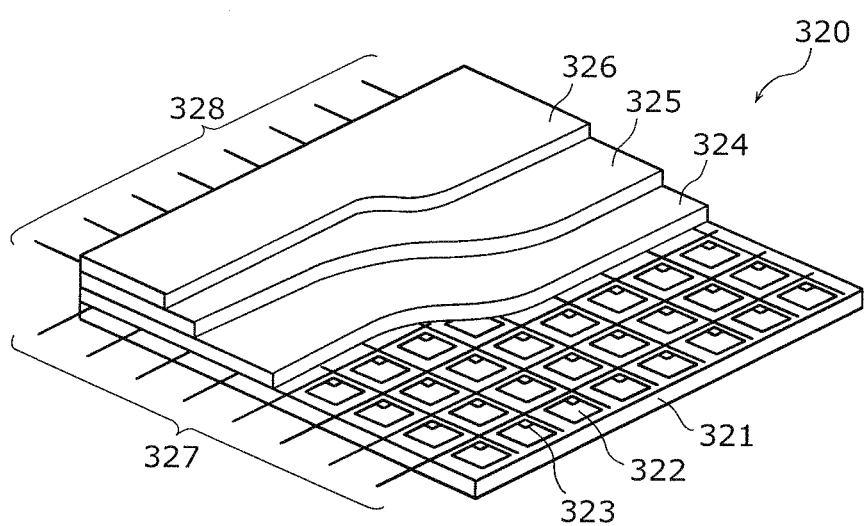
FIG. 16 is a partial cutout schematic view of an organic EL panel according to the embodiment 3.

FIG. 15 is an external view of a display apparatus according to the embodiment 3. FIG. 16 is a partial cutout perspective view of an organic EL display panel according to the embodiment 3.

A display apparatus 340 is a display apparatus including an organic EL panel having thin-film transistors according to the embodiment 1 or 2 for driving the organic EL panel. The display apparatus 340 includes an organic EL panel 320 using the thin-film transistors according to the embodiment 1 or 2 used for the switching transistors or the driving transistors in the active-matrix substrate.

The organic EL display panel 320 includes an active matrix substrate 321, pixels 322 arranged in a matrix on the active matrix substrate 321, pixel circuits 323 connected to the pixels 322 and arranged in an array on the active matrix substrate 321, an anode 324, an organic EL layer 325, and a cathode 326 (transparent electrode) sequentially stacked on the pixels 322 and the pixel circuits 323, and source lines 327 and gate lines 328 connecting the pixel circuits 323 and a control circuit (not illustrated). The organic EL layer 325 is formed by stacking layers such as an electron transport layer, a light-emitting layer, a hole transport layer, and others.

Figure 17:
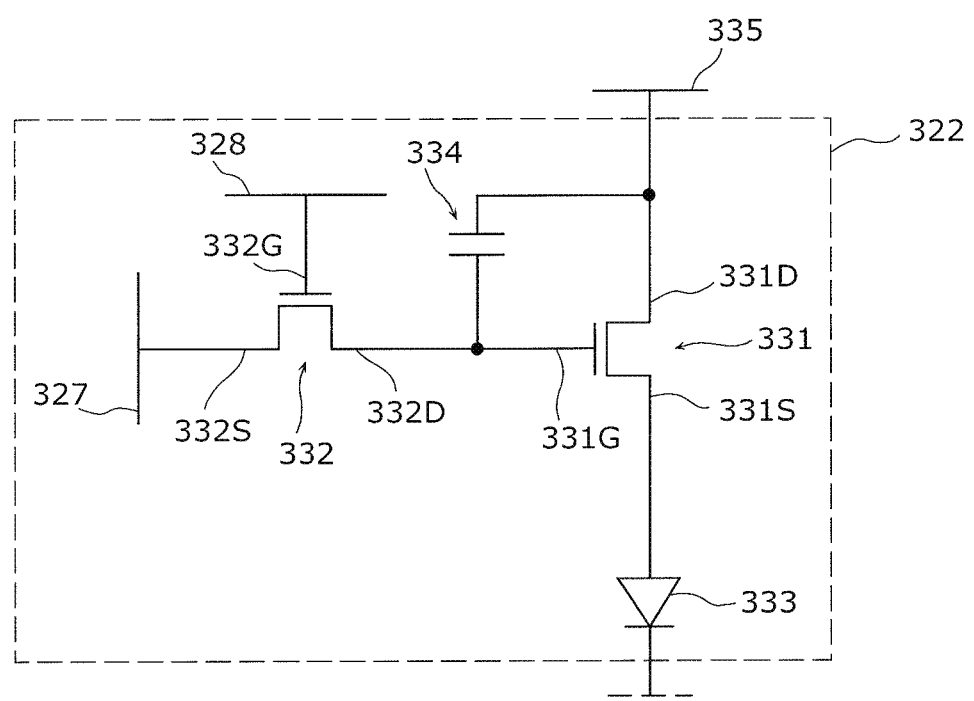
FIG. 17 illustrates circuit configuration of a pixel in an organic EL panel according to the embodiment 3.

FIG. 17 is a circuit configuration diagram of the pixels 322 in the organic EL panel 320 in FIG. 16.

As illustrated in FIG. 17, the pixel 322 includes a driving transistor 331, a switching transistor 332, an organic EL device 333, and a capacitor 334. The driving transistor 331 is a driving transistor for driving the organic EL device 333, and the switching transistor 332 is a switching transistor for selecting a pixel 322.

In the switching transistor 332, the source electrode 332S is connected to the source line 327, the gate electrode 332G is connected to the gate line 328, and the drain electrode 332D is connected to the capacitor 334 and the gate electrode 331G of the driving transistor 331.

The drain electrode 331D of the driving transistor 331 is connected to the power supply line 335, and the source electrode 331S is connected to the anode of the organic EL device 333.

In this configuration, the gate signal provided to the gate line 328, turning on the switching transistor 332. In this state, the signal voltage supplied through the source line 327 is written on the capacitor 334. Subsequently, the holding voltage written on the capacitor 334 is held for one entire frame period. With the holding voltage, the conductance of the driving transistor 331 changes in the analog manner, and the driving current corresponding to the tone of emitted light flows from the anode to the cathode of the organic EL device 333. With this, the organic EL device 333 emits light, and an image is displayed.

Note that, although the organic EL display apparatus using an organic EL panel has been illustrated in the embodiment, the thin-film transistor according to the embodiment 1 or 2 is applicable to the transistor driving a liquid crystal panel in the liquid crystal display apparatus. In this case, the display apparatus is a display apparatus having a liquid crystal panel including the thin-film transistor according to the embodiment 1 or 2, and the thin-film transistor drives the liquid crystal panel.

Although only some exemplary embodiments of the thin-film transistor, the method for fabricating the thin-film transistor, and the display apparatus according to the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

For example, the display apparatus according to the embodiments may be used as a flat panel display, and is applicable to any electric appliance having a display unit such as a television set, personal computer, mobile phone, and others.

INDUSTRIAL APPLICABILITY

The present disclosure is applicable to a thin-film transistor, a method for fabricating the thin-film transistor, and a display apparatus. In particular, the present disclosure is applicable to display apparatuses such as television sets, personal computers, mobile phones, and others, and various electronic appliances having thin-film transistors.

What is claimed is:

1. A method for fabricating a thin-film transistor, the method comprising:
   preparing a substrate;
   forming a gate electrode above the substrate;
   forming a gate insulating layer above the gate electrode;
   forming a non-crystalline silicon layer above the gate insulating layer;
   forming a channel protective layer above the non-crystalline silicon layer;
   processing the non-crystalline silicon layer and the channel protective layer to form a projecting part, the projecting part having an upper layer composed of the channel protective layer and a lower layer composed of the non-crystalline silicon layer;
   irradiating, with a laser beam, the projecting part and portions of the non-crystalline silicon layer on sides of the projecting part to crystallize the non-crystalline silicon layer in the projecting part into a crystalline silicon layer, the portions of the non-crystalline silicon layer on the sides of the projecting part remaining the non-crystalline silicon layer;
   forming a contact layer along at least a side surface of the crystalline silicon layer and on an upper surface of each of the portions of the non-crystalline silicon layer on the sides of the projecting part, the contact layer comprising non-crystalline silicon doped with impurity or polysilicon doped with impurity; and
   forming source and drain electrodes on the contact layer with the contact layer being between the source and drain electrodes and the crystalline silicon layer and also between the source and drain electrodes and the portions of the non-crystalline silicon layer on the sides of the projecting part,
   wherein, in the irradiating, an absorptance of the non-crystalline silicon layer for the laser beam is greater in the projecting part than in the portions on the sides of the projecting part.

2. The method for fabricating the thin-film transistor according to claim 1,
   wherein a difference in the absorptance of the non-crystalline silicon layer in the projecting part and in the portions on the sides of the projecting part is at least 1%.

3. The method for fabricating the thin-film transistor according to claim 2,
   wherein the absorptance of the non-crystalline silicon layer in the projecting part is at least 30%, and
   the absorptance of the non-crystalline silicon layer in the portions on the sides of the projecting part is at most 20%.

4. The method for fabricating the thin-film transistor according to claim 2,
   wherein, in the irradiating, the crystalline silicon layer is formed by one laser scanning.

5. The method for fabricating the thin-film transistor according to claim 4,
   wherein, in the irradiating, a scanning speed of the laser beam is constant.

6. The method for fabricating the thin-film transistor according to claim 1,
   wherein the crystalline silicon layer formed by the irradiating includes crystals having an average grain size in a range from 10 nm to 1 µm.

7. The method for fabricating the thin-film transistor according to claim 1,
   wherein, in the irradiating, a portion of the non-crystalline silicon layer under the projecting part is crystallized into the crystalline silicon layer.

8. The method for fabricating the thin-film transistor according to claim 1,
   wherein the side surface of the crystalline silicon layer and a side surface of the channel protective layer are coplanar.

9. The method for fabricating the thin-film transistor according to claim 1,
   wherein the contact layer is on the side surface of the crystalline silicon layer, a side surface of the channel protective layer, the upper surface of each of the portions of the non-crystalline silicon layer on the sides of the projecting part, and an upper surface of the channel protective layer.

10. The method for fabricating the thin-film transistor according to claim 1, wherein the non-crystalline silicon layer is not on a side surface of the channel protective layer and not on an upper surface of the channel protective layer.

11. The method for fabricating the thin-film transistor according to claim 1,
wherein, in the irradiating, a wavelength of the laser beam is in a range from 473 nm to 561 nm.

12. The method for fabricating the thin-film transistor according to claim 1,
wherein, in the processing, the projecting part is formed such that thicknesses of the portions of the non-crystalline silicon layer on the sides of the projecting part are at least 4 nm less than a thickness of the non-crystalline silicon layer in the projecting part.

13. The method for fabricating the thin-film transistor according to claim 12,
wherein, in the irradiating, a wavelength of the laser beam is 473 nm.

14. The method for fabricating the thin-film transistor according to claim 1,
wherein, in the processing, the projecting part is formed such that thicknesses of the portions of the non-crystalline silicon layer on the sides of the projecting part are at least 5 nm less than a thickness of the non-crystalline silicon layer in the projecting part.

15. The method for fabricating the thin-film transistor according to claim 14,
wherein, in the irradiating, a wavelength of the laser beam is 532 nm.

16. The method for fabricating the thin-film transistor according to claim 14,
wherein, in the irradiating, a wavelength of the laser beam is 561 nm.

17. The method for fabricating the thin-film transistor according to claim 1,
wherein, in the irradiating, X and Y satisfy the following expressions:

$$0.50m \leq Y \leq 0.40 + 0.50m; \text{ and}$$

$$-4.00(X-0.5l)+1.92+0.50m \leq Y \leq -4.00(X-0.5l)+2.68+0.50m,$$

where l and m are integers starting from 0,
X is a value obtained by dividing, by a wavelength of the laser beam, an optical thickness of the non-crystalline silicon layer calculated by multiplying a thickness of the non-crystalline silicon layer in the projecting part and a refractive index of the non-crystalline silicon layer, and Y is a value obtained by dividing, by the wavelength of the laser beam, an optical thickness of the gate insulating layer obtained by multiplying a thickness of the gate insulating layer and a refractive index of the gate insulating layer.

18. The method for fabricating the thin-film transistor according to claim 1,
wherein, in the forming of the gate insulating layer, the gate insulating layer includes a silicon nitride layer and a silicon oxide layer on the silicon nitride layer,
in the irradiating, X and Y satisfy the following expressions:

$$0.226 \leq Y \leq 0.26;$$

$$-2.90(X-0.5n)+1.39 \leq Y \leq -2.90(X-0.5n)+1.97;$$

$$0.340 \leq Y \leq 0.543; \text{ and}$$

$$-2.90(X-0.5n)+1.70 \leq Y \leq -2.90(X-0.5n)+2.28,$$

where n is an integer starting from 0,
X is a value obtained by dividing, by a wavelength of the laser beam, an optical thickness of the non-crystalline silicon layer calculated by multiplying a thickness of the non-crystalline silicon layer in the projecting part and a refractive index of the non-crystalline silicon layer, and
Y is a value obtained by dividing, by a value obtained by multiplying a refractive index of the silicon oxide layer and the wavelength of the laser beam, an optical thickness of the gate insulating layer including the silicon nitride layer and the silicon oxide layer obtained by a conversion using a refractive index of the silicon oxide layer.

19. The method for fabricating the thin-film transistor according to claim 1,
wherein, in the processing to form the projecting part, Z satisfies the following expression:

$$0.5 \times (k+0.3) \leq Z \leq 0.5 \times (k+0.7)$$

where k is an integer starting from 0, and
Z is a value obtained by dividing, by a wavelength of the laser beam, an optical thickness of the channel protective layer obtained by multiplying a thickness of the channel protective layer and a refractive index of the channel protective layer.

* * * * *